United States Patent
Toyoshima et al.

(10) Patent No.: US 11,495,550 B2
(45) Date of Patent: Nov. 8, 2022

(54) SOLID-STATE IMAGE SENSOR INCLUDING FIRST AND SECOND UNIT PIXEL GROUPS WITH DIFFERENT STRUCTURES

(71) Applicant: Sony Semiconductor Solutions Corporation, Kanagawa (JP)

(72) Inventors: Marie Toyoshima, Kanagawa (JP); Taishin Yoshida, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 190 days.

(21) Appl. No.: 16/961,859

(22) PCT Filed: Nov. 15, 2018

(86) PCT No.: PCT/JP2018/042208
§ 371 (c)(1),
(2) Date: Jul. 13, 2020

(87) PCT Pub. No.: WO2019/142473
PCT Pub. Date: Jul. 25, 2019

(65) Prior Publication Data
US 2020/0357754 A1     Nov. 12, 2020

(30) Foreign Application Priority Data
Jan. 19, 2018  (JP) .............................. JP2018-007439

(51) Int. Cl.
*H01L 23/00* (2006.01)
*G01J 1/42* (2006.01)
(Continued)

(52) U.S. Cl.
CPC .............. *H01L 23/573* (2013.01); *G01J 1/42* (2013.01); *H01L 27/1461* (2013.01);
(Continued)

(58) Field of Classification Search
CPC .............. H01L 23/573; H01L 27/1461; H01L 27/14614; H01L 27/14621;
(Continued)

(56) References Cited

U.S. PATENT DOCUMENTS 8,227,734 B2 * 7/2012 Kameda ............ H01L 27/14623
250/214 R
9,349,762 B2 * 5/2016 Cho .................... H04N 5/36963
(Continued)

FOREIGN PATENT DOCUMENTS

JP       2004-173154 A      6/2004
JP       2006147816    *   6/2006
(Continued)

OTHER PUBLICATIONS

Extended European Search Report dated Apr. 30, 2021 for corresponding European Application No. 18900714.9.

*Primary Examiner* — Albert H Cutler
(74) *Attorney, Agent, or Firm* — Michael Best & Friedrich LLP

(57) ABSTRACT

To generate a value unique to a device in a more preferable mode.
A solid-state image sensor includes a plurality of unit pixels disposed in a two-dimensional array, and a drive control unit that controls a first drive to output signals from the unit pixels included in a first unit pixel group of the plurality of unit pixels as an image signal, and a second drive to detect variations in respective signals from two or more of the unit pixels included in a second unit pixel group of the plurality of unit pixels, in which the first unit pixel group and the second unit pixel group have different structures from each other.

30 Claims, 57 Drawing Sheets

(51) Int. Cl.
*H01L 27/146* (2006.01)
*H04N 5/372* (2011.01)
*H04N 5/378* (2011.01)
*H04N 5/369* (2011.01)
*H04N 5/361* (2011.01)
*H04N 5/374* (2011.01)
*H04N 5/3745* (2011.01)

(52) U.S. Cl.
CPC .. *H01L 27/14614* (2013.01); *H01L 27/14621* (2013.01); *H01L 27/14623* (2013.01); *H01L 27/14627* (2013.01); *H01L 27/14634* (2013.01); *H01L 27/14636* (2013.01); *H01L 27/14645* (2013.01); *H04N 5/372* (2013.01); *H04N 5/378* (2013.01); *H04N 5/379* (2018.08)

(58) Field of Classification Search
CPC ......... H01L 27/14623; H01L 27/14627; H01L 27/14634; H01L 27/14636; H01L 27/14645; H01L 27/14603; H01L 27/14616; H01L 27/14641; H01L 27/146; G01J 1/42; H04N 5/372; H04N 5/378; H04N 5/379; H04N 5/361; H04N 5/374; H04N 5/3745
See application file for complete search history.

(56) References Cited

U.S. PATENT DOCUMENTS

| 10,652,033 | B2* | 5/2020 | Facon | H04L 9/0866 |
| 2013/0015328 | A1 | 1/2013 | Goto | |
| 2014/0291796 | A1 | 10/2014 | Ishii et al. | |
| 2018/0115723 | A1* | 4/2018 | Takayanagi | H01L 27/14609 |

FOREIGN PATENT DOCUMENTS

| WO | 2016167076 A1 | 10/2016 |
| WO | WO2016167076 | * 10/2016 |

* cited by examiner

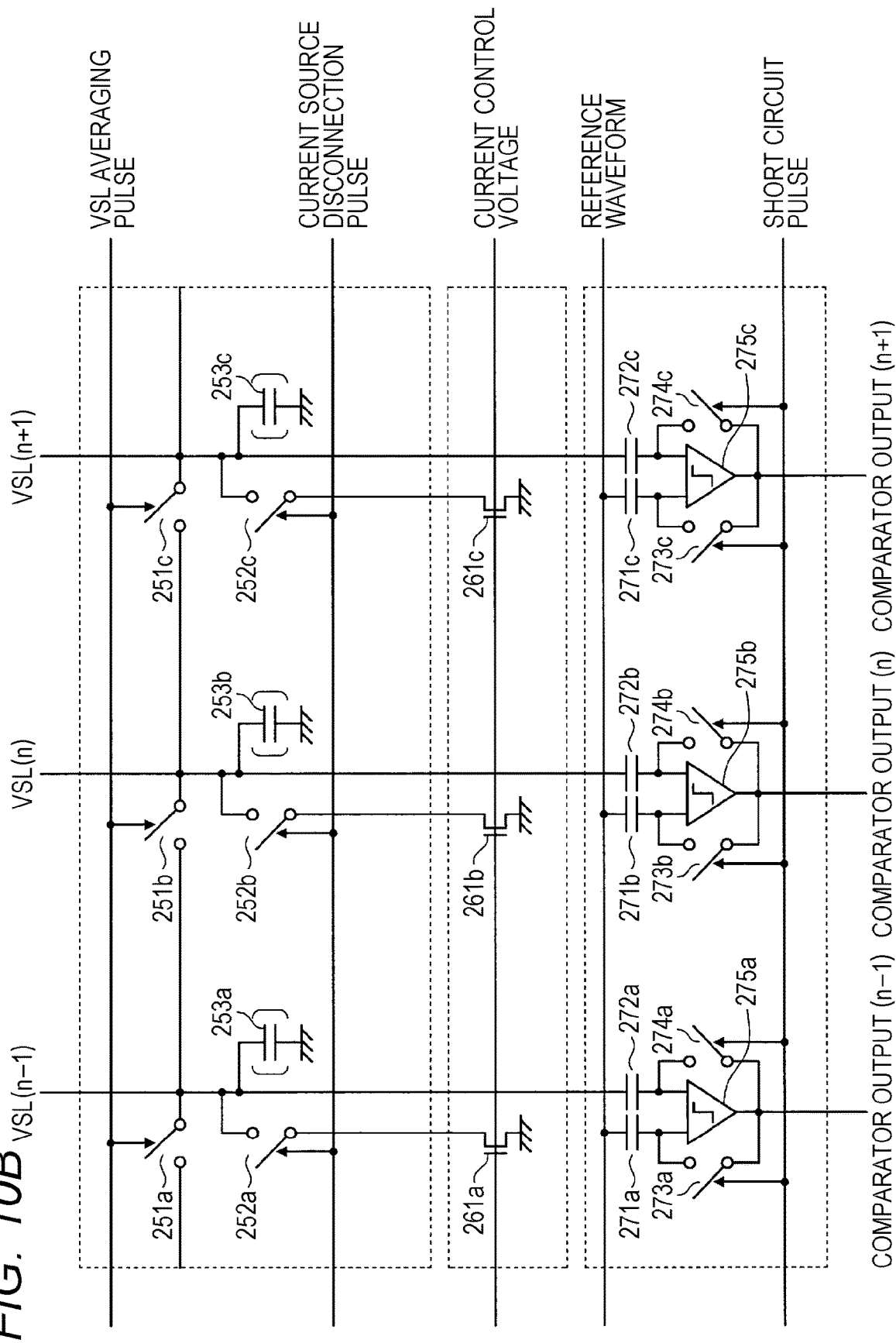

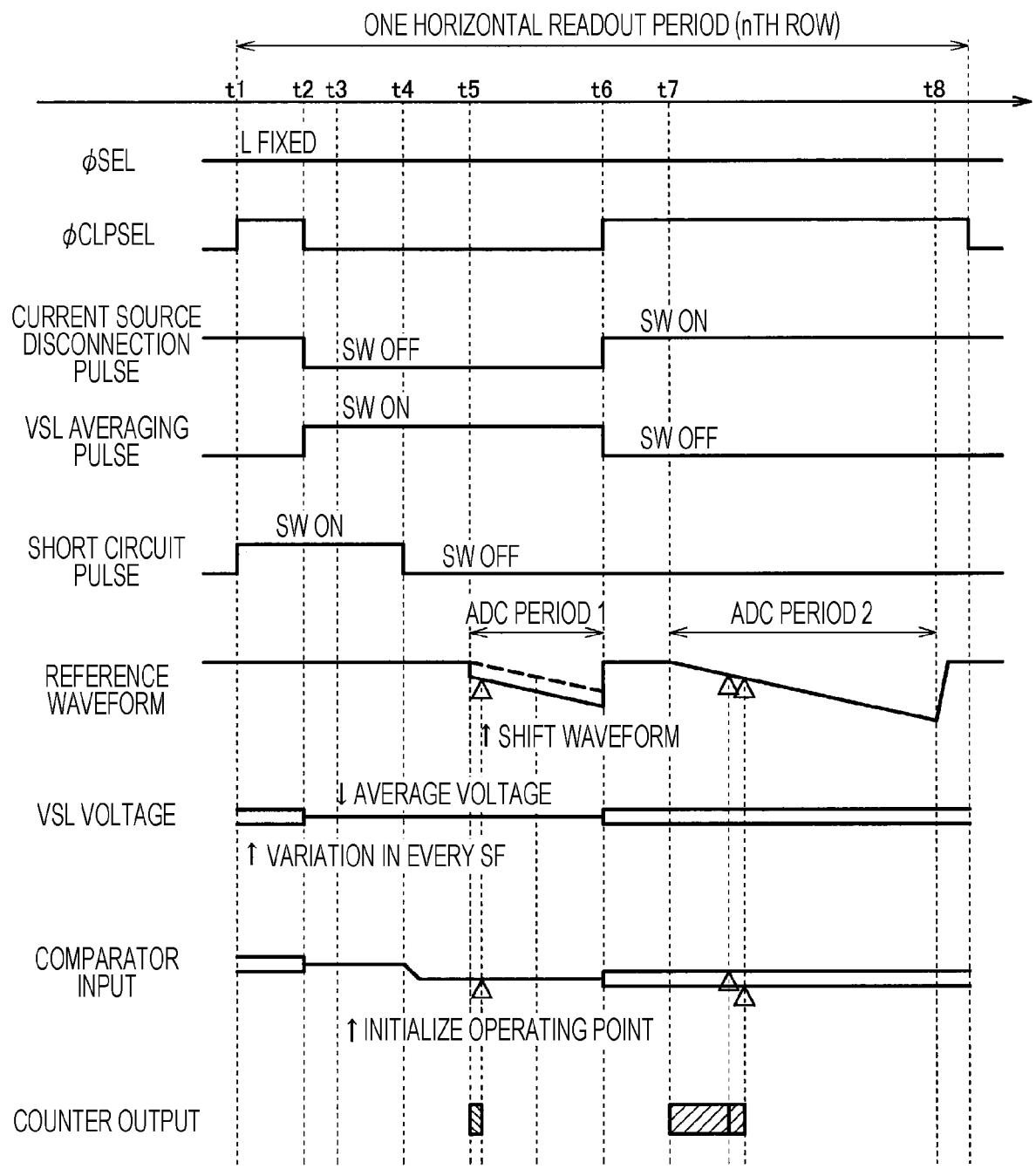

FIG. 16
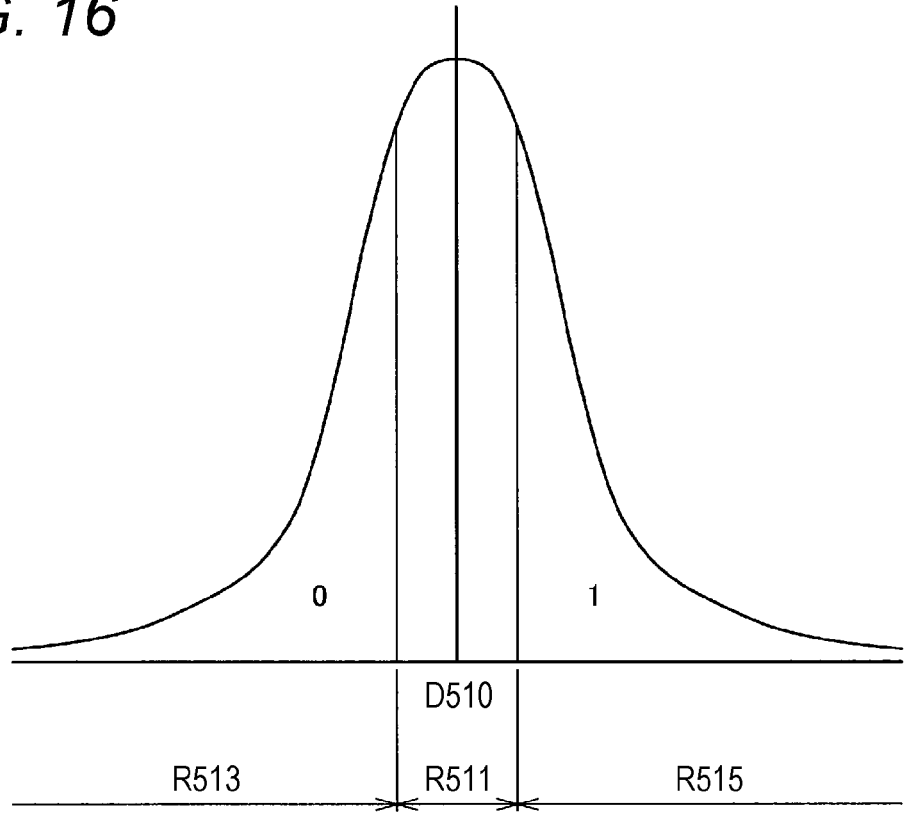
FIG. 17
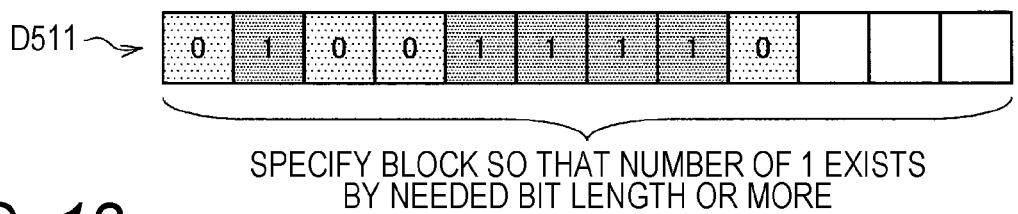
SPECIFY BLOCK SO THAT NUMBER OF 1 EXISTS BY NEEDED BIT LENGTH OR MORE
FIG. 18
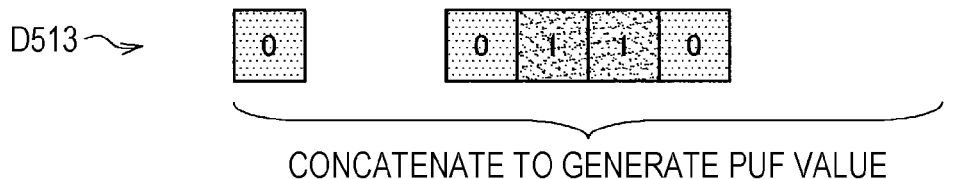
CONCATENATE TO GENERATE PUF VALUE

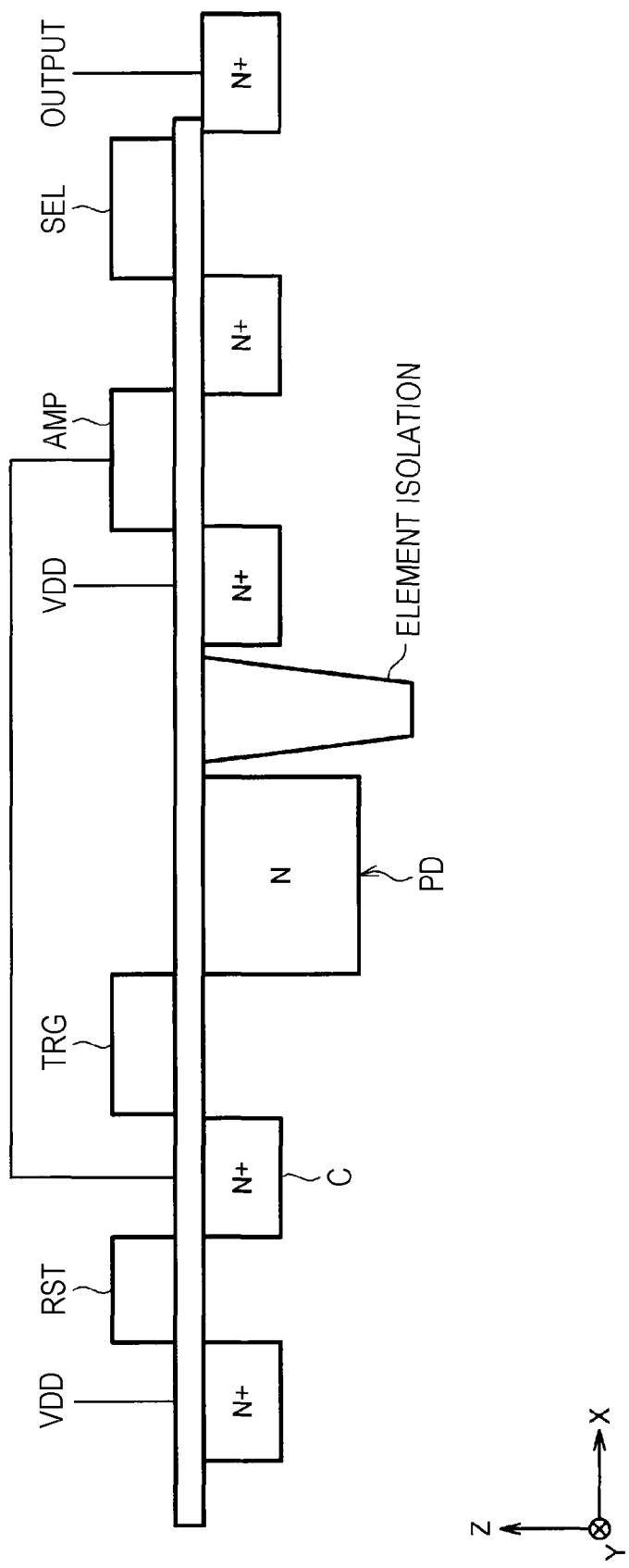

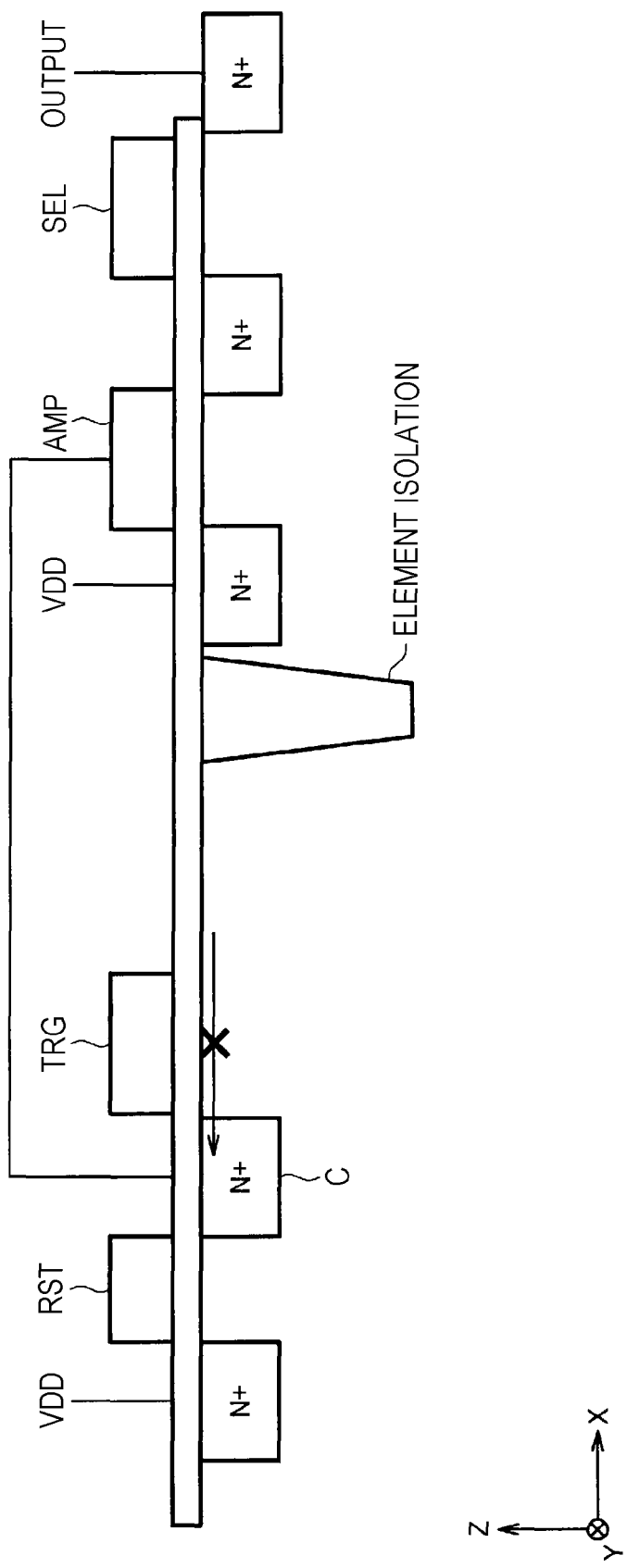

FIG. 27A
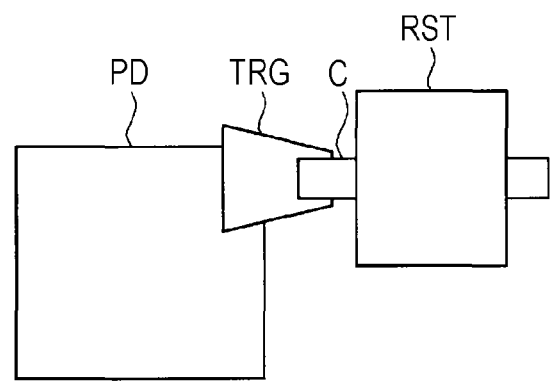
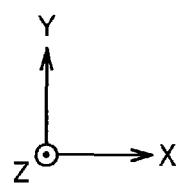
FIG. 27B
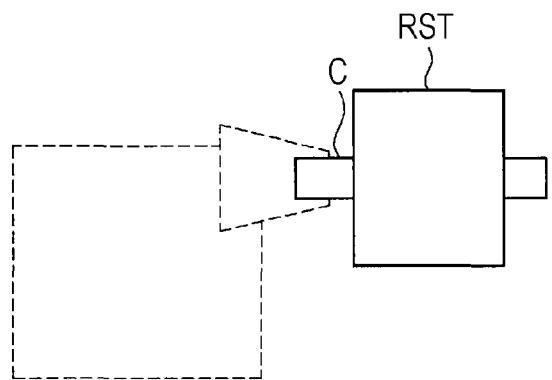
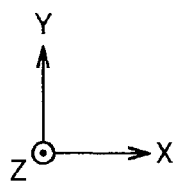

FIG. 27C
NORMAL
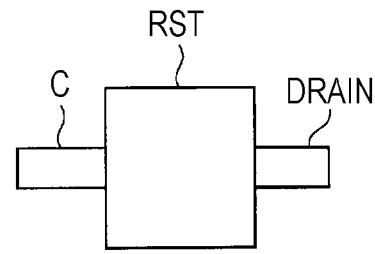
FORM GATE SMALLER
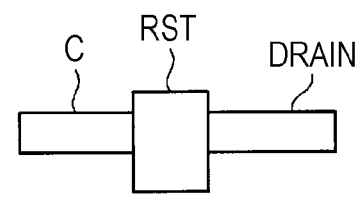
FORM GATE SMALLER
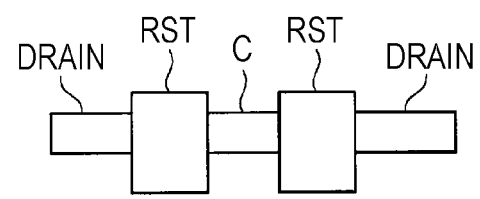
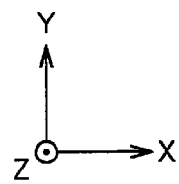

FIG. 27D
NORMAL
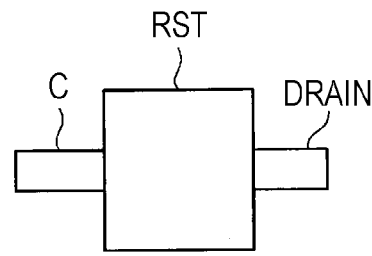
MAKE W/L RATIO SMALLER
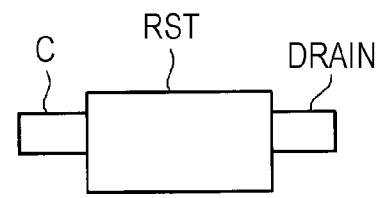
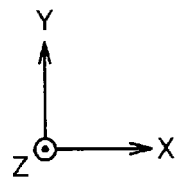
FIG. 27E
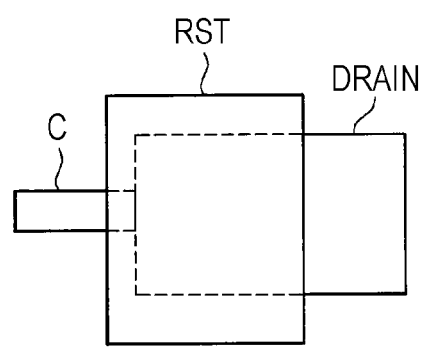
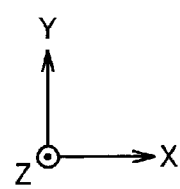

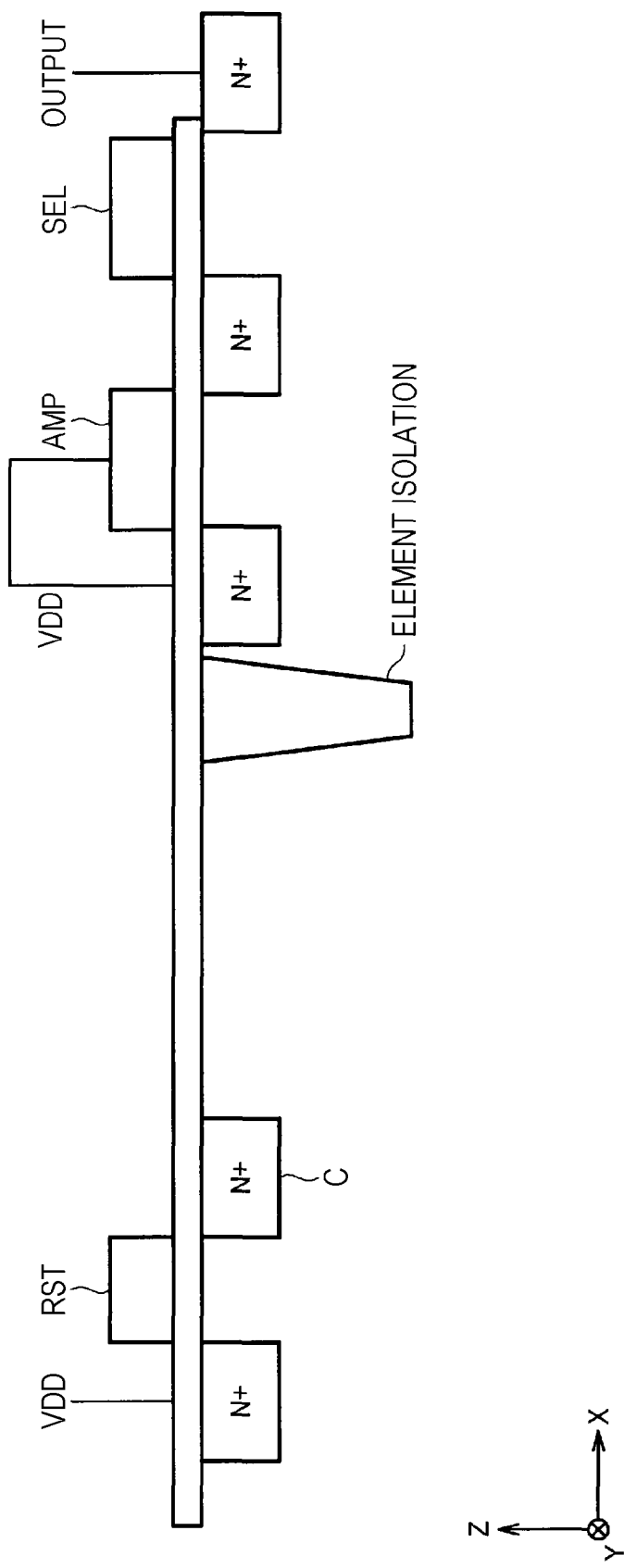

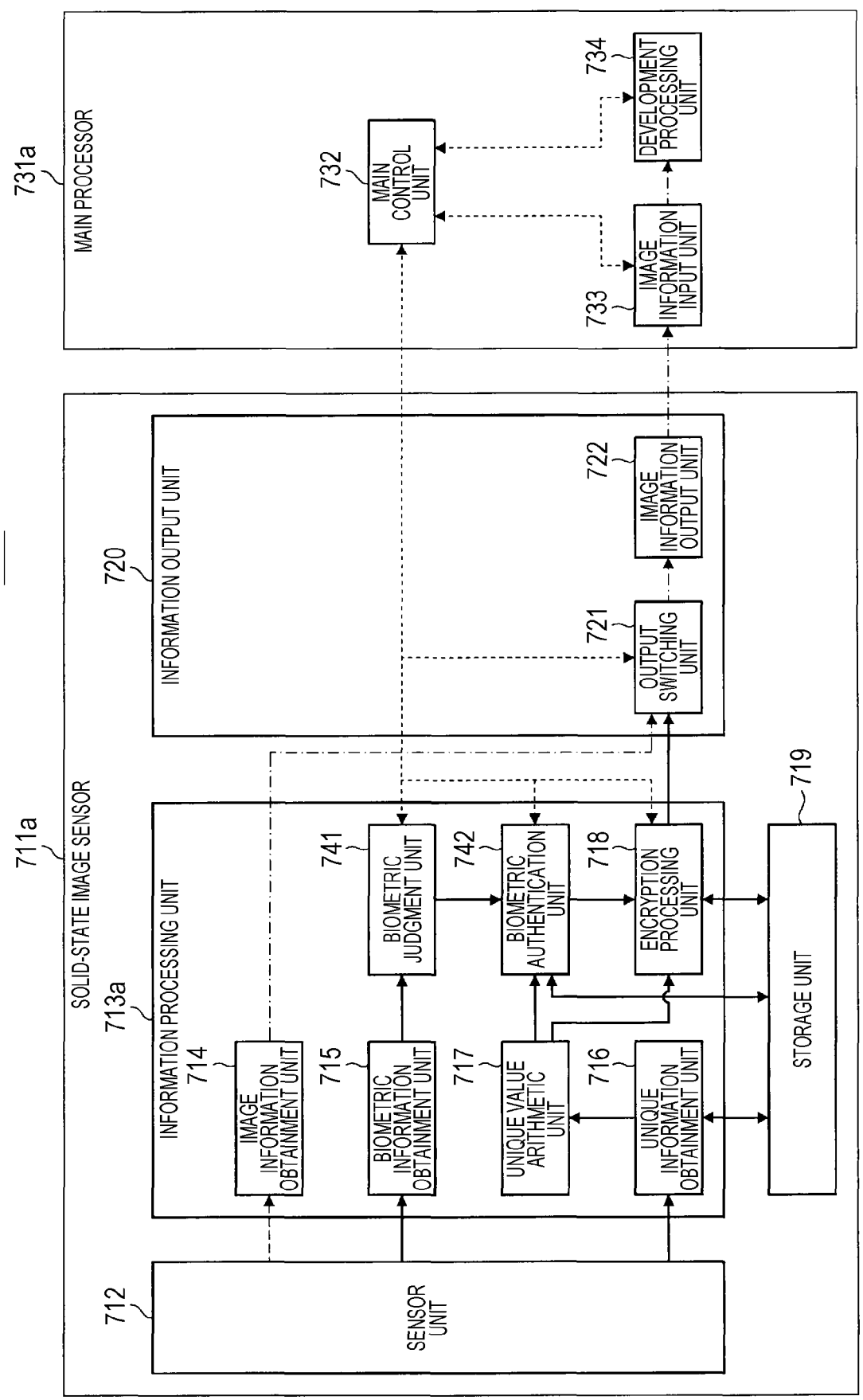

SOLID-STATE IMAGE SENSOR INCLUDING FIRST AND SECOND UNIT PIXEL GROUPS WITH DIFFERENT STRUCTURES

TECHNICAL FIELD

The present disclosure relates to a solid-state image sensor.

BACKGROUND ART

As a solid-state imaging device, an amplification type solid-state imaging device represented by a MOS image sensor such as a complementary metal oxide semiconductor (CMOS) is known. Furthermore, a charge transfer type solid-state imaging device represented by a charge coupled device (CCD) image sensor is known. These solid-state imaging devices are widely used in digital still cameras, digital video cameras, and the like. In recent years, as the solid-state imaging devices mounted in mobile devices such as camera-equipped mobile phones and personal digital assistants (PDAs), MOS image sensors are often used in view of power consumption and the like because of their low power supply voltage. For example, Patent Document 1 discloses an example of a digital camera to which such a solid-state imaging device is applied.

A MOS solid-state imaging device has a pixel array (pixel region) and a peripheral circuit region, the pixel array including unit pixels each formed including a photodiode to be a photoelectric conversion unit and a plurality of pixel transistors, the plurality of unit pixels being arranged in a two-dimensional array. The plurality of pixel transistors is formed using MOS transistors, and includes three transistors of a transfer transistor, a reset transistor, and an amplification transistor, or four transistors with a selection transistor being added.

CITATION LIST

Patent Document

Patent Document 1: Japanese Patent Application Laid-Open No. 2004-173154

SUMMARY OF THE INVENTION

Problems to be Solved by the Invention

Incidentally, in recent years, a technique called a physically unclonable function (PUF) which outputs a value unique to a device by using physical characteristics that are difficult to copy, has been attracting attention. Such a value unique to the device generated by using the PUF is, for example, expected to be used as an identifier (ID) for identifying an individual device or as what is called key information (for example, a key for encryption) because of a characteristic that it is difficult to be duplicated.

Accordingly, the present disclosure proposes a technique capable of generating a value unique to a device in a more preferable mode.

Solutions to Problems

According to the present disclosure, there is provided a solid-state image sensor including a plurality of unit pixels disposed in a two-dimensional array, and a drive control unit that controls a first drive to output signals from the unit pixels included in a first unit pixel group of the plurality of unit pixels as an image signal, and a second drive to detect variations in respective signals from two or more of the unit pixels included in a second unit pixel group of the plurality of unit pixels, in which the first unit pixel group and the second unit pixel group have different structures from each other.

Furthermore, according to the present disclosure, there is provided a solid-state image sensor including a plurality of unit pixels disposed in a two-dimensional array, and a drive control unit that controls a first drive to output signals from the unit pixels included in a first unit pixel group of the plurality of unit pixels as an image signal, and a second drive to detect variations in respective signals from two or more of the unit pixels included in a second unit pixel group of the plurality of unit pixels, in which in the first unit pixel group and the second unit pixel group, a structure of at least a part of components that the respective groups have in common or a structure of a component related in common to the respective groups is different.

Effects of the Invention

As described above, according to the present disclosure, there is provided technology capable of generating a value unique to a device in a more preferable mode.

Note that the above effect is not necessarily limited, and any of the effects illustrated in the present description or other effects that can be grasped from the present description may be exhibited together with or in place of the above effect.

BRIEF DESCRIPTION OF DRAWINGS

FIG. 10B is an explanatory diagram illustrating a circuit configuration example of a reference signal generation unit, a current source, and a comparator according to the same embodiment.

FIG. 11D is an explanatory diagram illustrating operations when generating unique information according to the same embodiment in a timing chart.

FIG. 16 is an explanatory diagram for describing an example of a technique related to generation of the PUF value according to the same embodiment.

FIG. 17 is an explanatory diagram for describing an example of a method of generating the PUF value according to the same embodiment.

FIG. 18 is an explanatory diagram for describing an example of the method of generating the PUF value according to the same embodiment.

FIG. 23A is an explanatory diagram for describing an example of a structure of a unit pixel in the solid-state imaging device according to the same embodiment.

FIG. 24B is an explanatory diagram for describing an example of a structure of a unit pixel in the solid-state imaging device according to the same embodiment.

FIG. 27A is an explanatory diagram for describing an example of a structure of a unit pixel in the solid-state imaging device according to the same embodiment.

FIG. 27B is an explanatory diagram for describing an example of a structure of a unit pixel in the solid-state imaging device according to the same embodiment.

FIG. 27C is an explanatory diagram for describing an example of a structure of a unit pixel in the solid-state imaging device according to the same embodiment.

FIG. 27D is an explanatory diagram for describing an example of a structure of a unit pixel in the solid-state imaging device according to the same embodiment.

FIG. 27E is an explanatory diagram for describing an example of a structure of a unit pixel in the solid-state imaging device according to the same embodiment.

FIG. 29B is an explanatory diagram for describing an example of a structure of a unit pixel in the solid-state imaging device according to the same embodiment.

FIG. 31 is a block diagram illustrating an example of a schematic functional configuration of an imaging device in a case of applying to biometric authentication.

MODE FOR CARRYING OUT THE INVENTION

Figure 1:
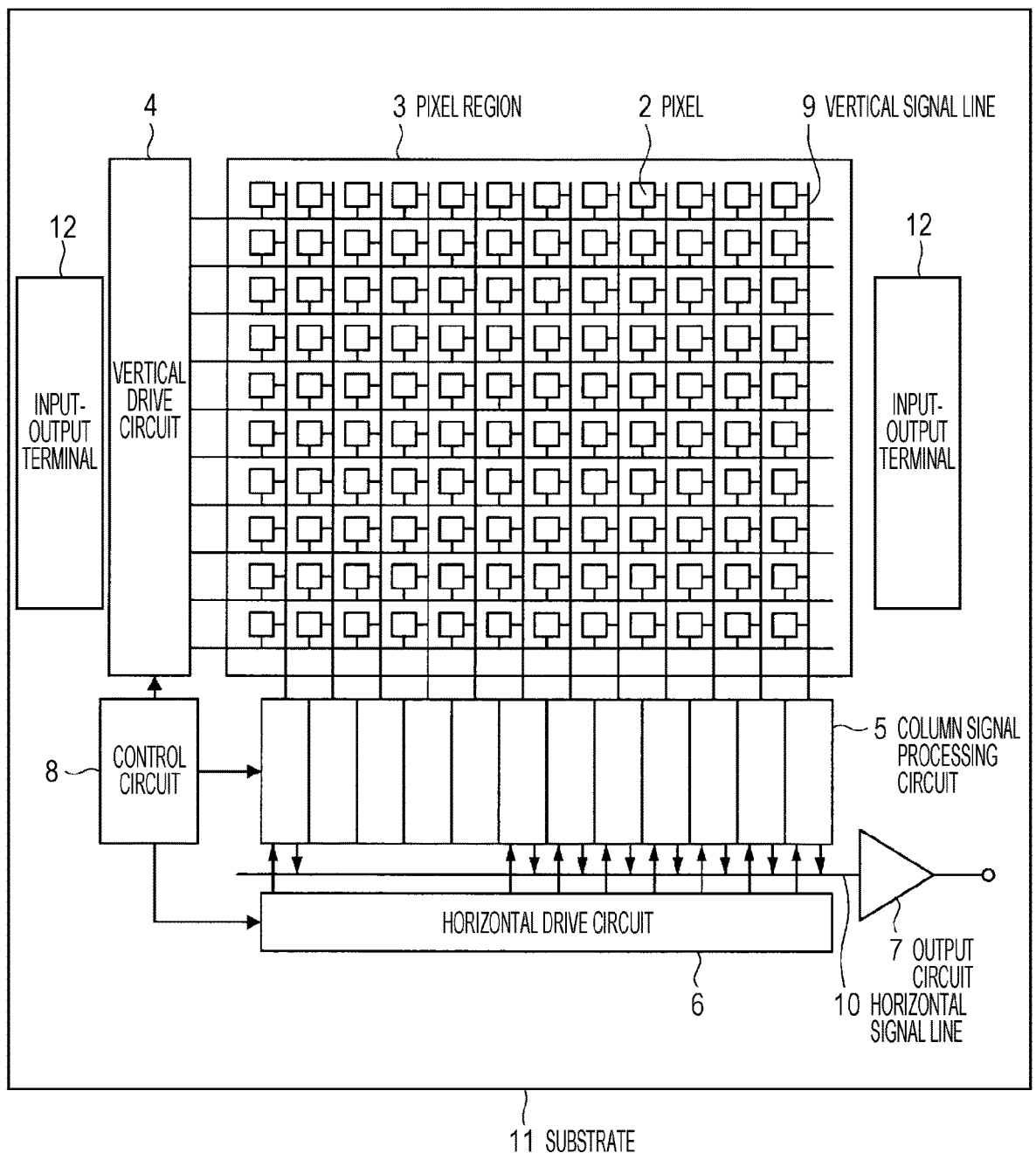
FIG. 1 is a schematic configuration diagram illustrating an example of a configuration of a solid-state imaging device according to one embodiment of the present disclosure.

Hereinafter, preferred embodiments of the present disclosure will be described in detail with reference to the accompanying drawings. Note that in the present description and drawings, components having substantially the same functional configurations are given the same reference signs, and duplicated descriptions are omitted.

Note that the description will be made in the following order.

1. Configuration example of solid-state imaging device
1.1. Schematic configuration
1.2. Functional configuration
1.3. Circuit configuration of unit pixel
2. Outline of PUF
3. First Embodiment
3.1. Configuration example
3.2. Operation example
4. Second Embodiment
4.1. Basic idea
4.2. Method of generating PUF value
4.3. Functional configuration
4.4. Processing
4.5. Evaluation
5. Third Embodiment
5.1. Basic idea
5.2. Configuration example
5.3. Evaluation
6. Application example
6.1. Application example to biometric authentication system
6.2. Application example to mobile object
6.3. Application example to mobile object
7. Conclusion

1. CONFIGURATION EXAMPLE OF SOLID-STATE IMAGING DEVICE

A configuration example of a solid-state imaging device according to the present embodiment will be described below.

1.1. Schematic Configuration

FIG. 1 illustrates a schematic configuration of a CMOS solid-state imaging device as an example of a configuration of a solid-state imaging device according to one embodiment of the present disclosure. This CMOS solid-state imaging device is applied to the solid-state imaging device of each embodiment. As illustrated in FIG. 1, the solid-state imaging device 1 of this example has a pixel array (what is called pixel region) 3 in which pixels 2 including a plurality of photoelectric conversion units are regularly arranged in a two-dimensional array on a semiconductor substrate 11, for example, a silicon substrate, and a peripheral circuit portion. A pixel 2 includes, for example, a photodiode to be a photoelectric conversion unit and a plurality of pixel transistors (what is called MOS transistors). The plurality of pixel transistors can include three transistors, for example, a transfer transistor, a reset transistor, and an amplification transistor. In addition, it can be configured by four transistors by adding a selection transistor. Note that an example of an equivalent circuit of a unit pixel will be described later separately. The pixel 2 can be configured as one unit pixel. Furthermore, the pixel 2 can have a shared pixel structure. The shared pixel structure includes a plurality of photodiodes, a plurality of transfer transistors, one shared floating diffusion, and one each of other shared pixel transistors. That is, in the shared pixels, the photodiodes and the transfer transistors that constitute a plurality of unit pixels share one each of the other pixel transistors.

The peripheral circuit portion includes a vertical drive circuit 4, a column signal processing circuit 5, a horizontal drive circuit 6, an output circuit 7, a control circuit 8, and the like.

The control circuit 8 receives an input clock and data giving an instruction on an operating mode and the like, and outputs data such as internal information of the solid-state imaging device. That is, the control circuit 8 generates a clock signal and a control signal, which are references for operations of the vertical drive circuit 4, the column signal processing circuit 5, the horizontal drive circuit 6, and the like on the basis of a vertical synchronization signal, a horizontal synchronization signal, and a master clock. Then, these signals are input to the vertical drive circuit 4, the column signal processing circuit 5, the horizontal drive circuit 6, and the like.

The vertical drive circuit 4 includes, for example, a shift register, selects a pixel drive wiring, and supplies pulses for driving pixels to a selected pixel drive wiring, so as to drive pixels in row units. That is, the vertical drive circuit 4 selectively scans each pixel 2 of the pixel array 3 in a vertical direction sequentially in row units, and supplies a pixel signal based on a signal charge generated according to an amount of light received in, for example, the photodiode to be the photoelectric conversion unit of each pixel 2 through a vertical signal line 9 to the column signal processing circuit 5.

The column signal processing circuit 5 is arranged, for example, on every column of the pixels 2 and performs signal processing, such as noise removal on signals output from the pixels 2 of one row, for every pixel column. That is, the column signal processing circuit 5 performs signal processing such as CDS for removing fixed pattern noise unique to a pixel 2, signal amplification, and AD conversion. A horizontal selection switch (not illustrated) is provided at an output stage of the column signal processing circuit 5 so as to be connected with a horizontal signal line 10.

The horizontal drive circuit 6 includes, for example, a shift register, sequentially selects the column signal processing circuits 5 by sequentially outputting horizontal scanning pulses, and outputs a pixel signal from each of the column signal processing circuits 5 to the horizontal signal line 10.

The output circuit 7 performs signal processing on signals sequentially supplied from each of the column signal processing circuits 5 through the horizontal signal line 10 and outputs processed signals. For example, only buffering may be performed, or black level adjustment, column variation correction, various digital signal processing, and the like may be performed. An input-output terminal 12 exchanges signals with the outside.

Figure 2:
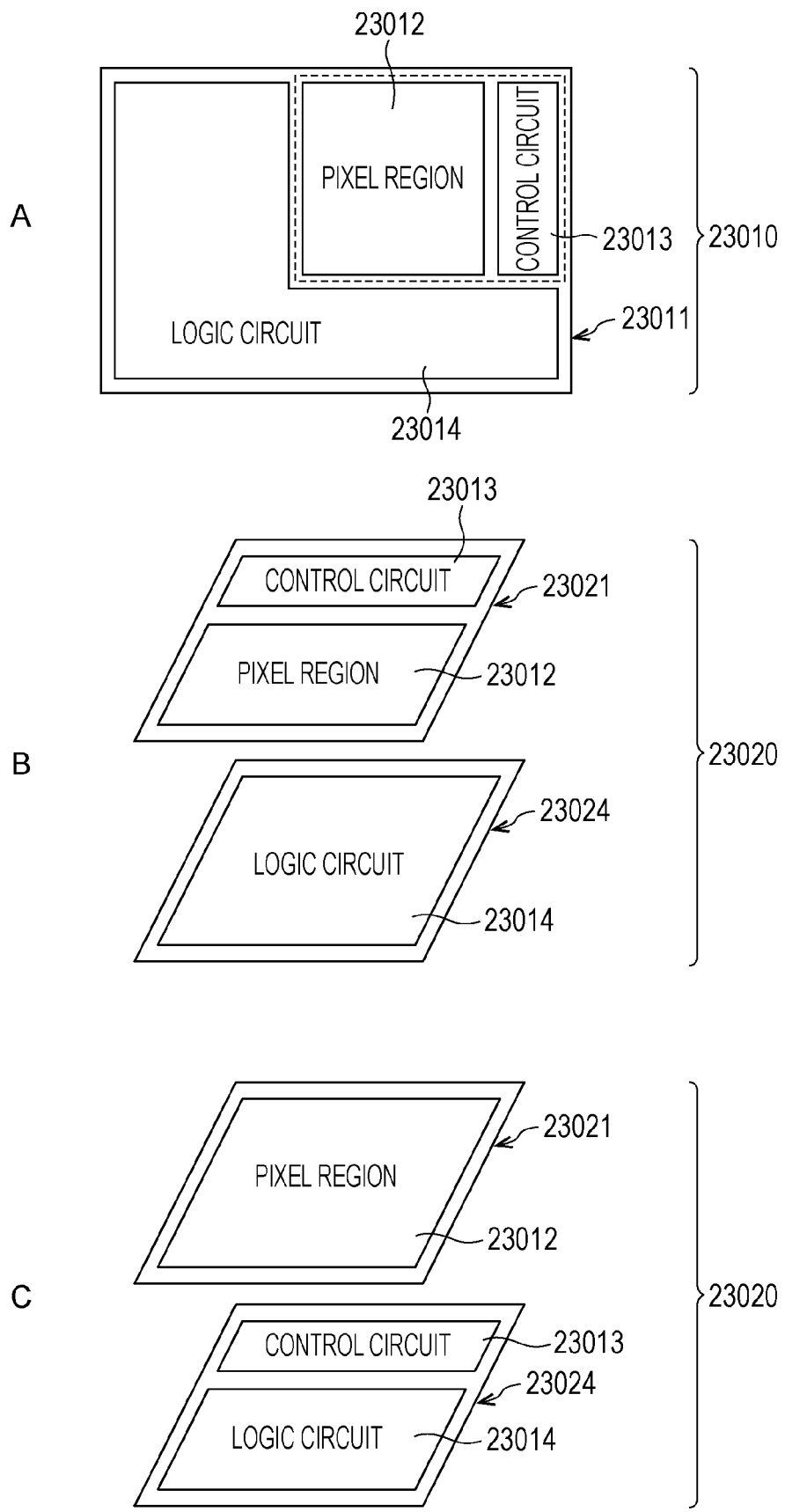
FIG. 2 is a diagram illustrating an outline of a configuration example of a solid-state imaging device of stacked type to which technology according to the present disclosure can be applied.

Furthermore, FIG. 2 is a diagram illustrating an outline of a configuration example of a solid-state imaging device of stacked type to which technology according to the present disclosure can be applied.

A in FIG. 2 illustrates a schematic configuration example of a solid-state imaging device of non-stacked type. A solid-state imaging device 23010 has one die (semiconductor substrate) 23011 as illustrated at A in FIG. 2. The die 23011 is provided with a pixel region 23012 in which pixels are arranged in an array, a control circuit 23013 that performs various controls of driving pixels and others, and a logic circuit 23014 for signal processing.

B and C in FIG. 2 illustrate schematic configuration examples of the solid-state imaging device of stacked type. As illustrated at B and C in FIG. 2, the solid-state imaging device 23020 includes two dies, a sensor die 23021 and a logic die 23024, which are stacked and electrically connected and are configured as one semiconductor chip.

At B in FIG. 2, a pixel region 23012 and a control circuit 23013 are mounted on the sensor die 23021, and a logic circuit 23014 including a signal processing circuit for performing signal processing is mounted on the logic die 23024.

At C in FIG. 2, a pixel region 23012 is mounted on the sensor die 23021, and a control circuit 23013 and a logic circuit 23014 are mounted on the logic die 23024.

Figure 3:
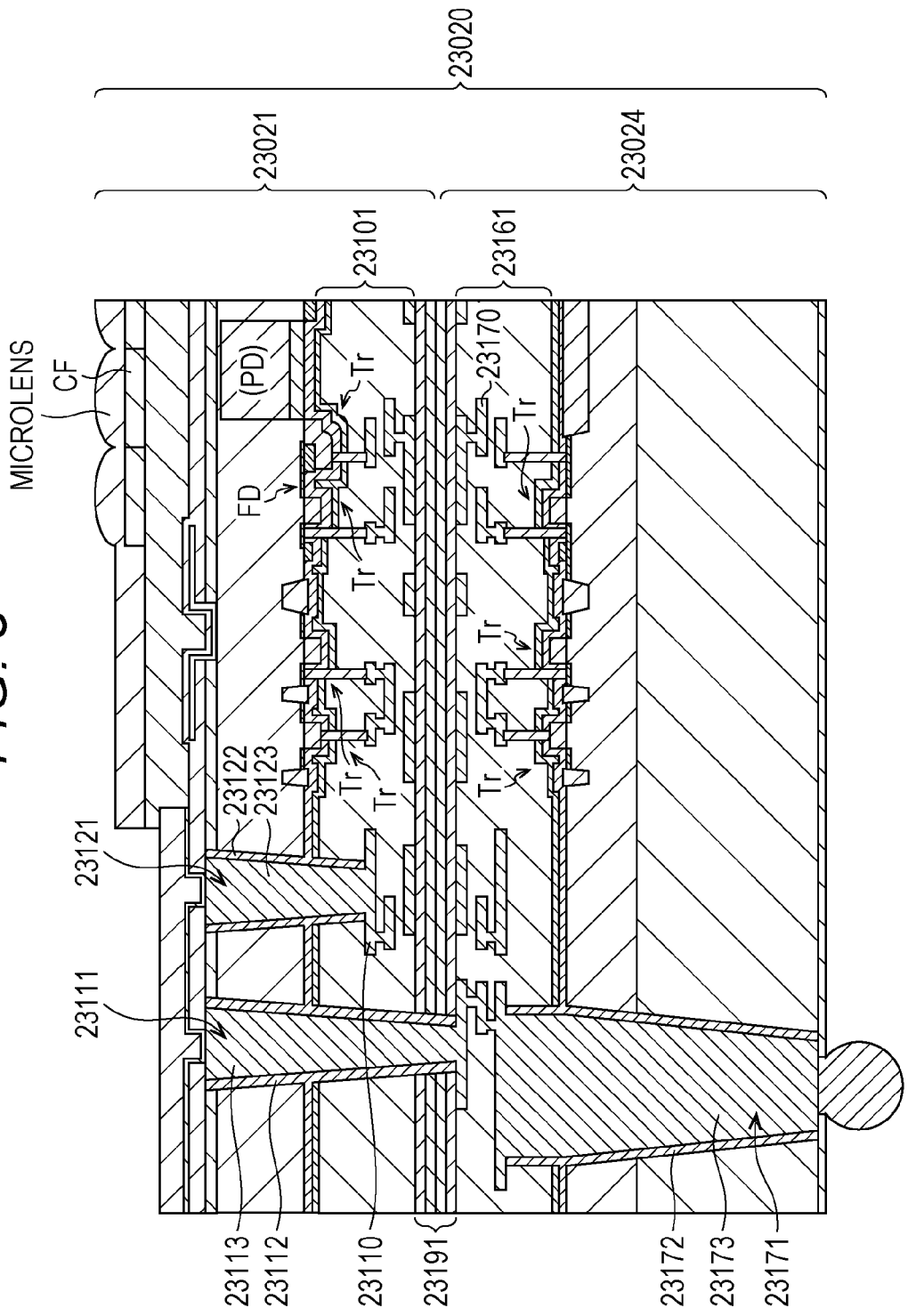
FIG. 3 is a cross-sectional view illustrating a first configuration example of a solid-state imaging device 23020 of stacked type.

FIG. 3 is a cross-sectional view illustrating a first configuration example of the solid-state imaging device 23020 of stacked type.

On the sensor die 23021, a photodiode (PD), a floating diffusion (FD), and a Tr (MOS FET) that constitute a pixel to be in a pixel region 23012, a Tr to be a control circuit 23013, and the like are formed. Moreover, a wiring layer 23101 having a plurality of layers, three layers in this example, of wiring 23110, is formed on the sensor die 23021. Note that (the Tr to be) the control circuit 23013 can be configured in the logic die 23024 instead of the sensor die 23021.

On the logic die 23024, the Tr constituting the logic circuit 23014 is formed. Moreover, a wiring layer 23161 having a plurality of layers, three layers in this example, of wiring 23170, is formed on the logic die 23024. Furthermore, in the logic die 23024, a connection hole 23171 having an insulating film 23172 formed on an inner wall surface is formed, and a connection conductor 23173 connected to the wiring 23170 and the like is embedded in a connection hole 23171.

The sensor die 23021 and the logic die 23024 are attached to each other so that the wiring layers 23101 and 23161 face each other, thereby forming a solid-state imaging device 23020 of stacked type in which the sensor die 23021 and the logic die 23024 are stacked. A film 23191 such as a protective film is formed on a surface where the sensor die 23021 and the logic die 23024 are attached to each other.

In the sensor die 23021, a connection hole 23111 is formed that penetrates the sensor die 23021 from a back surface side (the side where light enters the PD) (upper side) of the sensor die 23021 and reaches the uppermost layer of the wiring 23170 of the logic die 23024. Moreover, a connection hole 23121 is formed near the connection hole 23111 in the sensor die 23021 so as to reach the first layer of the wiring 23110 from the back surface side of the sensor die 23021. An insulating film 23112 is formed on an inner wall surface of the connection hole 23111, and an insulating film 23122 is formed on an inner wall surface of the connection hole 23121. Then, connection conductors 23113 and 23123 are embedded in the connection holes 23111 and 23121, respectively. The connection conductor 23113 and the connection conductor 23123 are electrically connected on the back surface side of the sensor die 23021, thereby electrically connecting the sensor die 23021 and the logic die 23024 via the wiring layer 23101, the connection hole 23121, the connection hole 23111, and the wiring layer 23161.

Figure 4:
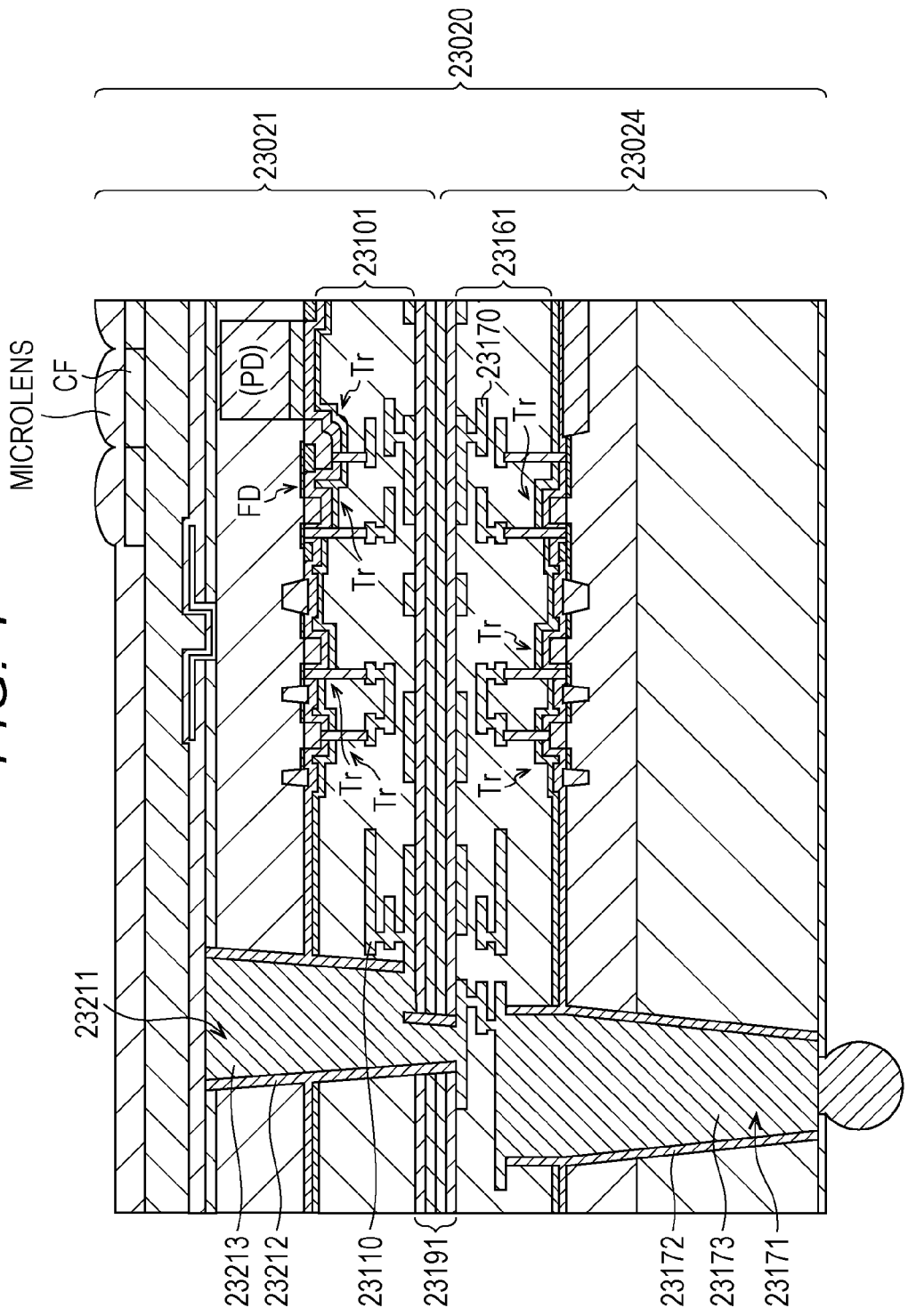
FIG. 4 is a cross-sectional view illustrating a second configuration example of the solid-state imaging device 23020 of stacked type.

FIG. 4 is a cross-sectional view illustrating a second configuration example of the solid-state imaging device 23020 of stacked type.

In the second configuration example of the solid-state imaging device 23020, the sensor die 23021 ((the wiring 23110 of) the wiring layer 23101 thereof) and the logic die 23024 ((the wiring 23170 of) the wiring layer 23161 thereof) are electrically connected by one connection hole 23211 formed in the sensor die 23021.

That is, in FIG. 4, the connection hole 23211 is formed so as to penetrate the sensor die 23021 from the back surface side of the sensor die 23021, reach the uppermost layer of the wiring 23170 of the logic die 23024, and reach the uppermost layer of the wiring 23110 of the sensor die 23021. An insulating film 23212 is formed on an inner wall surface of the connection hole 23211, and a connection conductor 23213 is embedded in the connection hole 23211. In FIG. 3 described above, the sensor die 23021 and the logic die 23024 are electrically connected by two connection holes 23111 and 23121, but in FIG. 4, the sensor die 23021 and the logic die 23024 are electrically connected by one connection hole 23211.

Figure 5:
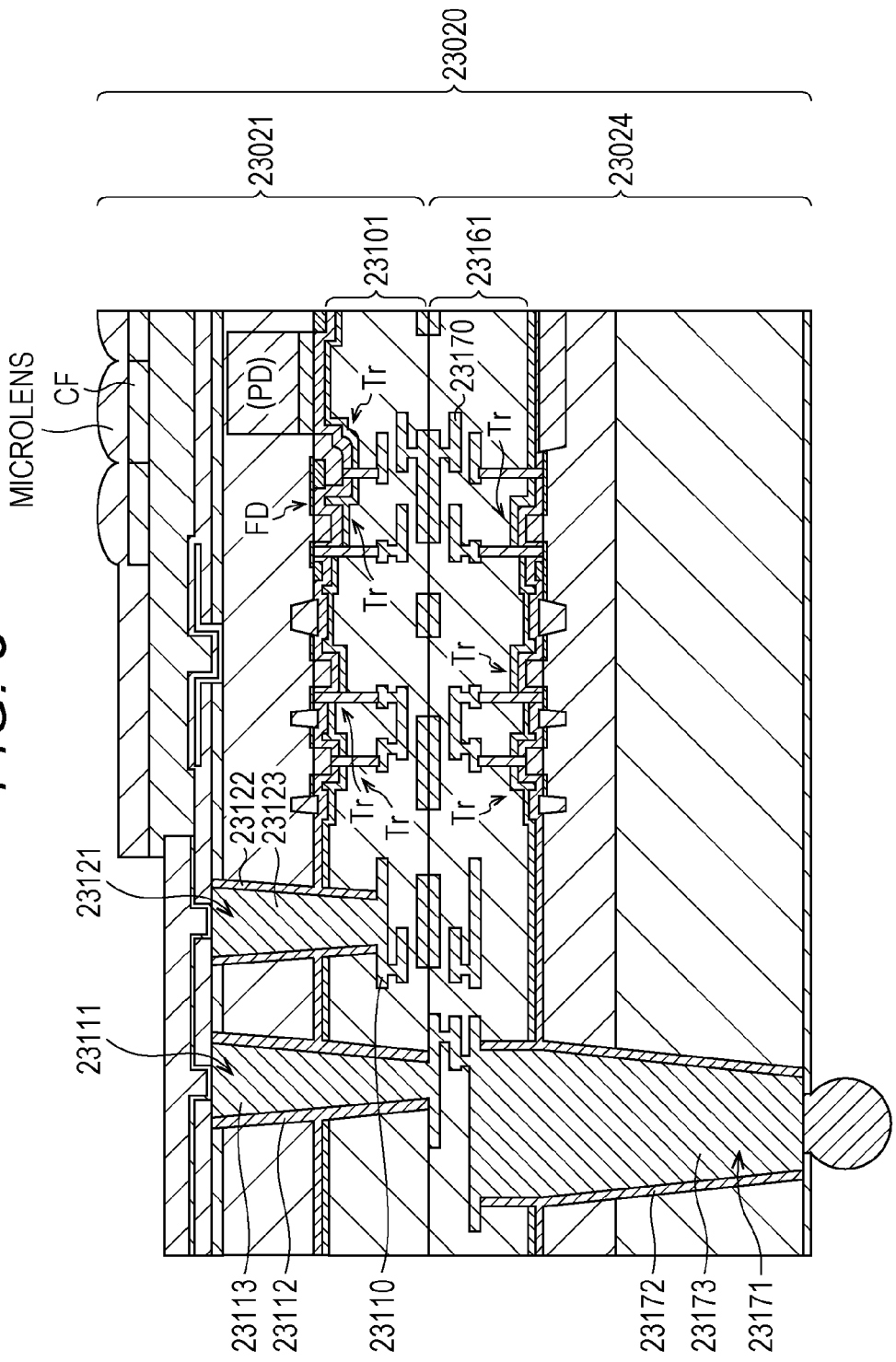
FIG. 5 is a cross-sectional view illustrating a third configuration example of the solid-state imaging device 23020 of stacked type.

FIG. 5 is a cross-sectional view illustrating a third configuration example of the solid-state imaging device 23020 of stacked type.

The solid-state imaging device 23020 in FIG. 5 is different from the case of FIG. 3, in which the film 23191 such as a protective film is formed on the surface where the sensor die 23021 and the logic die 23024 are attached to each other, in that the film 23191 such as a protective film is not formed on the surface where the sensor die 23021 and the logic die 23024 are attached to each other.

The solid-state imaging device 23020 of FIG. 5 is configured such that the sensor die 23021 and the logic die 23024 are stacked so that the wirings 23110 and 23170 are in direct contact, and heated while applying a required load, to thereby directly join the wirings 23110 and 23170.

Figure 6:
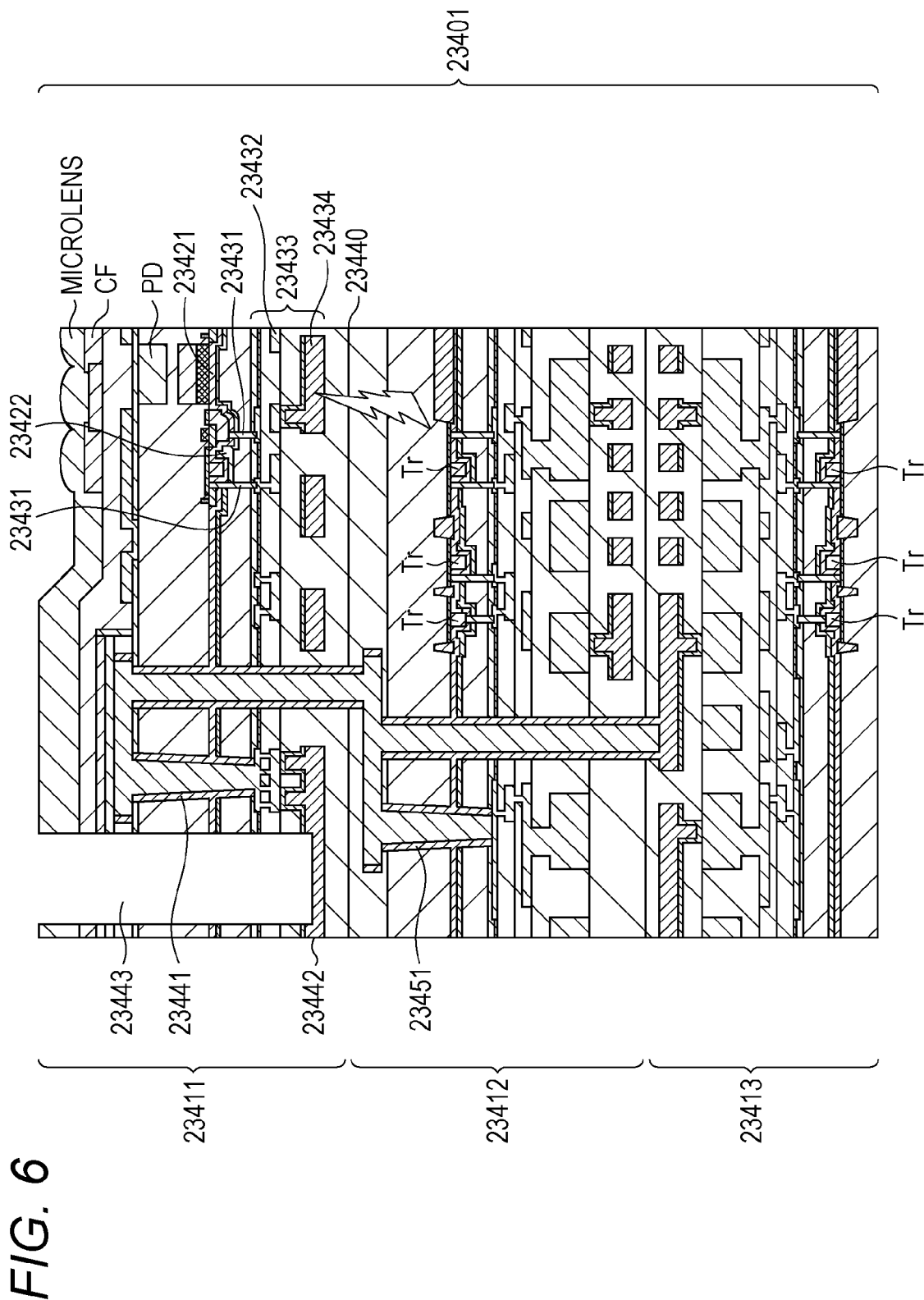
FIG. 6 is a view illustrating another configuration example of a solid-state imaging device of stacked type to which the technology according to the present disclosure can be applied.

FIG. 6 is a cross-sectional view illustrating another configuration example of a solid-state imaging device of stacked type to which the technology according to the present disclosure can be applied.

In FIG. 6, the solid-state imaging device 23401 has a three-layer stacked structure in which three dies, a sensor die 23411, a logic die 23412, and a memory die 23413 are stacked.

The memory die 23413 has, for example, a memory circuit that stores data temporarily needed in signal processing performed by the logic die 23412.

In FIG. 6, the logic die 23412 and the memory die 23413 are stacked in this order under the sensor die 23411, but the logic die 23412 and the memory die 23413 can be stacked in reverse order, that is, in order of the memory die 23413 and the logic die 23412 under the sensor die 23411.

Note that in FIG. 6, a PD to be a photoelectric conversion unit of the pixel and a source-drain region of a pixel Tr are formed in the sensor die 23411.

A gate electrode is formed around the PD with a gate insulating film interposed therebetween, and a pixel Tr 23421 and a pixel Tr 23422 are formed by the gate electrode and a pair of source-drain regions.

The pixel Tr 23421 adjacent to the PD is a transfer Tr, and one of the pair of source-drain regions constituting the pixel Tr 23421 is an FD.

Furthermore, an interlayer insulating film is formed in the sensor die 23411, and a connection hole is formed in the interlayer insulating film. In the connection hole, a connection conductor 23431 connected to the pixel Tr 23421 and the pixel Tr 23422 is formed.

Moreover, a wiring layer 23433 having a plurality of layers of wiring 23432 connected to each connection conductor 23431 is formed in the sensor die 23411.

Furthermore, an aluminum pad 23434 to be an electrode for external connection is formed on the lowermost layer of the wiring layer 23433 of the sensor die 23411. That is, in the sensor die 23411, the aluminum pad 23434 is formed at a position closer to a bonding surface 23440 with the logic die 23412 than the wiring 23432. The aluminum pad 23434 is used as one end of a wiring related to input and output of a signal from and to the outside.

Moreover, a contact 23441 used for electrical connection with the logic die 23412 is formed in the sensor die 23411. The contact 23441 is connected to a contact 23451 of the logic die 23412 and also to an aluminum pad 23442 of the sensor die 23411.

Then, a pad hole 23443 is formed in the sensor die 23411 so as to reach the aluminum pad 23442 from a back surface side (upper side) of the sensor die 23411.

The technology according to the present disclosure can be applied to the solid-state imaging devices as described above.

Note that in the example described with reference to FIGS. 3 to 6, for example, copper (Cu) wiring is used for the various wirings. Furthermore, hereinafter, a configuration in which wirings (for example, the wirings 23110 and 23170 illustrated in FIG. 5) are directly bonded between the sensor dies stacked together as illustrated in FIG. 5 will be also referred to as "Cu—Cu bonding".

1.2. Functional Configuration

Figure 7:
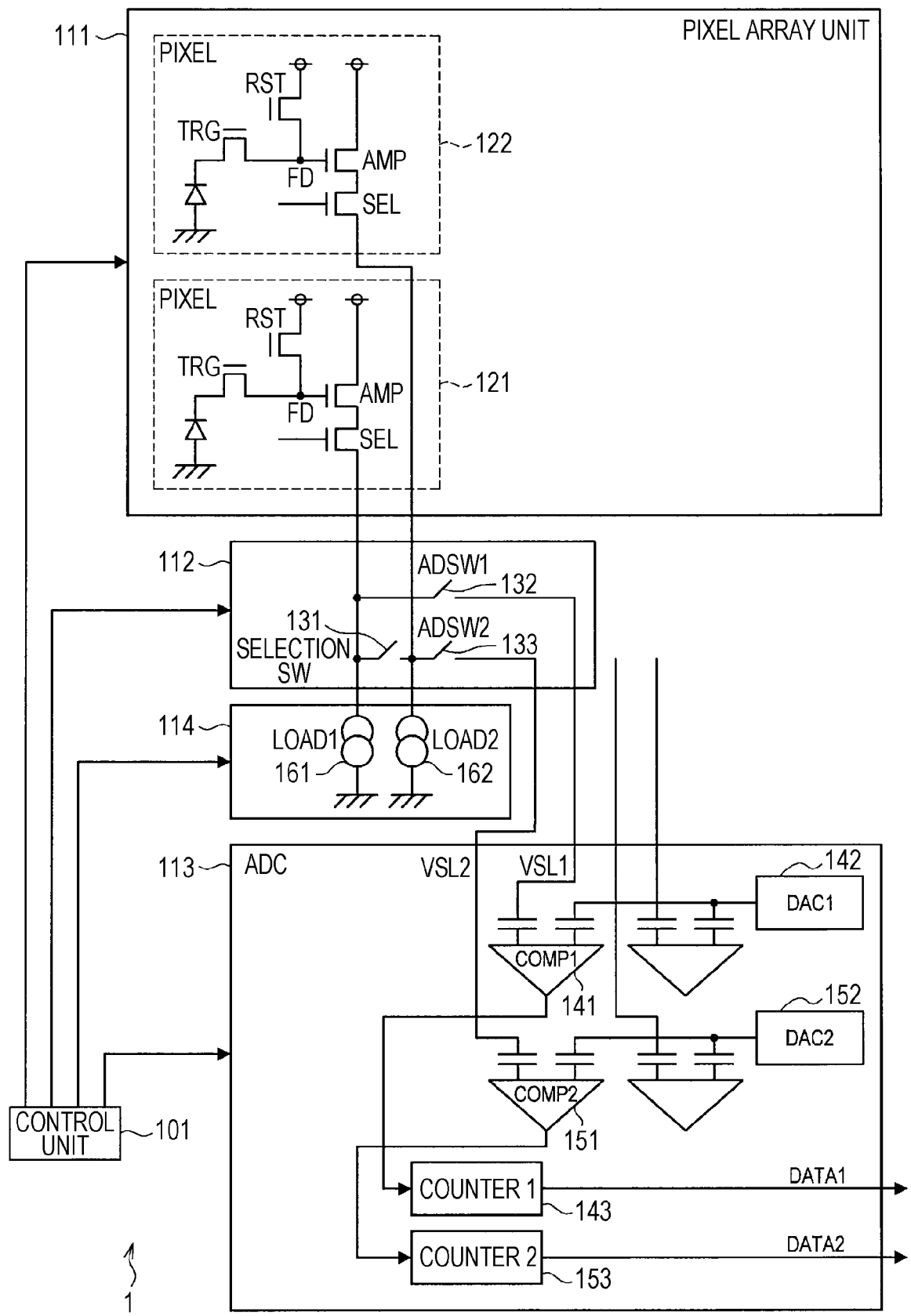
FIG. 7 is a block diagram illustrating an example of a functional configuration of a part of the solid-state imaging device according to one embodiment of the present disclosure.

Next, an example of a functional configuration of a solid-state imaging device according to one embodiment of the present disclosure will be described with reference to FIG. 7. FIG. 7 is a block diagram illustrating an example of a functional configuration of a part of the solid-state imaging device according to one embodiment of the present disclosure. The solid-state imaging device 1 illustrated in FIG. 7 is an image sensor, for example, a complementary metal oxide semiconductor (CMOS) image sensor, a charge coupled device (CCD) image sensor, or the like that captures an image of a subject and obtains digital data of the captured image.

As illustrated in FIG. 7, the solid-state imaging device 1 has a control unit 101, a pixel array unit 111, a selection unit 112, an A/D conversion unit (analog digital converter (ADC)) 113, and a constant current circuit unit 114.

The control unit 101 controls each unit of the solid-state imaging device 1 to execute processing related to reading of image data (pixel signal) and the like.

The pixel array unit 111 is a pixel region in which a pixel configuration having photoelectric conversion elements such as photodiodes are arranged in a matrix (array). The pixel array unit 111 is controlled by the control unit 101, receives light of a subject at respective pixels, photoelectrically converts the incident light to accumulate electric charges, and outputs the electric charges accumulated at the respective pixels as a pixel signal at a predetermined timing.

A pixel 121 and a pixel 122 represent two vertically adjacent pixels in a pixel group arranged in the pixel array unit 111. The pixel 121 and the pixel 122 are pixels in consecutive rows in the same column (column). In the case of the example in FIG. 7, as illustrated in the pixels 121 and 122, a circuit of each pixel uses a photoelectric conversion element and four transistors. Note that the configuration of the circuit of each pixel is arbitrary, and may be other than that of the example illustrated in FIG. 7.

In a general pixel array, an output line for a pixel signal is provided for each column. In the case of the pixel array unit 111, two (two systems of) output lines are provided for every column. The circuits of the pixels of one column are alternately connected to these two output lines by every other row. For example, the circuits of the pixels in odd-numbered rows from the top are connected to one output line, and the circuits of the pixels in even-numbered rows are connected to the other output line. In the case of the example of FIG. 7, the circuit of the pixel 121 is connected to a first output line (VSL1), and the circuit of the pixel 122 is connected to a second output line (VSL2).

Note that FIG. 7 illustrates only the output lines of one column for convenience of description, but in practice, two output lines are similarly provided for each column. To each output line, the circuits of the pixels in that column are connected every other row.

The selection unit 112 has switches for connecting respective output lines of the pixel array unit 111 to inputs of the ADC 113, and is controlled by the control unit 101 to control connection between the pixel array unit 111 and the ADC 113. That is, a pixel signal read from the pixel array unit 111 is supplied to the ADC 113 via the selection unit 112.

The selection unit 112 has a switch 131, a switch 132, and a switch 133. The switch 131 (selection SW) controls connection of two output lines corresponding to the same column. For example, when the switch 131 is turned on (ON), the first output line (VSL1) and the second output line (VSL2) are connected, and when the switch 131 is turned off (OFF), they are disconnected.

Although details will be described later, in the solid-state imaging device 1, one ADC is provided for each output line (column ADC). Therefore, assuming that both the switch 132 and the switch 133 are on, if the switch 131 is turned on, the two output lines of the same column are connected, and the circuit of one pixel is connected to two ADCs. Conversely, when the switch 131 is turned off, the two output lines of the same column are disconnected, and the circuit of one pixel is connected to one ADC. That is, the switch 131 selects the number of ADCs (column ADCs) as output destinations of the signal of one pixel.

Although details will be described later, by controlling the number of ADCs as output destinations of the pixel signals by the switch 131 as described above, the solid-state imaging device 1 can output more various pixel signals according to the number of the ADCs. That is, the solid-state imaging device 1 can achieve more various data outputs.

The switch 132 controls connection between the first output line (VSL1) corresponding to the pixel 121 and the ADC corresponding to the output line. When the switch 132 is turned on (ON), the first output line is connected to one input of a comparator of the corresponding ADC. Furthermore, when it is turned off (OFF), they are disconnected.

The switch 133 controls connection between the second output line (VSL2) corresponding to the pixel 122 and the ADC corresponding to the output line. When the switch 133 is turned on (ON), the second output line is connected to one input of the comparator of the corresponding ADC. Furthermore, when it is turned off (OFF), they are disconnected.

The selection unit 112 can control the number of ADCs (column ADCs) as output destinations of the signal of one pixel by switching the states of such switches 131 to 133 according to control of the control unit 101.

Note that the switch 132 and the switch 133 (either one or both) may be omitted, and each output line may be constantly connected to the ADC corresponding to the output line. However, by allowing these switches to control connection and disconnection thereof, the range of selection of the number of ADCs (column ADCs) as output destinations of the signal of one pixel is expanded. That is, by providing these switches, the solid-state imaging device 1 can output more various pixel signals.

Note that FIG. 7 illustrates only the configuration with respect to one column of output lines, but in practice, the selection unit 112 has a configuration similar to that illustrated in FIG. 7 (the switch 131 to the switch 133) for every column. That is, the selection unit 112 performs connection control similar to that described above for each column according to control of the control unit 101.

The ADC 113 A-D converts each of pixel signals supplied from the pixel array unit 111 via each output line, and outputs it as digital data. The ADC 113 has an ADC (column ADC) for every output line from the pixel array unit 111. That is, the ADC 113 has a plurality of column ADCs. The column ADC corresponding to one output line is a single-slope ADC having a comparator, a D/A converter (DAC), and a counter.

The comparator compares a DAC output thereof with the signal value of a pixel signal. The counter increments a count value (digital value) until the pixel signal and the DAC output become equal. The comparator stops the counter when the DAC output reaches the signal value. Thereafter, the signals digitized by the counters 1 and 2 are output to the outside of the solid-state imaging device 1 from DATA1 and DATA2.

After outputting data for the next A/D conversion, the counter returns the count value to an initial value (for example, 0).

The ADC 113 has two systems of column ADCs for each column. For example, a comparator 141 (COMP1), a DAC 142 (DAC1), and a counter 143 (counter 1) are provided for the first output line (VSL1), and a comparator 151 (COMP2), a DAC 152 (DAC2), and a counter 153 (counter 2) are provided for the second output line (VSL2). Although not illustrated, the ADC 113 has a similar configuration for output lines of other columns.

However, among these configurations, the DAC can be shared. Sharing of DAC is performed for every system. That is, the DAC of the same system in each column is shared. In the case of the example of FIG. 7, the DAC corresponding to the first output line (VSL1) of each column is shared as the DAC 142, and the DAC corresponding to the second output line (VSL2) of each column is shared as the DAC 152. Note that the comparator and the counter are provided for every system of the output lines.

The constant current circuit unit 114 is a constant current circuit connected to each output line, and is driven by being controlled by the control unit 101. The circuit of the constant current circuit unit 114 is configured by, for example, a metal oxide semiconductor (MOS) transistor or the like. Although this circuit configuration is arbitrary, in FIG. 7, for convenience of explanation, a MOS transistor 161 (LOAD1) is provided for the first output line (VSL1), and a MOS transistor 162 (LOAD2) is provided for the second output line (VSL2).

Upon receiving a request from the outside such as a user, the control unit 101 selects a read mode, controls the selection unit 112, and controls connection to the output lines, for example. Furthermore, the control unit 101 controls driving of the column ADC according to the selected read mode. Moreover, the control unit 101 controls driving of the constant current circuit unit 114 as necessary besides the column ADC, and controls driving, such as reading rate and timing for example, of the pixel array unit 111.

That is, the control unit 101 can not only control the selection unit 112 but also operate each unit other than the selection unit 112 in more various modes. Therefore, the solid-state imaging device 1 can output more various pixel signals.

Note that the number of each unit illustrated in FIG. 7 is arbitrary as long as it is sufficient. For example, three or more systems of output lines may be provided for each column. Furthermore, the number of pixel signals output in parallel to the outside may be increased by increasing the number of parallel pixel signals output from the ADC 132 or the number of ADCs 132 itself illustrated in FIG. 7.

The example of the functional configuration of the solid-state imaging device according to one embodiment of the present disclosure has been described above with reference to FIG. 7.

1.3. Circuit Configuration of Unit Pixel

Figure 8:
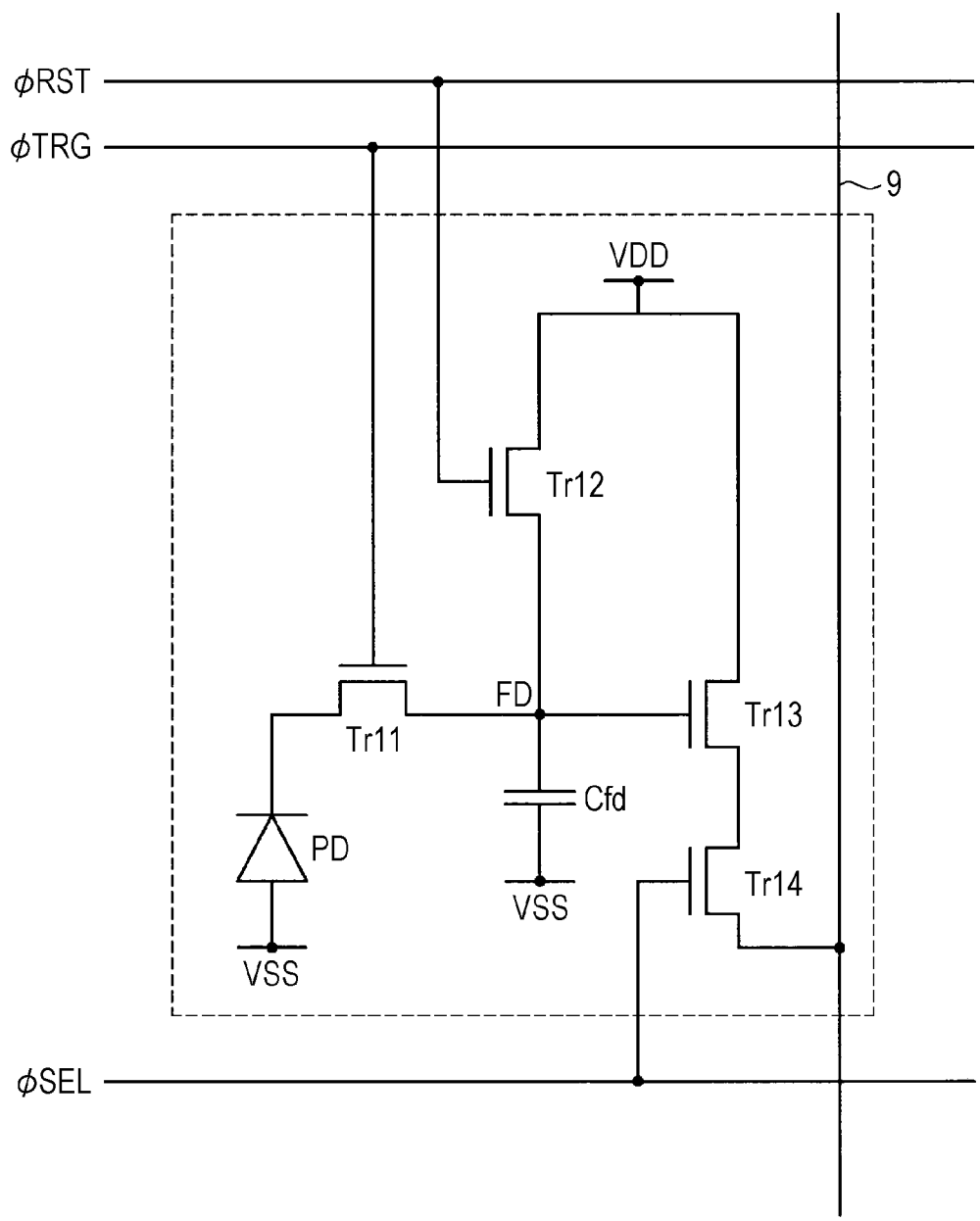
FIG. 8 is a diagram illustrating an example of a circuit configuration of a unit pixel according to one embodiment of the present disclosure.

Next, an example of a circuit configuration of the unit pixel will be described with reference to FIG. 8. FIG. 8 is a diagram illustrating an example of a circuit configuration of a unit pixel according to one embodiment of the present disclosure. As illustrated in FIG. 8, the unit pixel 121 according to one embodiment of the present disclosure includes a photoelectric conversion unit, for example, a photodiode PD, and four pixel transistors. The four pixel transistors are, for example, a transfer transistor Tr11, a reset transistor Tr12, an amplification transistor Tr13, and a selection transistor Tr14. These pixel transistors can be formed by, for example, n-channel MOS transistors.

The transfer transistor Tr11 is connected between a cathode of the photodiode PD and a floating diffusion part FD. Signal charges (here, electrons) that have been photoelectrically converted by the photodiode PD and accumulated therein are transferred to the floating diffusion part FD by applying a transfer pulse φTRG to a gate. Note that reference sign Cfd schematically indicates parasitic capacitance of the floating diffusion part FD.

The reset transistor Tr12 has a drain connected to a power supply VDD and a source connected to the floating diffusion part FD. Then, prior to transfer of the signal charges from the photodiode PD to the floating diffusion part FD, a reset pulse φRST is applied to a gate to reset a potential of the floating diffusion part FD.

The amplification transistor Tr13 has a gate connected to the floating diffusion part FD, a drain connected to the power supply VDD, and a source connected to a drain of the selection transistor Tr14. The amplification transistor Tr13 outputs the potential of the floating diffusion part FD after being reset by the reset transistor Tr12 as a reset level to the selection transistor Tr14. Moreover, the amplification transistor Tr13 outputs the potential of the floating diffusion part FD after the signal charges are transferred by the transfer transistor Tr11, as a signal level to the selection transistor Tr14.

The selection transistor Tr14 has, for example, a drain connected to the source of the amplification transistor Tr13 and a source connected to the vertical signal line 9. Then, by applying a selection pulse φSEL to a gate of the selection transistor Tr14, the selection transistor Tr14 is turned on and outputs the signal output from the amplification transistor Tr13 to the vertical signal line 9. Note that for the selection transistor Tr14, a configuration that it is connected between the power supply VDD and the drain of the amplification transistor Tr13 may be employed.

Note that in a case where the solid-state imaging device 1 according to the present embodiment is configured as a solid-state imaging device of stacked type, for example, elements such as a photodiode and a plurality of MOS transistors are formed in the sensor die 23021 at B or C in FIG. 2. Further, the transfer pulse, the reset pulse, the selection pulse, and the power supply voltage are supplied from the logic die 23024 at B or C in FIG. 2. Furthermore, an element at a stage subsequent to the vertical signal line 9 connected to the drain of the selection transistor is configured by the logic circuit 23014 and formed in the logic die 23024.

The example of the circuit configuration of the unit pixel has been described above with reference to FIG. 8.

2. OUTLINE OF PUF

Next, an outline of physically unclonable function (PUF) will be explained. The PUF is a function that outputs a value unique to a device by using physical characteristics that are difficult to copy. Examples of the PUF include Arbiter PUF, SRAM PUB, Glitch PUF, and the like.

For example, the Arbiter PUF is a technology that uses a delay difference between signals that arrive at a circuit called Arbiter through two routes, so as to output a value unique to the device. Furthermore, the SRAM PUF is a technology that uses a difference in an initial value immediately after an SRAM (Static Random Access Memory) is powered on, so as to output a value unique to the device. Furthermore, the Glitch PUF is a technology that uses a phenomenon called a glitch that occurs due to a delay relationship between input and output signals of each gate constituting a logic circuit, so as to output a value unique to the device.

The value unique to a device generated by using such a PUF is, because of its characteristic of being difficult to copy, it is expected to be used for example as an identifier (ID) for identifying an individual device or as what is called key information (for example, a key for encryption).

The outline of the PUF has been explained above. Note that in the following description, a device-specific value generated using the above PUF will also be referred to as a "PUF value".

3. FIRST EMBODIMENT

As a first embodiment, a solid-state image sensor that internally completes an encryption processing will be described. Conventionally, there has been a technique of generating an encryption key inside an imaging device on the basis of unique information unique to a solid-state image sensor. However, if the unique information is output from the solid-state image sensor and encrypted by a functional block different from the solid-state image sensor, the unique information used for encryption may leak.

Accordingly, in the first embodiment, a solid-state image sensor that internally completes encryption processing using unique information without outputting the unique information to the outside will be described.

3.1. Configuration Example

Figure 9:
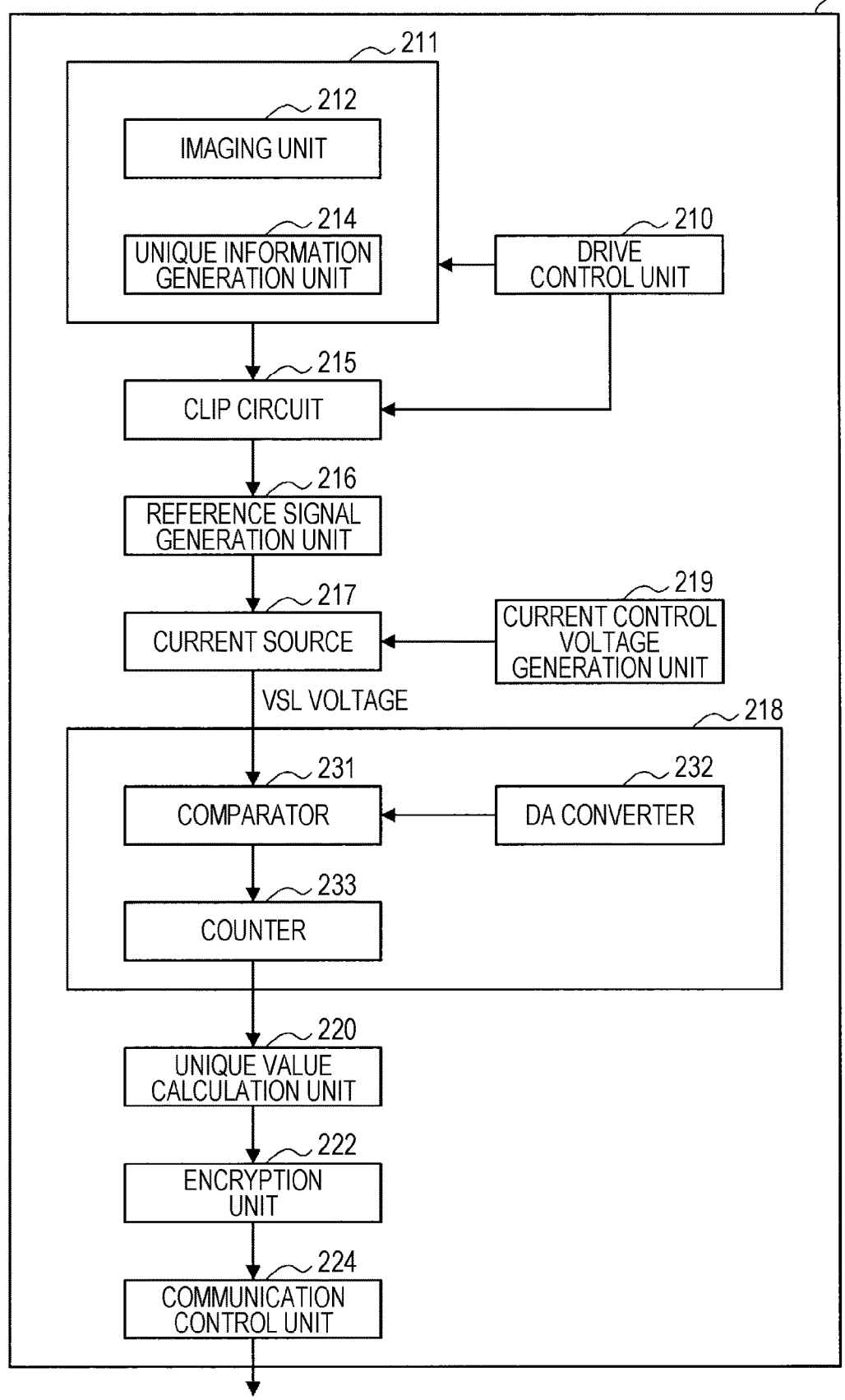
FIG. 9 is an explanatory diagram illustrating a functional configuration example of a solid-state image sensor according to a first embodiment of the present disclosure.

FIG. 9 is an explanatory diagram illustrating a functional configuration example of the solid-state image sensor according to the first embodiment of the present disclosure. FIG. 9 illustrates a functional configuration example of a solid-state imaging device 1 that internally completes encryption processing using unique information. Hereinafter, the functional configuration example of the solid-state image sensor according to the first embodiment of the present disclosure will be described using FIG. 9.

As illustrated in FIG. 9, the solid-state imaging device 1 according to the first embodiment of the present disclosure includes a drive control unit 210, a pixel array unit 211 that includes an imaging unit 212 and a unique information generation unit 214 and includes predetermined rows and columns, a clip circuit 215, a reference signal generation unit 216, a current source 217, a detection unit 218, a unique value calculation unit 220, an encryption unit 222, and a communication control unit 224.

The drive control unit 210 generates a signal for driving the imaging unit 212 and the unique information generation unit 214 described later on the basis of a predetermined input clock and data, and drives the imaging unit 212 and the unique information generation unit 214. The drive control unit 210 can include, for example, the control circuit 8, the vertical drive circuit 4, and the horizontal drive circuit 6 in the configuration of the solid-state imaging device 1 described with reference to FIG. 1. Furthermore, the drive control unit 210 can be provided in the control circuit 23013 illustrated in FIG. 2.

The drive control unit 210 may have a function to switch between driving the imaging unit 212 and driving the unique information generation unit 214 when driving the pixel array unit 211. By the drive control unit 210 having the function to switch between driving the imaging unit 212 and driving the unique information generation unit 214, it is possible to share a circuit between the imaging unit 212 and the unique information generation unit 214. Furthermore, by the drive control unit 210 having the function to switch between driving the imaging unit 212 and driving the unique information generation unit 214, a special element for generating unique information is not required, and the unique value is difficult to analyze.

Furthermore, the drive control unit 210 may have a function to separate an element in the pixel array unit 211 that is driven when an image is output and an element that is driven to detect element unique information. Since the drive control unit 210 has the function to divide an element to be driven when outputting an image and an element to be driven to detect element unique information, the element unique information is prevented from being leaked.

Furthermore, the drive control unit 210 may perform control so as to drive with a bias current different from that for driving when outputting an image, when driving for detecting element unique information. When driving for detecting element unique information, by the drive control unit 210 performing control to drive with a bias current different from that for driving when outputting an image, it is possible to suitably drive for stably obtaining a unique value. Specifically, for example, driving of the MOS transistor 161 (LOAD1) and the MOS transistor 162 (LOAD2) in the circuit illustrated in FIG. 7 is changed between when driving for detecting element unique information and when driving for outputting an image. By changing the driving of the MOS transistor 161 (LOAD1) and the MOS transistor 162 (LOAD2), characteristics appearing in the amplification transistor AMP can be changed. By the drive control unit 210 performing control to drive for detecting element unique information with the bias current according to the temperature, driving suitable for more stably obtaining a unique value is possible.

The drive control unit 210 may perform control to drive with a bias current according to a chip temperature of the solid-state imaging device 1 when driving for detecting element unique information with a bias current different from that for driving when outputting an image.

The pixel array unit 211 has unit pixels arranged in predetermined rows and columns, and is configured to output data by a source follower circuit.

The imaging unit 212 has a pixel array in which pixels including a plurality of photoelectric conversion units are arranged in a two-dimensional array, and is driven by the drive control unit 210 to output an analog signal. The circuit configuration of each pixel in the imaging unit 212 is, for example, that illustrated in FIG. 8.

In the unique information generation unit 214, for example, circuits having the same configuration as the pixels provided in the imaging unit 212 are arranged one-dimensionally, and are driven by the drive control unit 210 to output an analog signal. A circuit formed as the unique information generation unit 214 may be manufactured in substantially the same manufacturing process as that for the pixels provided in the imaging unit 212. Furthermore, the drive control unit 210 may switch between driving of the imaging unit 212 and driving of the unique information generation unit 214.

The unique information generation unit 214 may be a pixel provided in an optical black (OPB) region in the pixel array. Each element in a circuit configured as the unique information generation unit 214 has physical variations at the time of manufacturing. In the solid-state imaging device 1 according to the first embodiment of the present disclosure, the analog signal output by this unique information generation unit 214 is used as the basis of unique non-copyable information (element unique information).

An example of a generation source of the analog signal output by the unique information generation unit 214 will be given. In the following description, it is assumed that the unique information generation unit 214 has a configuration similar to that of the pixel 121 illustrated in FIGS. 7 and 8.

(Photodiode PD)

A photodiode PD has a noise component due to a crystal defect at the time of manufacturing. The crystal defect causes variations in dark current. The crystal defect appears as fixed pattern noise.

(Selection Transistor SEL)

A selection transistor SEL has a noise component due to variations in threshold voltage Vth. The variations in the threshold voltage Vth are due to structural factors such as an oxide film, a channel width, a channel length, and impurities. The variations in the threshold voltage Vth appear as fixed pattern noise.

(Reset Transistor RST)

A reset transistor RST also has a noise component due to variations in the threshold voltage Vth. The variations in the threshold voltage Vth are due to structural factors such as an oxide film, a channel width, a channel length, and impurities. The variations in the threshold voltage Vth appear as fixed pattern noise.

(Floating Diffusion Part FD)

A floating diffusion part FD has a noise component due to a crystal defect at the time of manufacturing. The crystal defect causes variations in dark current. The crystal defect appears as fixed pattern noise. When the reset transistor RST switches from on to off, kTC noise (reset noise) appears in the floating diffusion part FD. This kTC noise occurs temporarily. When the reset transistor RST switches from on to off, a feedthrough appears in the floating diffusion part FD. This feedthrough is caused by variations in parasitic capacitance and a threshold value, and appears as fixed pattern noise.

(Amplification Transistor AMP)

An amplification transistor AMP also has a noise component due to variations in the threshold voltage Vth. The variations in the threshold voltage Vth are due to structural factors such as an oxide film, a channel width, a channel length, and impurities. The variations in the threshold voltage Vth appear as fixed pattern noise. Furthermore, the amplification transistor AMP has a noise component caused by overdrive voltage, a noise component caused by thermal noise, a noise component caused by 1/f noise, and a noise component caused by random telegraph noise (RTN). The RTN is considered to be caused by charge trapping and detrapping due to defects in an oxide film. The presence or absence of defects in the oxide film is inherent variations, but what is observed is a binary or multi-valued temporal signal level fluctuation.

These noise components are transmitted to the detection unit 218 in the subsequent stage via a signal line (VSL). During normal driving, among these noise components, a noise component that does not change before and after transfer of a signal is removed by CDS processing. In the present embodiment, when generating a unique value, the solid-state imaging device 1 does not remove these noise components but uses them as element unique information to be the basis of the unique value. By using the noise components included in the analog signal output from the unique information generation unit 214 as the basis of the unique value, the solid-state imaging device 1 can generate a unique value that is difficult to analyze.

The unique information generation unit 214 can be provided, for example, at a position where light from the outside does not reach (shielded position). Providing the unique information generation unit 214 at a light-shielded position enables the solid-state imaging device 1 to stably generate unique information without being affected by external light. Further, the unique information generation unit 214 may have one or more rows of circuits as many as the number of columns of the pixel array of the imaging unit 212. Furthermore, the unique information generation unit 214 may be provided with a row selection switch that operates by a control signal from the drive control unit 210.

The clip circuit 215 is a circuit arranged in n columns in the same number of columns as the number of columns of the pixel array unit 211, and is a source follower circuit connected in parallel with the source follower circuit of the pixel array unit 211. The clip circuit 215 has a function of clipping the voltages (VSL voltages) of the output lines for every column to make it fall within a predetermined range.

Figure 10A:
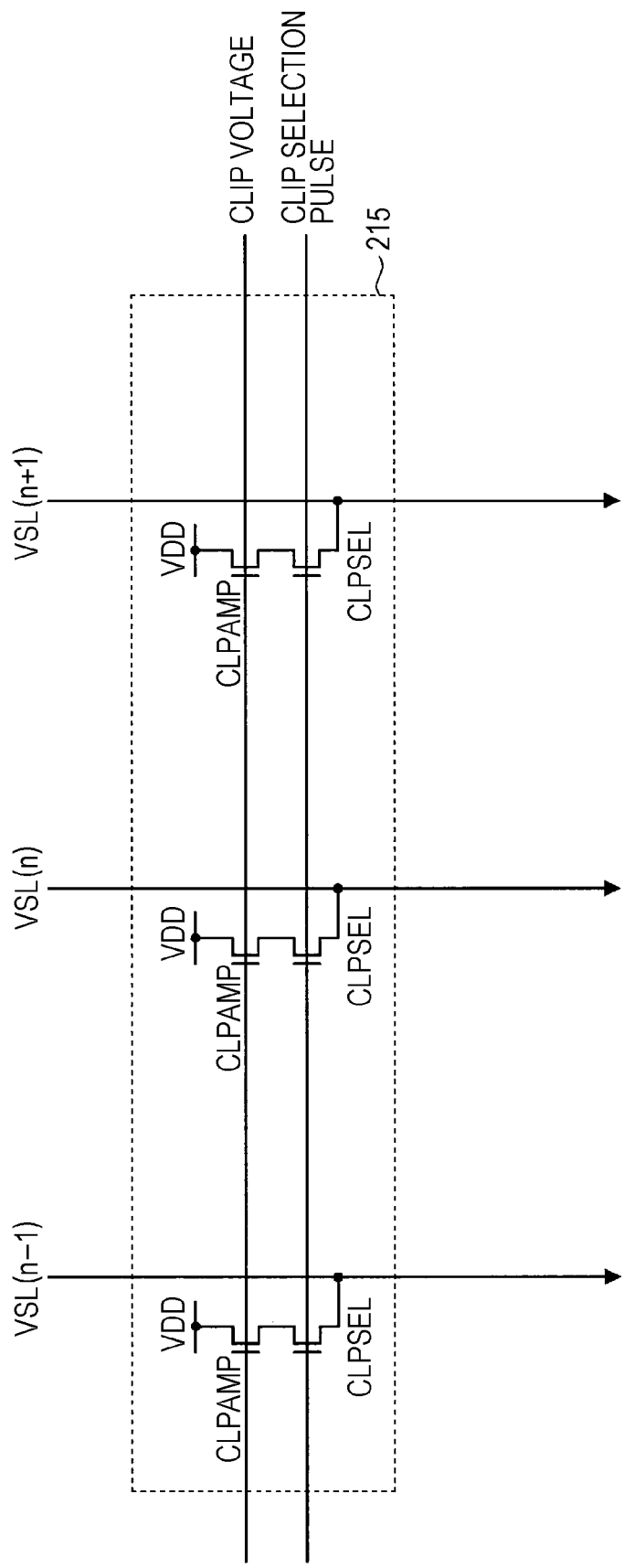
FIG. 10A is an explanatory diagram illustrating a circuit configuration example of a clip circuit according to the same embodiment.

FIG. 10A is an explanatory diagram illustrating a circuit configuration example of the clip circuit 215. The clip circuit 215 is a source follower circuit capable of selecting a row and connected to the output lines VSL in parallel with the pixel. The clip circuit 215 includes transistors CLPSEL and CLPAMP corresponding to the respective output lines VSL. The transistor CLPSEL is a transistor that operates linearly, and performs control to connect a source of the transistor CLPAMP and the output line VSL. The control is performed by a clip selection pulse. The transistor CLPAMP is a transistor that operates in saturation, and outputs a signal according to an input when a bias current is supplied by a current source, similarly to the amplification transistor AMP of the pixel. The input is given as a clipping voltage, which is usually an intermediate potential of about 1 V to 2 V.

In a selected state, when an output voltage of the source follower (pixels in the selected row) connected to the output line VSL becomes lower than the voltage output according to the clipping voltage, the bias current preferentially flows in the clip circuit 215. Consequently, the source follower output of the pixel on the selected row no longer functions, and the voltage of the output line VSL is clipped to the output level according to the clipping voltage. As the clipping voltage, a common DC voltage is supplied to a unit clip circuit for every column, but at this time, similarly to the pixel source follower, the threshold value variations and the overdrive voltage vary individually.

The reference signal generation unit 216 averages the VSL voltages output by the clip circuit 215 for every column and outputs the averaged VSL voltage. The current source 217 is a circuit for supplying the constant current and outputting the VSL voltage, and is driven by a current control voltage generation unit 219. The current source 217 is arranged in n columns and forms a source follower circuit with an amplification transistor in the unit pixel. The current control voltage generation unit 219 uses a bandgap reference circuit to generate a current control voltage so that the current value of the current source 217 does not depend on temperature.

The detection unit 218 performs signal processing for converting the analog signal output by the unique information generation unit 214 into a digital signal. The detection unit 218 includes a comparator 231, a DA converter 232, and a counter 233. The comparator 231 compares the VSL voltage output by the current source 217 with a reference waveform output by the DA converter 232 to convert the voltage into time. The comparator 231 includes an input capacitor provided on an input side and a switch that short-circuits input and output of the comparator 231. The DA converter 232 generates a reference waveform supplied to the comparator 231. The counter 233 has a function of counting until an output of the comparator 231 is inverted and converting time into a count number.

The detection unit 218 outputs the converted digital signal to the unique value calculation unit 220. The detection unit 218 can have, in addition to the function to convert an analog signal into a digital signal, a function to perform a difference process on two input signals, and a function to remove variations generated in the detection unit 218 itself. By providing the function to remove variations generated in the detection unit 218 itself, no extra variations are added to the signal from the unique information generation unit 214, and thus it is possible to improve quality of the signal that is the basis of the unique value. Furthermore, the detection unit 218 may perform a column parallel process or a pixel parallel process on the analog signal output by the unique information generation unit 214.

The detection unit 218 may include a capacitor that clamps the potential of a signal line and a switch that sets one end of the capacitor to a reference potential. Specifically, the ADC 113 illustrated in FIG. 7 may include a switch that connects one end of a capacitor element provided on the input side of the comparators 141 and 151 to the output side of the comparators 141 and 151. By connecting one end of the capacitor element to the output side of the comparators 141 and 151 by the switch, a diode-connected transistor is generated among the transistors included in the comparators 141 and 151. Consequently, one end of the capacitor that clamps the potential of the signal line is set to the predetermined reference potential, and thus variations in an analog region can be removed. Furthermore, the detection unit 218 may also perform a difference process on a digital value after AD conversion. The detection unit 218 can remove variations in a digital region by performing the difference process on the digital value after AD conversion.

Furthermore, the detection unit 218 may have a function to shift a clamp level as described later. By shifting the clamp level, the detection unit 218 can optimize an analog value distribution centered on a predetermined reference when converting an analog value into a digital value. By optimizing the analog value distribution, it is possible to obtain unique information output by the unique information generation unit 214 without loss.

In a case where a plurality of detection units 218 is arranged, each detection unit 218 may have a function to obtain a difference between a signal input to each detection unit 218 and a reference signal common to the plurality of detection units 218. In this case, a reference signal common to the plurality of detection units 218 may be substantially the same as the average of signals that are each input to the detection units 218.

Between the unique information generation unit 214 and the detection unit 218, a memory, particularly an analog memory, for temporarily holding the unique information output by the unique information generation unit 214 may be provided. The analog memory may be a parasitic capacitance of a signal line as described below. Furthermore, in a case where analog memories are provided respectively between the unique information generation unit 214 and the plurality of detection units 218, a switch for short-circuiting the analog memories may be provided. It becomes easy to generate unique information, and the unique information held in each analog memory is erased by shorting-circuiting and averaging the analog memories.

FIG. 10B is an explanatory diagram illustrating a circuit configuration example of the reference signal generation unit 216, the current source 217, and the comparator 231. FIG. 10B illustrates an (n−1)th output line VSL(n−1), an nth output line VSL(n), and an (n+1)th output line VSL(n+1).

The output line VSL(n−1) is provided with switches 251a and 252a as the reference signal generation unit 216, and a parasitic capacitance 253a exists on the output line VSL(n−1). The output line VSL(n) is provided with switches 251b and 252b as the reference signal generation unit 216, and a parasitic capacitance 253b exists on the output line VSL(n). The output line VSL(n+1) is provided with switches 251c and 252c as the reference signal generation unit 216, and a parasitic capacitance 253c exists on the output line VSL(n+1).

As the current source 217, a transistor 261a is connected to one end of the switch 252a, a transistor 261b is connected to one end of the switch 252b, and a transistor 261c is connected to one end of the switch 252c.

On the output line VSL(n−1), input capacitors 271a and 272a, switches 273a and 274a, and a comparator 275a exist as the comparator 231. On the output line VSL(n), input capacitors 271b and 272b, switches 273b and 274b, and a comparator 275b exist as the comparator 231. On the output line VSL(n+1), input capacitors 271c and 272c, switches 273c and 274c, and a comparator 275c exist as the comparator 231.

Figure 11A:
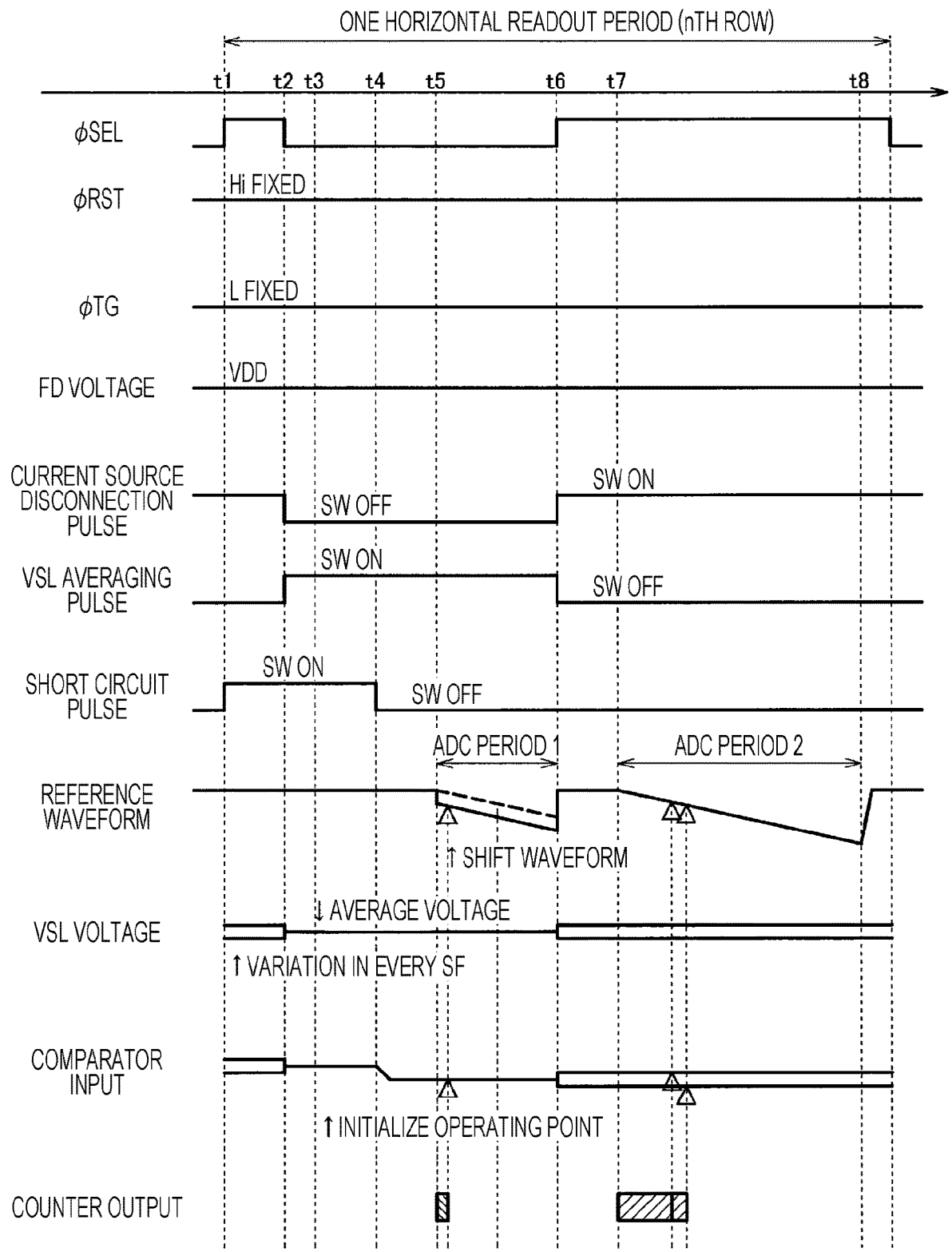
FIG. 11A is an explanatory diagram illustrating operations when generating unique information according to the same embodiment in a timing chart.

FIG. 11A is an explanatory diagram illustrating operations of the reference signal generation unit 216, the current source 217, and the comparator 231 when generating unique information in a timing chart. Operations of respective elements provided on the output line VSL(n−1) or along the output line VSL(n−1) will be described below.

One horizontal readout period starts at time t1. At this point, a row selection signal φSEL goes high and row selection starts. At this point, the reset transistor RST is in an on state, and thus the voltage of the floating diffusion part FD is fixed to VDD. Thus, variations in the floating diffusion part FD are removed. Furthermore, when generating the unique information, a transfer pulse φTRG is fixed to low. Since the transfer pulse φTRG is fixed to low, the transfer transistor TRG is turned off, and variations in the photodiode PD can be removed.

Further, at time t1, a current source disconnection pulse for disconnecting the current source 217 is high, and the switch 252a is on. Furthermore, at time t1, the VSL averaging pulse that averages the VSL voltage is low, and the switch 251a is off. Thus, even when the source follower is operating, variation information of every source follower is output to the output line VSL.

At time t2, the row selection signal (selection pulse) φSEL and the current source disconnection pulse simultaneously become low, and the VSL voltage for every column is held in the VSL parasitic capacitance 253a. Furthermore, at time t2, the VSL averaging pulse goes high and the VSL voltage in each column is averaged. This averaged VSL voltage becomes the reference signal.

At time t3, an internal offset of the comparator 275a and a difference between the VSL voltage and the reference waveform are charged in the input capacitor 272a, and an operating point of the comparator 275a is initialized.

At time t4, a short circuit pulse goes low, turning off the switches 273a and 274a. Thus, kTC noise and feedthrough variations occur in the switches 273a and 274a.

Times t5 to t6 are a first AD conversion period (ADC period 1). During this period, the DA converter 232 changes the reference waveform linearly with a predetermined slope. Then, the comparator 275a AD-converts the reference signal using the reference waveform. The DA converter 232 may have a function to shift the reference waveform. That is, the DA converter 232 may have a function to shift a clamp level. The DA converter 232 can add an offset to an output of the counter 233 by shifting the reference waveform. In this ADC period 1, an inversion delay of the comparator 275a, a delay of the reference waveform, and a clock delay of the counter occur. Note that a triangle in FIG. 11A indicates an inversion timing of the comparator 275a.

When the ADC period 1 ends at time t6, the row selection signal φSEL goes high, the current source disconnection pulse goes high, and the VSL averaging pulse goes low. That is, the switch 251a turns off and the switch 252a turns on. Thus, even when the source follower is operating, variation information (variations in output of the amplification transistor) for every source follower is output to the output line VSL.

Times t7 to t8 are a second AD conversion period (ADC period 2). Also during this period, the DA converter 232 changes the reference waveform linearly with a predetermined slope. Then, the comparator 275a AD-converts the reference signal using the reference waveform. Here, the digital value after conversion similarly includes the kTC noise and the feedthrough variations in the switches 273a and 274a generated at time t4, the inversion delay of the comparator 275a generated in the ADC period 1, the delay of the reference waveform, and the clock delay of the counter. Note that a triangle in FIG. 11A indicates an inversion timing of the comparator 275a.

Accordingly, when the ADC period 2 ends, a difference process is performed between a count value of the counter 233 in the ADC period 1 and a count value of the counter 233 in the ADC period 2. By this difference process, it is possible to remove variations generated in the detection unit 218. Therefore, it is possible to prevent the element unique information from including the variations generated in the detection unit 218.

Furthermore, since the output of the counter 233 is offset in the ADC period 1, even if the above difference process is performed, variations due to the unique information generation unit 214 will not be lost. The variations due to the unique information generation unit 214 are normally distributed with the reference signal as the center. Therefore, if there is no offset, a negative value occurs in the variations due to the unique information generation unit 214, and all values less than or equal to 0 become 0.

It is desirable that a slope of the reference waveform during AD conversion is adjusted (analog gain adjustment) so that a desired digital value can be obtained. Furthermore, when the element unique information is read, the current of the current source (drain current Id) may be smaller than that in normal reading. An overdrive voltage is obtained by 2×Id/gm and variations thereof are proportional to the overdrive voltage. Thus, if the drain current Id is reduced, a variation component of the overdrive voltage included in the source follower becomes relatively small. That is, information of variations in the threshold value of the amplification transistor AMP can be mainly detected. Furthermore, when the element unique information is read, the current of the current source (drain current Id) may be made larger than that in normal reading. By increasing the current of the current source, the variation component of the overdrive voltage in the variation information included in the source follower can also be relatively increased.

Thermal noise of the amplification transistor AMP, 1/f noise, RTN, and thermal noise of peripheral circuits are included as temporal noise, but these can be suppressed by performing multiple readings and adding (averaging).

In order to suppress deterioration with time, it is desirable that the solid-state imaging device 1 be drive-controlled under the following conditions. Considering hot carrier injection, it is desirable that the current during operation is small. That is, it is desirable to control the bias current to be small. Furthermore, similarly considering hot carrier injection, it is desirable that the operation time is short. For example, it is desirable to control so as to drive only at a time of activation or request. Furthermore, similarly considering hot carrier injection, it is desirable that no current flows when not in use. That is, it is desirable to turn off the selection transistor SEL when not in use. Furthermore, considering destruction of the oxide film, it is desirable that the voltage difference between the gate and the source or drain of the target element is small when not in use. That is, it is desirable to turn on the reset transistor RST when not in use. Furthermore, considering substrate hot carrier injection, it is desirable that the unique information generation unit 214 is shielded from light.

A high-level potential of the selection pulse φSEL may be about VDD (2.7 V), or may be an intermediate potential (about 1 V to 1.5 V). If a potential difference (VDS) between the drain and source of the selection transistor SEL is taken to cause a saturation operation, a source follower is formed. For example, assuming that the drain voltage of the selection transistor SEL is 2.7 V, the drain side of the selection transistor SEL (source side of the amplification transistor AMP) is usually about 2.2 V. On the other hand, if VDS of the selection transistor SEL is sufficiently taken (if there is a difference of at least about several hundred to 700 mV), it is possible to cause the saturation operation. Consequently, an output according to a gate voltage of the selection transistor SEL is transmitted to the output line VSL. Similarly to the amplification transistor AMP, when the selection transistor SEL operates in saturation, the threshold value and the overdrive voltage vary from element to element, and thus variations in the threshold value of the selection transistor SEL and the overdrive voltage can be detected. At this time, for the pixels in a non-selected row and the clip circuit 215, the selection switch is turned off, and they do not participate in the reading.

The current control voltage generation unit 219 can change the overdrive voltage by driving the current control voltage with different voltages in the ADC period 1 and the ADC period 2. The change amount of the overdrive voltage at this time varies, and thus the change amount of the overdrive voltage can be detected as element unique information.

Figure 11B:
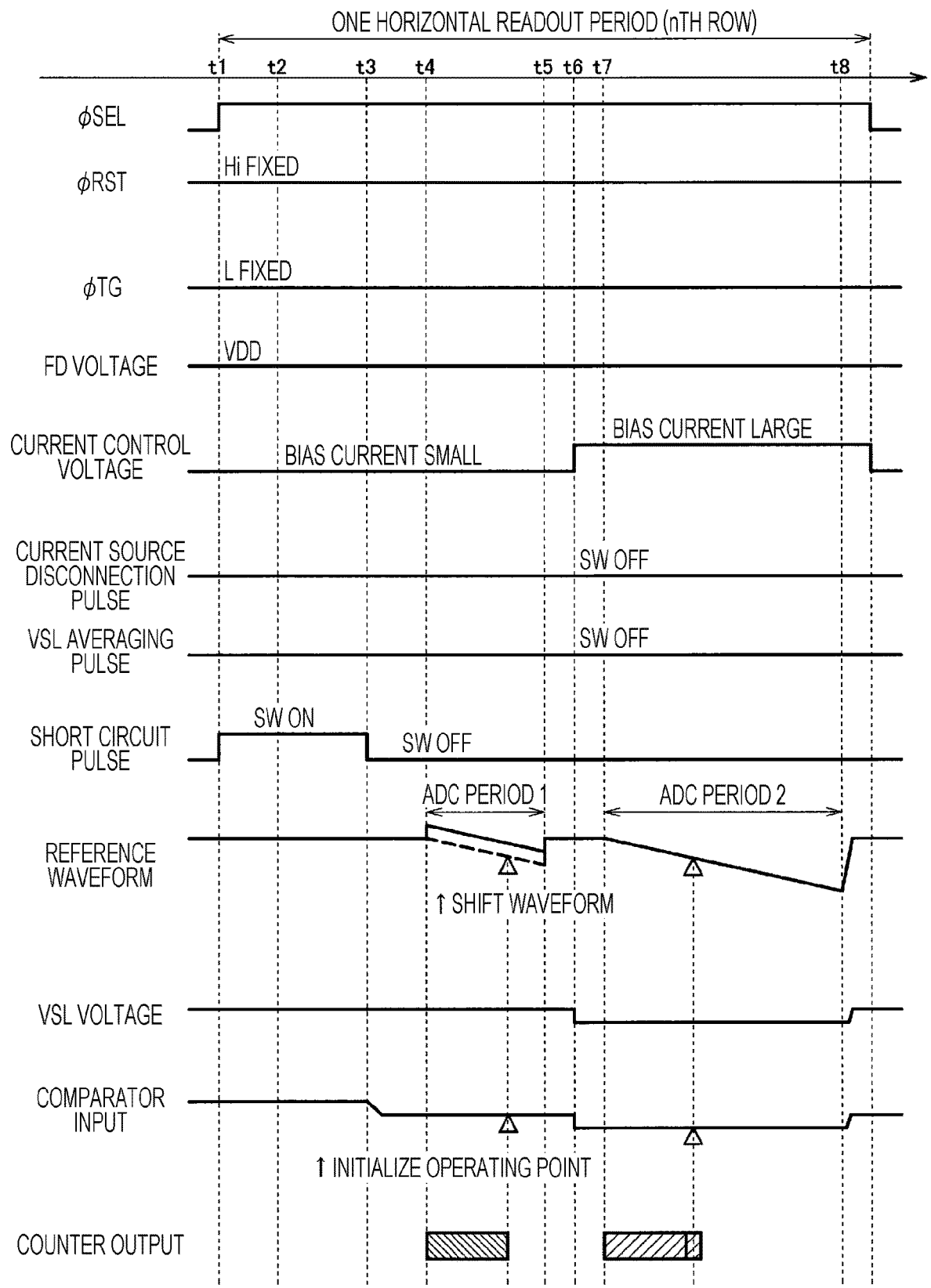
FIG. 11B is an explanatory diagram illustrating operations when generating unique information according to the same embodiment in a timing chart.

FIG. 11B is an explanatory diagram illustrating operations of the reference signal generation unit 216, the current source 217, and the comparator 231 when generating unique information in a timing chart. Operations of respective elements provided on the output line VSL(n−1) or along the output line VSL(n−1) will be described below. It differs from the timing chart of FIG. 11A in that the current source disconnection pulse and the VSL averaging pulse are always at low level.

One horizontal readout period starts at time t1. At this point, the row selection signal φSEL goes high and row selection starts. At this point, the reset transistor RST is in an on state, and thus the voltage of the floating diffusion part FD is fixed to VDD. Thus, variations in the floating diffusion part FD are removed. Furthermore, when generating the unique information, the transfer pulse φTRG is fixed to low. Since the transfer pulse φTRG is fixed to low, the transfer transistor TRG is turned off, and variations in the photodiode PD can be removed.

At time t2, an internal offset of the comparator 275a and a difference between the VSL voltage and the reference waveform are charged in the input capacitor 272a, and the operating point of the comparator 275a is initialized.

At time t3, the short circuit pulse goes low, turning off the switches 273a and 274a. Thus, kTC noise and feedthrough variations occur in the switches 273a and 274a.

Times t4 to t5 are a first AD conversion period (ADC period 1). During this period, the DA converter 232 changes the reference waveform linearly with a predetermined slope. Then, the comparator 275a AD-converts the reference signal using the reference waveform. In this ADC period 1, an inversion delay of the comparator 275a, a delay of the reference waveform, and a clock delay of the counter occur. Note that a triangle in FIG. 11B indicates an inversion timing of the comparator 275a.

Subsequently, at time t6, the current control voltage generation unit 219 controls the current control voltage so as to increase the bias current.

Times t7 to t8 are a second AD conversion period (ADC period 2). Also during this period, the DA converter 232 changes the reference waveform linearly with a predetermined slope. Then, the comparator 275a AD-converts the reference signal using the reference waveform. Here, the digital value after conversion similarly includes the kTC noise and the feedthrough variations in the switches 273a and 274a generated at time t4, the inversion delay of the comparator 275a generated in the ADC period 1, the delay of the reference waveform, and the clock delay of the counter. Note that a triangle in FIG. 11B indicates an inversion timing of the comparator 275a.

Accordingly, when the ADC period 2 ends, a difference process is performed between a count value of the counter 233 in the ADC period 1 and a count value of the counter 233 in the ADC period 2. By this difference process, it is possible to remove variations generated in the detection unit 218. Only bias current values are different between the ADC period 1 and the ADC period 2, and thus threshold value information is canceled and it is possible to extract the component of the overdrive voltage. Here, gain coefficient β of the transistor is (W/L)×p×$C_{ox}$. W is a gate width, L is a gate length, p is electron mobility, and $C_{ox}$ is an oxide film capacity per unit area. Furthermore, the mutual inductance gm is approximately $2^{1/2}$×β×Id. Therefore, the overdrive voltage is 2×Id/gm=$(2×Id/β)^{1/2}$. β has element-specific variations, and thus an output according to the bias current and element variations can be obtained. The mobility μ is included in β, and the mobility μ includes temperature characteristics. Therefore, as will be described later, by adjusting the bias current and the slope and shift amount of the reference waveform according to the temperature, it is possible to mitigate characteristic changes due to temperature and perform AD conversion in an appropriate range. Lattice scattering is dominant at operating temperatures of the solid-state imaging device 1, and thus a temperature characteristic of the mobility depends on an absolute temperature $T^{-3/2}$.

Even when operating according to the timing chart illustrated in FIG. 11B, the high-level potential of the selection pulse φSEL may be about VDD (2.7 V), or may be an intermediate potential (about 1 V to 1.5 V). If the potential difference (VDS) between the drain and source of the selection transistor SEL is taken to cause a saturation operation, a source follower is formed.

The RTN is a component that fluctuates with time, but an element that generates it is fixed (FPN component). Therefore, detection of RTN is also possible.

In general, the RTN is generated during a process of capturing or emitting electrons to a defect level and has a large amplitude, and thus it produces a binary or multilevel output. Since RTN detection usually involves a temporal change, it is either observed continuously or is sampled multiple times. Here, the temporal change refers to having a time constant generated by a difference between energy level that a defect has and Fermi level of channel electrons of the amplification transistor AMP of the pixel, with which a binary or multiple states occur at an arbitrary timing.

Figure 11C:
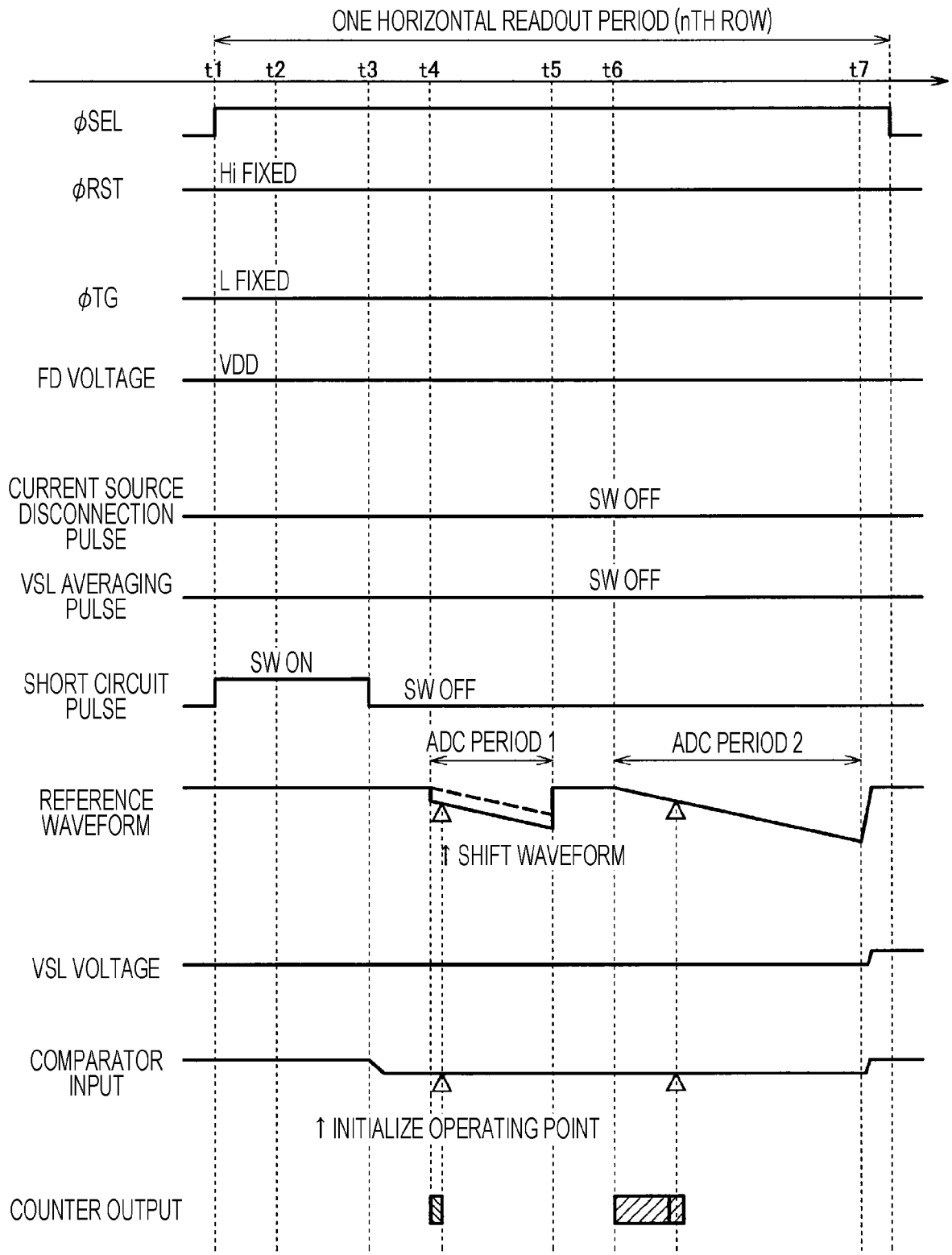
FIG. 11C is an explanatory diagram illustrating operations when generating unique information according to the same embodiment in a timing chart.

FIG. 11C is an explanatory diagram illustrating operations of the reference signal generation unit 216, the current source 217, and the comparator 231 when generating unique information in a timing chart. Operations of respective elements provided on the output line VSL(n−1) or along the output line VSL(n−1) will be described below.

One horizontal readout period starts at time t1. At this point, the row selection signal φSEL goes high and row selection starts. At this point, the reset transistor RST is in an on state, and thus the voltage of the floating diffusion part FD is fixed to VDD. Thus, variations in the floating diffusion part FD are removed. Furthermore, when generating the unique information, the transfer pulse φTRG is fixed to low. Since the transfer pulse φTRG is fixed to low, the transfer transistor TRG is turned off, and variations in the photodiode PD can be removed.

At time t2, an internal offset of the comparator 275a and a difference between the VSL voltage and the reference waveform are charged in the input capacitor 272a, and the operating point of the comparator 275a is initialized.

At time t3, the short circuit pulse goes low, turning off the switches 273a and 274a. Thus, kTC noise and feedthrough variations occur in the switches 273a and 274a.

Times t4 to t5 are a first AD conversion period (ADC period 1). During this period, the DA converter 232 changes the reference waveform linearly with a predetermined slope. Then, the comparator 275a AD-converts the reference signal using the reference waveform. In this ADC period 1, an inversion delay of the comparator 275a, a delay of the reference waveform, and a clock delay of the counter occur. Note that a triangle in FIG. 11C indicates an inversion timing of the comparator 275a.

Subsequently, at time t6, the current control voltage generation unit 219 controls the current control voltage so as to increase the bias current.

Times t7 to t8 are a second AD conversion period (ADC period 2). Also during this period, the DA converter 232 changes the reference waveform linearly with a predetermined slope. Then, the comparator 275a AD-converts the reference signal using the reference waveform. Here, the digital value after conversion similarly includes the kTC noise and the feedthrough variations in the switches 273a and 274a generated at time t4, the inversion delay of the comparator 275a generated in the ADC period 1, the delay of the reference waveform, and the clock delay of the counter. Note that a triangle in FIG. 11C indicates an inversion timing of the comparator 275a.

Accordingly, when the ADC period 2 ends, a difference process is performed between a count value of the counter 233 in the ADC period 1 and a count value of the counter 233 in the ADC period 2. By this difference process, it is possible to remove variations generated in the detection unit 218. Furthermore, it is possible to obtain data as to whether or not RTN has occurred by this difference process. By performing this data obtainment multiple times, an occurrence frequency of RTN for every amplification transistor AMP of the pixel can be evaluated. Therefore, in a case of having a voltage amplitude larger than the thermal noise that the amplifier circuit has or the voltage amplitude generated at 1/f, it is possible to have the address of the element that could detect it as element unique information. In this case, the RTN changes in time constant, that is, changes in detection probability on the basis of the energy difference as described above, and thus it is desirable to have an address table for every temperature.

Even when operating according to the timing chart illustrated in FIG. 11C, the high-level potential of the selection pulse φSEL may be about VDD (2.7 V), or may be an intermediate potential (about 1 V to 1.5 V). If the potential difference (VDS) between the drain and source of the selection transistor SEL is taken to cause a saturation operation, a source follower is formed.

As described above, the clip circuit 215 is also a source follower circuit, and element unique information can be obtained by an operation similar to that illustrated in FIG. 11A.

FIG. 11D is an explanatory diagram illustrating operations of the clip circuit 215, the reference signal generation unit 216, the current source 217, and the comparator 231 when generating unique information in a timing chart. Operations of respective elements provided on the output line VSL(n−1) or along the output line VSL(n−1) will be described below.

In the timing chart of FIG. 11D, no pixel is selected in all rows. That is, the row selection signal φSEL is fixed to low. The states of other pulses for driving pixels are arbitrary. One horizontal readout period starts at time t1. At this point, a clip selection pulse φCLPSEL goes high, and the clip circuit 215 is selected. Furthermore, the short circuit pulse goes high, and the switches 273a and 274a are connected. Since the switch 252a for disconnecting the current source 217 is on and the switch 251a for averaging the VSL voltage is off, a source follower operation is performed, and variation information of every source follower of the clip circuit 215 (variations in output of the transistor CLPAMP) is output to the output line VSL.

At time t2, the clip selection pulse φCLPSEL and the current source disconnection pulse are simultaneously set to low. Thus, the VSL voltage is held in the parasitic capacitance 253a. Since the VSL voltage is averaged here, the VSL voltage of each column is averaged. This averaged VSL voltage becomes the reference signal.

At time t3, an internal offset of the comparator 275a and a difference between the VSL voltage and the reference waveform are charged in the input capacitor 272a, and the operating point of the comparator 275a is initialized.

At time t4, the short circuit pulse goes low, turning off the switches 273a and 274a. This completes initialization of the operating point of the comparator 275a. Furthermore, since the switches 273a and 274a are turned off, kTC noise and feedthrough variations occur in the switches 273a and 274a.

Times t5 to t6 are a first AD conversion period (ADC period 1). During this period, the DA converter 232 changes the reference waveform linearly with a predetermined slope. Then, the comparator 275a AD-converts the reference signal using the reference waveform. The DA converter 232 may have a function to shift the reference waveform. That is, the DA converter 232 may have a function to shift a clamp level.

The DA converter 232 can add an offset to an output of the counter 233 by shifting the reference waveform. In this ADC period 1, an inversion delay of the comparator 275a, a delay of the reference waveform, and a clock delay of the counter occur. Note that a triangle in FIG. 11D indicates an inversion timing of the comparator 275a.

At time t6, the clip selection pulse φCLPSEL goes high, and the clip circuit 215 is selected. At this point, the switch 252a for disconnecting the current source 217 is on and the switch 251a for averaging the VSL voltage is off, a source follower operation is performed, and variation information for every source follower of the clip circuit 215 (variations in output of the transistor CLPAMP) is output to the output line VSL.

Times t7 to t8 are a second AD conversion period (ADC period 2). Also during this period, the DA converter 232 changes the reference waveform linearly with a predetermined slope. Then, the comparator 275a AD-converts the reference signal using the reference waveform. Here, the digital value after conversion similarly includes the kTC noise and the feedthrough variations in the switches 273a and 274a generated at time t4, the inversion delay of the comparator 275a generated in the ADC period 1, the delay of the reference waveform, and the clock delay of the counter. Note that a triangle in FIG. 11D indicates an inversion timing of the comparator 275a.

Accordingly, when the ADC period 2 ends, a difference process is performed between a count value of the counter 233 in the ADC period 1 and a count value of the counter 233 in the ADC period 2. By this difference process, it is possible to remove variations generated in the detection unit 218. Therefore, it is possible to prevent the element unique information from including the variations generated in the detection unit 218.

Furthermore, since the output of the counter 233 is offset in the ADC period 1, even if the above difference process is performed, variations due to the unique information generation unit 214 will not be lost. The variations due to the unique information generation unit 214 are normally distributed with the reference signal as the center. Therefore, if there is no offset, a negative value occurs in the variations due to the unique information generation unit 214, and all values less than or equal to 0 become 0.

In a case of operating according to the timing chart illustrated in FIG. 11D, if the transistor CLPSEL is saturated instead of the transistor CLPAMP, a source follower circuit is formed. A high-level potential of the pulse that selects the transistor CLPSEL may be approximately VDD (2.7 V), or may be an intermediate potential (approximately 1 V to 1.5 V). If a potential difference (VDS) between the drain and source of the transistor CLPSEL is taken to cause a saturation operation, a source follower is formed. For example, assuming that the drain voltage of the transistor CLPSEL is 2.7 V, the drain side of the transistor CLPSEL (source side of the transistor CLPAMP) is usually about 2.2 V. On the other hand, if VDS of the transistor CLPSEL is sufficiently taken (if there is a difference of at least about several hundred to 700 mV), it is possible to cause a saturated operation. Consequently, an output according to a gate voltage of the transistor CLPSEL is transmitted to the output line VSL. Similarly to the transistor CLPAMP, when the transistor CLPSEL operates in saturation, the threshold value and the overdrive voltage vary from element to element, and thus variations in the threshold value of the transistor CLPSEL and the overdrive voltage can be detected.

The current control voltage generation unit 219 can change the overdrive voltage of the transistor CLPAMP by driving the current control voltage with different voltages in the ADC period 1 and the ADC period 2. The change amount of the overdrive voltage at this time varies, and thus the change amount of the overdrive voltage can be detected as element unique information.

Figure 11E:
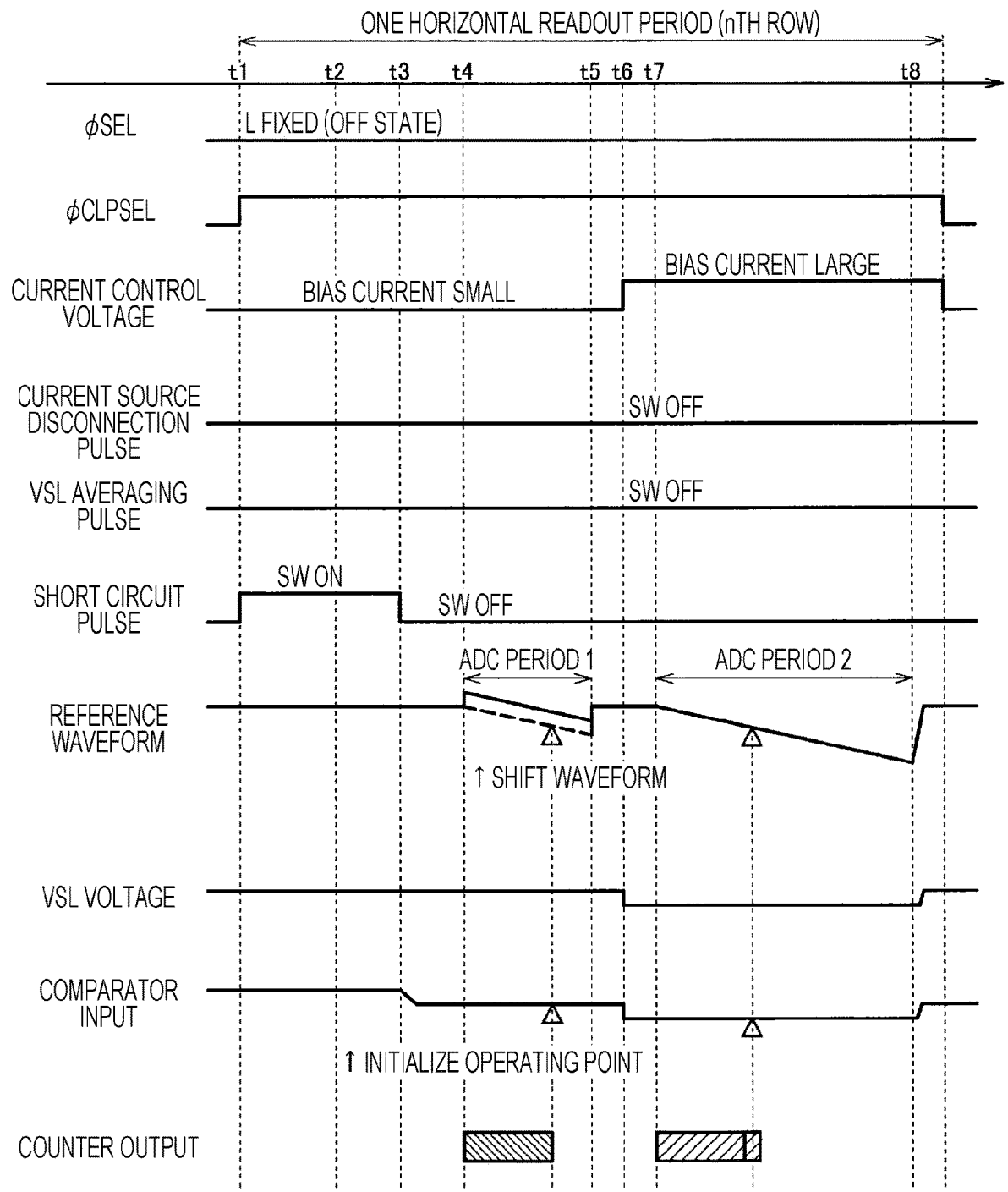
FIG. 11E is an explanatory diagram illustrating operations when generating unique information according to the same embodiment in a timing chart.

FIG. 11E is an explanatory diagram illustrating operations of the clip circuit 215, the reference signal generation unit 216, the current source 217, and the comparator 231 when generating unique information in a timing chart. Operations of respective elements provided on the output line VSL(n−1) or along the output line VSL(n−1) will be described below. It differs from the timing chart of FIG. 11D in that the current source disconnection pulse and the VSL averaging pulse are always at low level.

In the timing chart of FIG. 11E, no pixel is selected in all rows. That is, the row selection signal φSEL is fixed to low. The states of other pulses for driving pixels are arbitrary. One horizontal readout period starts at time t1. At this point, the clip selection pulse φCLPSEL goes high, and the clip circuit 215 is selected. Furthermore, the short circuit pulse goes high, and the switches 273a and 274a are connected.

At time t2, an internal offset of the comparator 275a and a difference between the VSL voltage and the reference waveform are charged in the input capacitor 272a, and the operating point of the comparator 275a is initialized.

At time t3, the short circuit pulse goes low, turning off the switches 273a and 274a. This completes initialization of the operating point of the comparator 275a. Furthermore, since the switches 273a and 274a are turned off, kTC noise and feedthrough variations occur in the switches 273a and 274a.

Times t4 to t5 are a first AD conversion period (ADC period 1). During this period, the DA converter 232 changes the reference waveform linearly with a predetermined slope. Then, the comparator 275a AD-converts the reference signal using the reference waveform. In this ADC period 1, an inversion delay of the comparator 275a, a delay of the reference waveform, and a clock delay of the counter occur. Note that a triangle in FIG. 11E indicates an inversion timing of the comparator 275a.

Subsequently, at time t6, the current control voltage generation unit 219 controls the current control voltage so as to increase the bias current.

Times t7 to t8 are a second AD conversion period (ADC period 2). Also during this period, the DA converter 232 changes the reference waveform linearly with a predetermined slope. Then, the comparator 275a AD-converts the reference signal using the reference waveform. Here, the digital value after conversion similarly includes the kTC noise and the feedthrough variations in the switches 273a and 274a generated at time t4, the inversion delay of the comparator 275a generated in the ADC period 1, the delay of the reference waveform, and the clock delay of the counter. Note that a triangle in FIG. 11E indicates an inversion timing of the comparator 275a.

Accordingly, when the ADC period 2 ends, a difference process is performed between a count value of the counter 233 in the ADC period 1 and a count value of the counter 233 in the ADC period 2. By this difference process, it is possible to remove variations generated in the detection unit 218. Only bias current values are different between the ADC period 1 and the ADC period 2, and thus threshold value information is canceled and it is possible to extract the component of the overdrive voltage. Here, gain coefficient β of the transistor is $(W/L) \times \mu \times C_{ox}$. W is a gate width, L is a gate length, μ is electron mobility, and $C_{ox}$ is an oxide film capacity per unit area. Furthermore, the mutual inductance gm is approximately $2^{1/2} \times \beta \times Id$. Therefore, the overdrive voltage is $2 \times Id/gm=(2 \times Id/\beta)^{1/2}$. $\beta$ has element-specific variations, and thus an output according to the bias current and element variations can be obtained. The mobility $\mu$ is included in $\beta$, and the mobility $\mu$ includes temperature characteristics. Therefore, as will be described later, by adjusting the bias current and the slope and shift amount of the reference waveform according to the temperature, it is possible to mitigate characteristic changes due to temperature and perform AD conversion in an appropriate range. Lattice scattering is dominant at operating temperatures of the solid-state imaging device 1, and thus a temperature characteristic of the mobility depends on an absolute temperature $T^{-3/2}$.

In a case of operating according to the timing chart illustrated in FIG. 11E, if the transistor CLPSEL is saturated instead of the transistor CLPAMP, a source follower circuit is formed. The high-level potential of the pulse that selects the transistor CLPSEL may be approximately VDD (2.7 V), or may be an intermediate potential (approximately 1 V to 1.5 V).

The transistor CLPAMP can also detect RTN as described above. When detecting RTN by the transistor CLPAMP, the clipping voltage is set to an intermediate potential (for example, about 1.5 V to VDD).

Figure 11F:
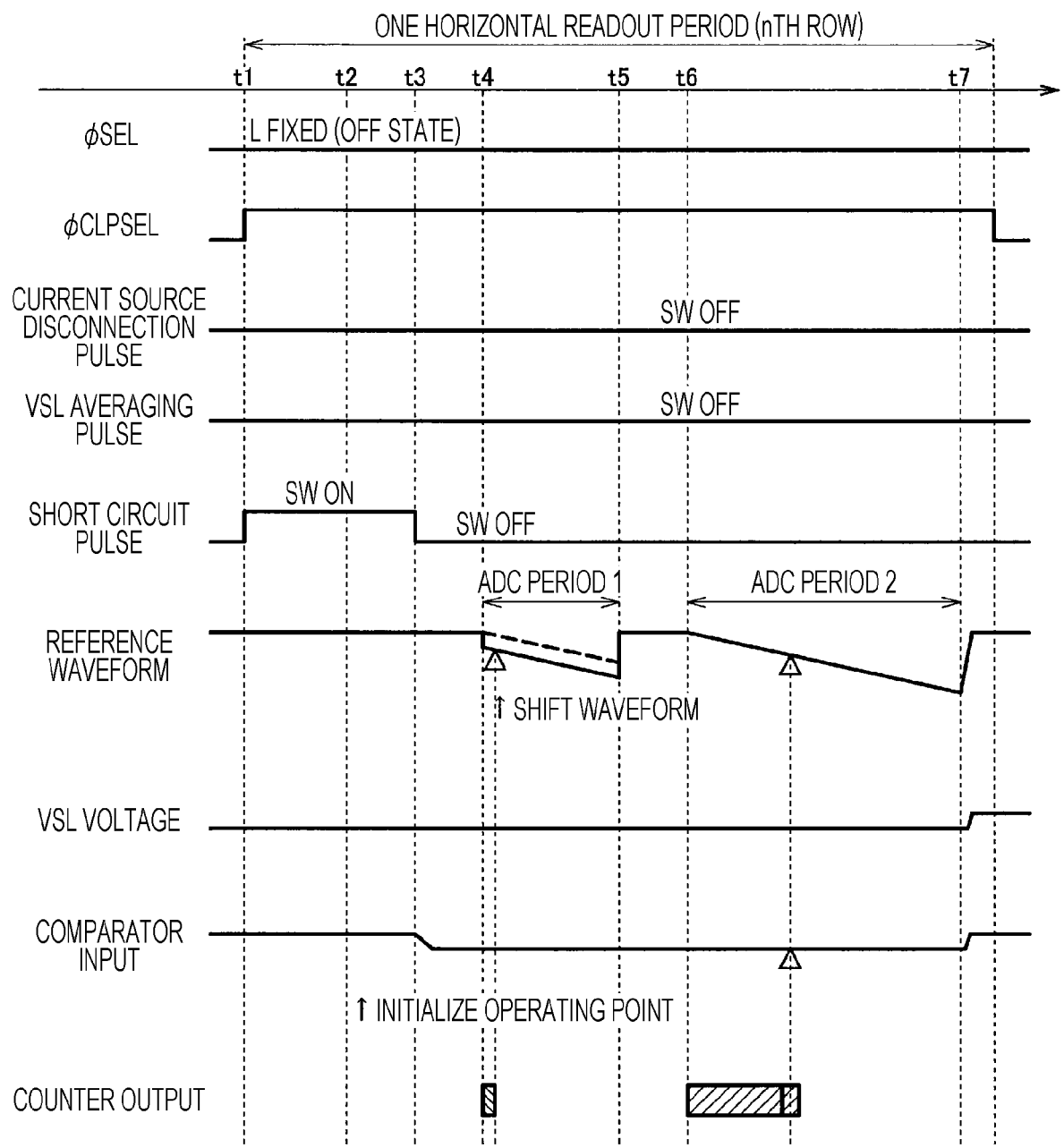
FIG. 11F is an explanatory diagram illustrating operations when generating unique information according to the same embodiment in a timing chart.

FIG. 11F is an explanatory diagram illustrating operations of the clip circuit 215, the reference signal generation unit 216, the current source 217, and the comparator 231 when generating unique information in a timing chart. Operations of respective elements provided on the output line VSL(n-1) or along the output line VSL(n-1) will be described below.

In the timing chart of FIG. 11F, no pixel is selected in all rows. That is, the row selection signal φSEL is fixed to low. The states of other pulses for driving pixels are arbitrary. One horizontal readout period starts at time t1. At this point, the clip selection pulse φCLPSEL goes high, and the clip circuit 215 is selected. Furthermore, the short circuit pulse goes high, and the switches 273*a* and 274*a* are connected.

At time t2, an internal offset of the comparator 275*a* and a difference between the VSL voltage and the reference waveform are charged in the input capacitor 272*a*, and the operating point of the comparator 275*a* is initialized.

At time t3, the short circuit pulse goes low, turning off the switches 273*a* and 274*a*. This completes initialization of the operating point of the comparator 275*a*. Furthermore, since the switches 273*a* and 274*a* are turned off, kTC noise and feedthrough variations occur in the switches 273*a* and 274*a*.

Times t4 to t5 are a first AD conversion period (ADC period 1). During this period, the DA converter 232 changes the reference waveform linearly with a predetermined slope. Then, the comparator 275*a* AD-converts the reference signal using the reference waveform. In this ADC period 1, an inversion delay of the comparator 275*a*, a delay of the reference waveform, and a clock delay of the counter occur. Note that a triangle in FIG. 11F indicates an inversion timing of the comparator 275*a*.

Times t6 to t7 are a second AD conversion period (ADC period 2). Also during this period, the DA converter 232 changes the reference waveform linearly with a predetermined slope. Then, the comparator 275*a* AD-converts the reference signal using the reference waveform. Here, the digital value after conversion similarly includes the kTC noise and the feedthrough variations in the switches 273*a* and 274*a* generated at time t4, the inversion delay of the comparator 275*a* generated in the ADC period 1, the delay of the reference waveform, and the clock delay of the counter. Note that a triangle in FIG. 11F indicates an inversion timing of the comparator 275*a*.

Accordingly, when the ADC period 2 ends, a difference process is performed between a count value of the counter 233 in the ADC period 1 and a count value of the counter 233 in the ADC period 2. By this difference process, it is possible to remove variations generated in the detection unit 218. Furthermore, it is possible to obtain data as to whether or not RTN has occurred by this difference process. By performing this data obtainment multiple times, an occurrence frequency of RTN for every transistor CLPAMP can be evaluated. Therefore, in a case of having a voltage amplitude larger than the thermal noise that the amplifier circuit has or the voltage amplitude generated at 1/f, it is possible to have the address of the element that could detect it as element unique information. In this case, the RTN changes in time constant, that is, changes in detection probability on the basis of the energy difference as described above, and thus it is desirable to have an address table for every temperature.

In a case of operating according to the timing chart illustrated in FIG. 11F, if the transistor CLPSEL is saturated instead of the transistor CLPAMP, a source follower circuit is formed. The high-level potential of the pulse that selects the transistor CLPSEL may be approximately VDD (2.7 V), or may be an intermediate potential (approximately 1 V to 1.5 V).

The solid-state imaging device 1 can also use feedthrough variations in the comparator 275*a* as element unique information.

Figure 11G:
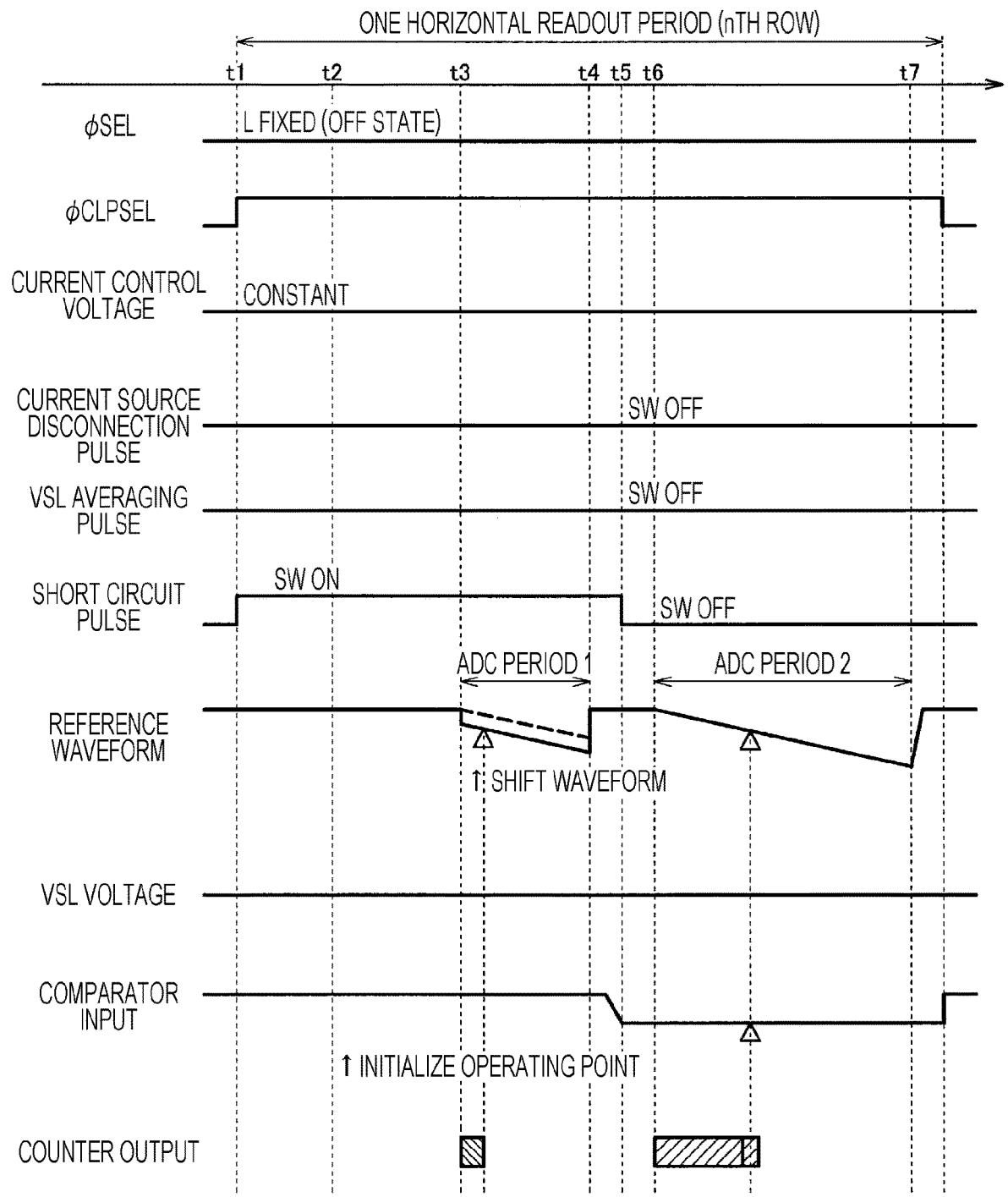
FIG. 11G is an explanatory diagram illustrating operations when generating unique information according to the same embodiment in a timing chart.

FIG. 11G is an explanatory diagram illustrating operations of the clip circuit 215, the reference signal generation unit 216, the current source 217, and the comparator 231 when generating unique information in a timing chart. Operations of respective elements provided on the output line VSL(n-1) or along the output line VSL(n-1) will be described below.

In the timing chart of FIG. 11G, no pixel is selected in all rows. That is, the row selection signal φSEL is fixed to low. The states of other pulses for driving pixels are arbitrary. One horizontal readout period starts at time t1. At this point, the clip selection pulse φCLPSEL goes high, and the clip circuit 215 is selected. Furthermore, the short circuit pulse goes high, and the switches 273*a* and 274*a* are connected.

At time t2, an internal offset of the comparator 275*a* and a difference between the VSL voltage and the reference waveform are charged in the input capacitor 272*a*, and the operating point of the comparator 275*a* is initialized.

Times t3 to t4 are a first AD conversion period (ADC period 1). During this period, the DA converter 232 changes the reference waveform linearly with a predetermined slope. Then, the comparator 275*a* AD-converts the reference signal using the reference waveform. In this ADC period 1, an inversion delay of the comparator 275*a*, a delay of the reference waveform, and a clock delay of the counter occur. Note that a triangle in FIG. 11G indicates an inversion timing of the comparator 275*a*.

At time t5, the short circuit pulse goes low, turning off the switches 273*a* and 274*a*. This completes initialization of the operating point of the comparator 275*a*. Furthermore, since the switches 273*a* and 274*a* are turned off, kTC noise and feedthrough variations occur in the switches 273*a* and 274*a*.

Times t6 to t7 are a second AD conversion period (ADC period 2). Also during this period, the DA converter 232 changes the reference waveform linearly with a predetermined slope. Then, the comparator 275*a* AD-converts the reference signal using the reference waveform. Here, the digital value after conversion similarly includes the kTC noise and the feedthrough variations in the switches 273a and 274a generated at time t4, the inversion delay of the comparator 275a generated in the ADC period 1, the delay of the reference waveform, and the clock delay of the counter. Note that a triangle in FIG. 11G indicates an inversion timing of the comparator 275a.

Accordingly, when the ADC period 2 ends, a difference process is performed between a count value of the counter 233 in the ADC period 1 and a count value of the counter 233 in the ADC period 2. By this difference process, the kTC noise and the feedthrough variations in the switches 273a and 274a are detected.

By detecting the kTC noise and the feedthrough variations in the switches 273a and 274a a plurality of times and averaging them, the kTC noise is suppressed and the feedthrough variations (FPN component) can be extracted.

The solid-state imaging device 1 can also use feedthrough variations in the column ADC as element unique information.

Figure 11H:
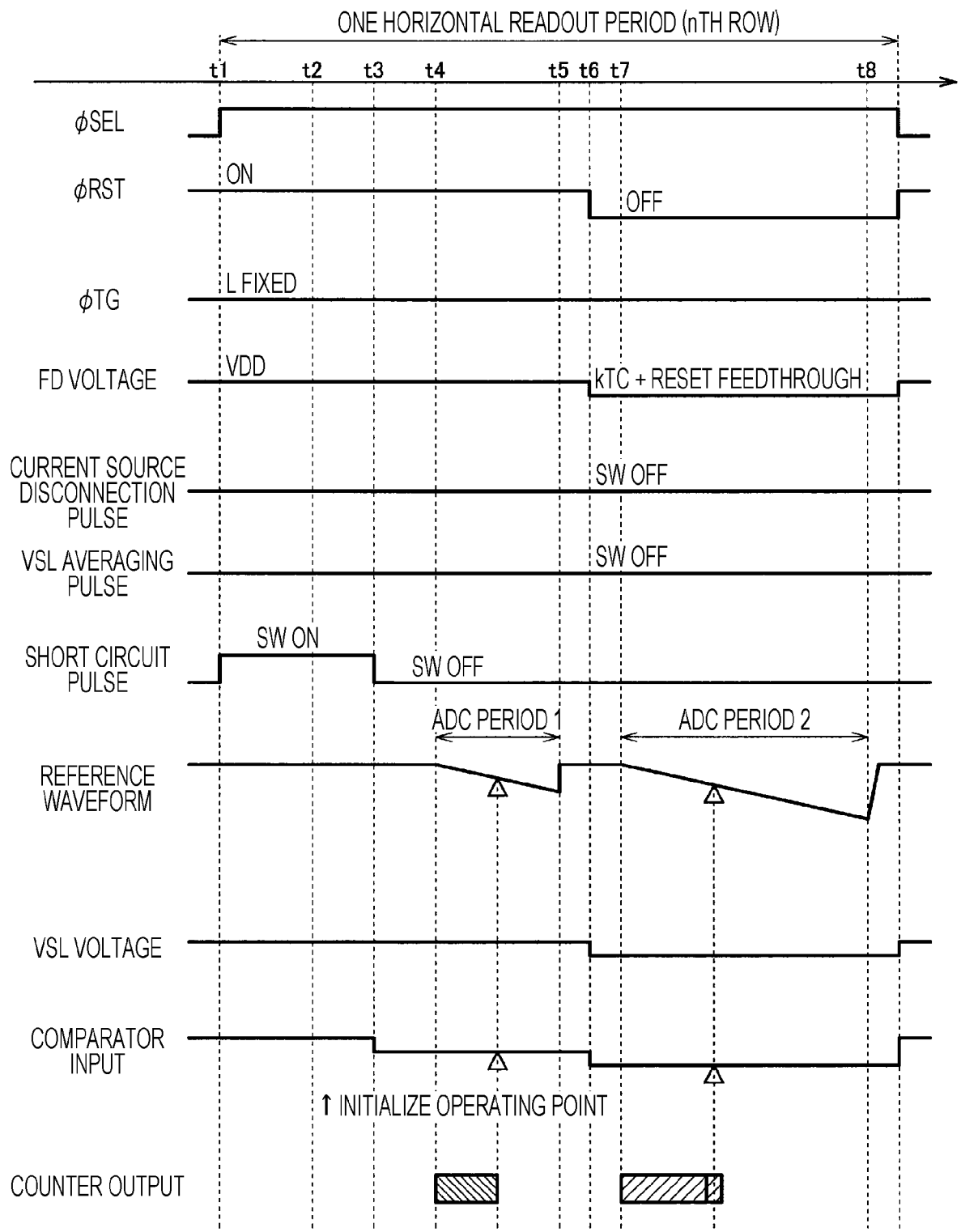
FIG. 11H is an explanatory diagram illustrating operations when generating unique information according to the same embodiment in a timing chart.

FIG. 11H is an explanatory diagram illustrating operations of the clip circuit 215, the reference signal generation unit 216, the current source 217, and the comparator 231 when generating unique information in a timing chart. Operations of respective elements provided on the output line VSL(n−1) or along the output line VSL(n−1) will be described below.

One horizontal readout period starts at time t1.

At this point, the row selection signal φSEL goes high and row selection starts. At this point, the reset transistor RST is in an on state, and thus the voltage of the floating diffusion part FD is fixed to VDD. Thus, variations in the floating diffusion part FD are removed. Furthermore, when generating the unique information, the transfer pulse φTRG is fixed to low. Since the transfer pulse φTRG is fixed to low, the transfer transistor TRG is turned off, and variations in the photodiode PD can be removed. Furthermore, the short circuit pulse goes high, and the switches 273a and 274a are connected.

At time t2, an internal offset of the comparator 275a and a difference between the VSL voltage and the reference waveform are charged in the input capacitor 272a, and the operating point of the comparator 275a is initialized.

At time t3, the short circuit pulse goes low, turning off the switches 273a and 274a. Thus, kTC noise and feedthrough variations occur in the switches 273a and 274a.

Times t4 to t5 are a first AD conversion period (ADC period 1). During this period, the DA converter 232 changes the reference waveform linearly with a predetermined slope. Then, the comparator 275a AD-converts the reference signal using the reference waveform. In this ADC period 1, an inversion delay of the comparator 275a, a delay of the reference waveform, and a clock delay of the counter occur. Note that a triangle in FIG. 11H indicates an inversion timing of the comparator 275a.

Since the reset transistor RST is in an on state at time t6, the kTC noise (temporal component) and the reset feedthrough noise (FPN component) are held in the voltage of the floating diffusion part FD.

Times t7 to t8 are a second AD conversion period (ADC period 2). Also during this period, the DA converter 232 changes the reference waveform linearly with a predetermined slope. Then, the comparator 275a AD-converts the reference signal using the reference waveform. Here, the digital value after conversion similarly includes the kTC noise and the feedthrough variations in the switches 273a and 274a generated at time t4, the inversion delay of the comparator 275a generated in the ADC period 1, the delay of the reference waveform, and the clock delay of the counter. Note that a triangle in FIG. 11H indicates an inversion timing of the comparator 275a.

Accordingly, when the ADC period 2 ends, a difference process is performed between a count value of the counter 233 in the ADC period 1 and a count value of the counter 233 in the ADC period 2. By this difference process, the variations generated in the detection unit 218 are removed, and the kTC noise and the reset feedthrough noise held in the floating diffusion part FD are detected. By detecting the kTC noise and the reset feedthrough noise a plurality of times and averaging them, the kTC noise is suppressed and the reset feedthrough variations (FPN component) can be extracted.

A defect in the photodiode PD can also be used as element unique information. The defect of the photodiode PD can be read out by normal driving. When the defect of the photodiode PD is read by normal driving, an optical signal and defect information of the floating diffusion part FD are also read at the same time. An FPN component and kTC noise when resetting the floating diffusion part FD, other than them, are removed by the CDS processing. The defect information of the floating diffusion part FD is excluded because it is driven so that the detection period is as short as possible and the defect is corrected. Since it is difficult to extract defect information of the photodiode PD when there is an optical signal, in a case where the defect of the photodiode PD is used as element unique information, it is desirable that a signal of the photodiode PD is accumulated in a light-shielded state. In a case where the defect of the photodiode PD is used as element unique information, the photodiode PD of a pixel (optical black pixel) that is shielded from light may be used.

Since a dark signal due to the defect of the photodiode PD has time dependency, it is desirable to set a shutter time as long as possible and accumulate the signal. Furthermore, the photodiode PD generally has a hole accumulated diode structure (HAD structure), and is formed and driven so as to be surrounded by holes. In driving, a negative bias is applied so that a channel of the transfer transistor is in an accumulated state (pinning state). In this manner, a dark signal due to a defect near the transfer transistor can be suppressed to be small.

In a case where the signal is very small or the number of defects is very small, it is only required to change the pinning state to a depletion state by setting the potential when the transfer transistor is off to an intermediate potential in the positive direction when the signal is accumulated. A dark output occurs due to a defect near the transfer transistor. In this manner, defect information near the photodiode PD and the transfer transistor can be detected, and for example, a pixel address of a desired threshold value level or higher treated as a defect can be treated as element unique information.

Since these pieces of defect information have temperature characteristics (activation energy is about 0.55 eV to 1.1 eV), in order to stabilize output, it is desirable to set an accumulation time and analog gain appropriately on the basis of temperature information, and have a temperature correction table for every defect and make correction.

The unique value calculation unit 220 calculates a value unique to the solid-state imaging device 1 (unique value) on the basis of the digital signal sent from the detection unit 218. The unique value calculation unit 220 generates a value having a predetermined bit length as the unique value. An example of a method of calculating the unique value of the solid-state imaging device 1 by the unique value calculation unit 220 will be described later in detail. After calculating the unique value of the solid-state imaging device 1, the unique value calculation unit 220 sends the unique value to the encryption unit 222. The unique value generated by the unique value calculation unit 220 can be a seed or a key itself used in the encryption processing in the encryption unit 222.

The unique value calculation unit 220 may select which element unique information is employed from among a plurality of pieces of element unique information. When selecting element unique information, the unique value calculation unit 220 may select which element unique information to employ by calculation based on element unique information, or select whether or not to employ element unique information by a random number. Furthermore, selection conditions for selecting element unique information may be stored in a non-volatile memory. Writing of the selection conditions to the non-volatile memory may be performed only once. The timing of writing to the non-volatile memory may be, for example, at a time of test, shipping, first use, or the like. The unique value calculation unit 220 can repeatedly calculate the unique value by using element unique information based on any manufacturing variations occurring in a chip of the solid-state imaging device 1, including element unique information having a relatively small amount of information. That is, the amount of element unique information can be increased.

Furthermore, the unique value calculation unit 220 may calculate the unique value by combining a plurality of pieces of element unique information among element unique information generated by the unique information generation unit 214. By calculating a unique value by combining a plurality of pieces of element unique information, it becomes difficult to analyze how the unique value is calculated.

Furthermore, the unique value generated by the unique value calculation unit 220 may be temporarily stored in a memory. By storing the unique value generated by the unique value calculation unit 220 in the memory, it becomes difficult to analyze calculation timing of the unique value. That is, the solid-state imaging device 1 may use a unique value generated in advance according to an encryption request, instead of generating the unique value at the timing of the encryption request. The solid-state imaging device 1 may calculate the unique value, for example, after a predetermined time has elapsed after driving during normal imaging. Furthermore, the solid-state imaging device 1 may generate the unique value at a timing of receiving a request for generating the unique value, not at a timing of the encryption request.

Furthermore, the unique value calculation unit 220 may average unique values obtained under the same driving conditions. Noise in the time direction can be suppressed by averaging the unique values obtained under the same driving conditions.

The encryption unit 222 uses the unique value generated by the unique value calculation unit 220 to execute data encryption processing. The encryption unit 222 can be provided in the logic circuit 23014 illustrated in FIG. 2, for example. Specifically, the encryption unit 222 performs data encryption processing using the unique value generated by the unique value calculation unit 220 as a seed or a key itself. The target of encryption may be the unique value itself, image information, a feature amount based on the image information, or the like. By performing the encryption processing using the unique value generated by the unique value calculation unit 220, the solid-state imaging device 1 can extremely securely encrypt data.

The communication control unit 224 transmits data to the outside of the solid-state imaging device 1. The communication control unit 224 may perform different processing between when imaging data is output and when data encrypted by the encryption unit 222 is output.

In the configuration of the solid-state imaging device 1 illustrated in FIG. 9, at least a path for processing unique information is formed so as not to appear on the surface of the solid-state imaging device 1. For example, the path for processing unique information is arranged so as to be covered with a metal of an upper layer including the outermost layer. The path for processing the unique information may be covered with a predetermined shield layer or may be covered with VDD or VSS wiring. The path for processing the unique information may include, for example, the unique information generation unit 214, the detection unit 218, the unique value calculation unit 220, and the encryption unit 222. Furthermore, the solid-state imaging device 1 is formed so that a pad for monitoring the unique information is not provided on the path for processing the unique information. By forming the solid-state imaging device 1 in this manner, not only leak of the unique information of the solid-state imaging device 1 used for the encryption processing to the outside is hindered, but also destruction of the solid-state imaging device 1 is inevitable when it is attempted to analyze the unique information. Consequently, analysis of the unique information is impossible. In addition, the solid-state imaging device 1 according to the present embodiment does not internally store the unique information but generates the unique information each time, and performs encryption processing using a unique value based on the generated unique information. Therefore, the solid-state imaging device 1 according to the present embodiment can perform extremely secure encryption processing.

Since the solid-state imaging device 1 according to the present embodiment does not internally store unique information, it is impossible to decrypt encrypted data if the unique value generated on the basis of the unique information changes each time it is generated. Therefore, the unique value is required to be the same regardless of when it is calculated. Therefore, the solid-state imaging device 1 according to the present embodiment may be provided with a function to correct the unique value calculated by the unique value calculation unit 220 on the basis of a signal output by the unique information generation unit 214 according to the temperature of the chip provided with the unique information generation unit 214. Furthermore, the solid-state imaging device 1 according to the present embodiment may be provided with a function to detect the temperature of the chip provided with the unique information generation unit 214.

Figure 12:
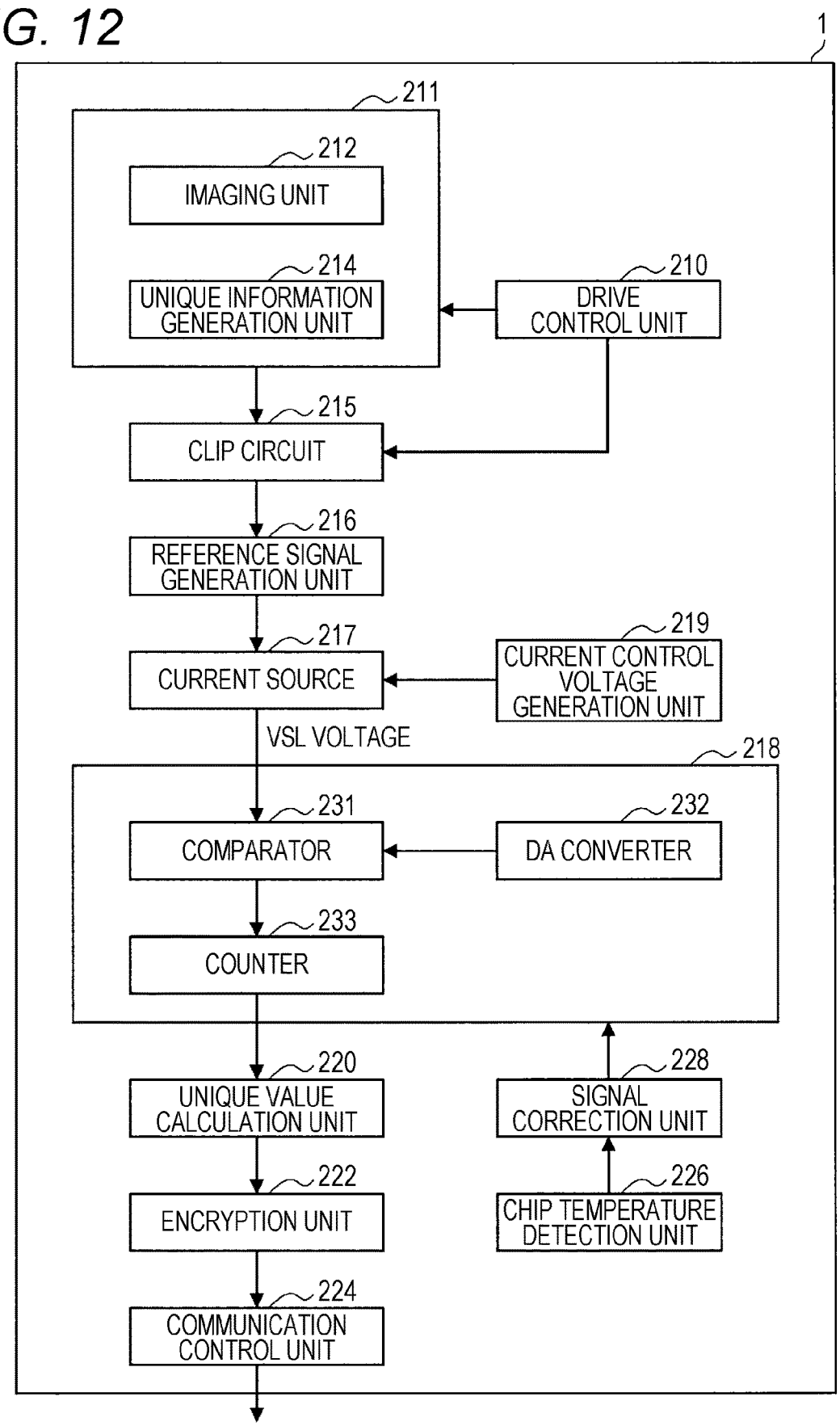
FIG. 12 is an explanatory diagram illustrating a functional configuration example of the solid-state image sensor according to the same embodiment.

FIG. 12 is an explanatory diagram illustrating another functional configuration example of the solid-state imaging device 1 according to the present embodiment. FIG. 12 illustrates a configuration in which a chip temperature detection unit 226 and a signal correction unit 228 are provided in addition to the configuration of the solid-state imaging device 1 illustrated in FIG. 9.

The chip temperature detection unit 226 detects the temperature of a chip provided with the unique information generation unit 214. The chip temperature detection unit 226 sends information of the detected chip temperature to the signal correction unit 228. The signal correction unit 228 corrects the unique value calculated by the unique value calculation unit 220 on the basis of the temperature of the chip provided with the unique information generation unit 214 that is detected by the chip temperature detection unit 226. The signal correction unit 228 may hold a table in which correction values according to temperatures are stored and determine a correction value on the basis of the temperature detected by the chip temperature detection unit 226.

3.2. Operation Example

Figure 13:
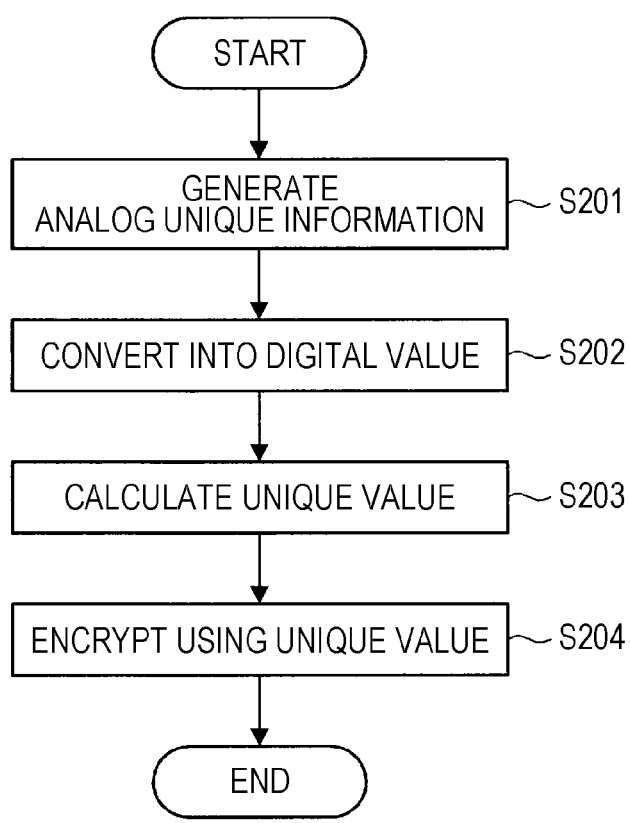
FIG. 13 is a flowchart illustrating an operation example of the solid-state image sensor according to the same embodiment.

Next, an operation example of the solid-state imaging device according to the present embodiment will be described. FIG. 13 is a flowchart illustrating an operation example of the solid-state imaging device according to the present embodiment. FIG. 13 illustrates an operation example when the solid-state imaging device 1 calculates a unique value and performs encryption processing using the unique value.

The solid-state imaging device 1 first generates analog unique information that is a basis of the unique value (step S201). The analog unique information is generated by the drive control unit 210 driving the unique information generation unit 214.

After generating the analog unique information, the solid-state imaging device 1 subsequently converts the analog unique information into a digital value (step S202). Conversion of the analog unique information into a digital value is performed by the detection unit 218. The conversion process of the analog unique information into the digital value by the detection unit 218 is as described above.

After converting the analog unique information into a digital value, the solid-state imaging device 1 subsequently calculates the unique value of the solid-state imaging device 1 using the digital value after conversion (step S203). Calculation of the unique value of the solid-state imaging device 1 is performed by the unique value calculation unit 220.

When the unique value of the solid-state imaging device 1 is calculated, the solid-state imaging device 1 subsequently performs encryption processing of data using the unique value (step S204). The encryption processing of data using the unique value is performed by the encryption unit 222.

By executing the series of operations described above, the solid-state imaging device 1 according to the present embodiment can internally complete encryption processing using unique information without outputting the unique information to the outside. The solid-state imaging device 1 according to the present embodiment can quite safely encrypt and output important information by performing encryption processing using the unique information that is not to be leaked to the outside.

4. SECOND EMBODIMENT

Next, as a second embodiment of the present disclosure, an example of technology will be described that is related to generation of a unique value unique to the solid-state imaging device 1 that is difficult to copy (that is, a PUF value) using physical characteristics (that is, hardware characteristics) of the solid-state imaging device 1 described above.

4.1. Basic Idea

First, characteristics required for PUF will be described, and then a basic idea of the technology related to generation of the PUF value according to the present embodiment will be outlined.

As described above, the PUF is a function that outputs a value unique to the device by using physical characteristics that are difficult to copy. In a case where it is assumed that a value unique to the device generated using such a PUF (that is, a PUF value) is used as, for example, an identifier for identifying an individual device or key information for encryption processing and the like, reproducibility and individual difference are obtained as characteristics of the PUF value.

Here, the reproducibility represents a characteristic that the same output can be obtained for a given input every time even if conditions such as changes in various states such as temperature and voltage and deterioration over time of the device itself change when generating and recalculating the PUF value. That is, ideally, it is desirable that the same output can be perfectly reproduced for a given input every time even if a change in conditions as described above occurs. On the other hand, it is also possible to apply a technique such as an error correction code when generating and recalculating the PUF value. In this case, reproducibility of the output does not necessarily have to be perfect as long as variations in the output obtained every time are within a range that can be corrected by the error correction code or the like.

Furthermore, as the individual difference, it is desirable that a sufficient difference occurs in the PUF values among a plurality of devices so that individual devices can be distinguished by the PUF values generated in every device. In the present embodiment, it is desirable to secure entropy of, for example, 128 bits as an individual difference.

On the assumption as above, in the present embodiment, the amplification transistor Tr13 is targeted among the transistors forming each pixel 2 of the solid-state imaging device 1, and variations in threshold voltage Vth of the amplification transistor Tr13 are used for generation of the PUF value. More specifically, for the threshold voltage of a transistor, there are many elements that give variations in every device in the manufacturing process, such as the thickness of a gate oxide film, the size of a transistor, and ion implantation. Therefore, it is possible to satisfy the above-mentioned required characteristic of individual difference. Furthermore, since the amplification transistor Tr13 is located in a relatively later stage among the respective transistors that constitute the pixel 2, it tends to be less susceptible to the influence of multiple factors. From such a characteristic, it is possible to also satisfy the above-mentioned required characteristic of reproducibility. Furthermore, the variations in the threshold voltage Vth can be obtained as, for example, an output result of a pixel signal (in other words, a pixel value) from the pixel 2 in the process of what is called compensation of the threshold voltage Vth.

Furthermore, in the present embodiment, the PUF value may be generated by using characteristics of the pixel 2 that operates more stably among the respective pixels 2 of the solid-state imaging device 1. As a specific example, the characteristics of the pixels 2 included in at least a part of what is called optical black (OPB) region of a pixel region 3 (in other words, an imaging surface) may be used for generating the PUF value.

Figure 14:
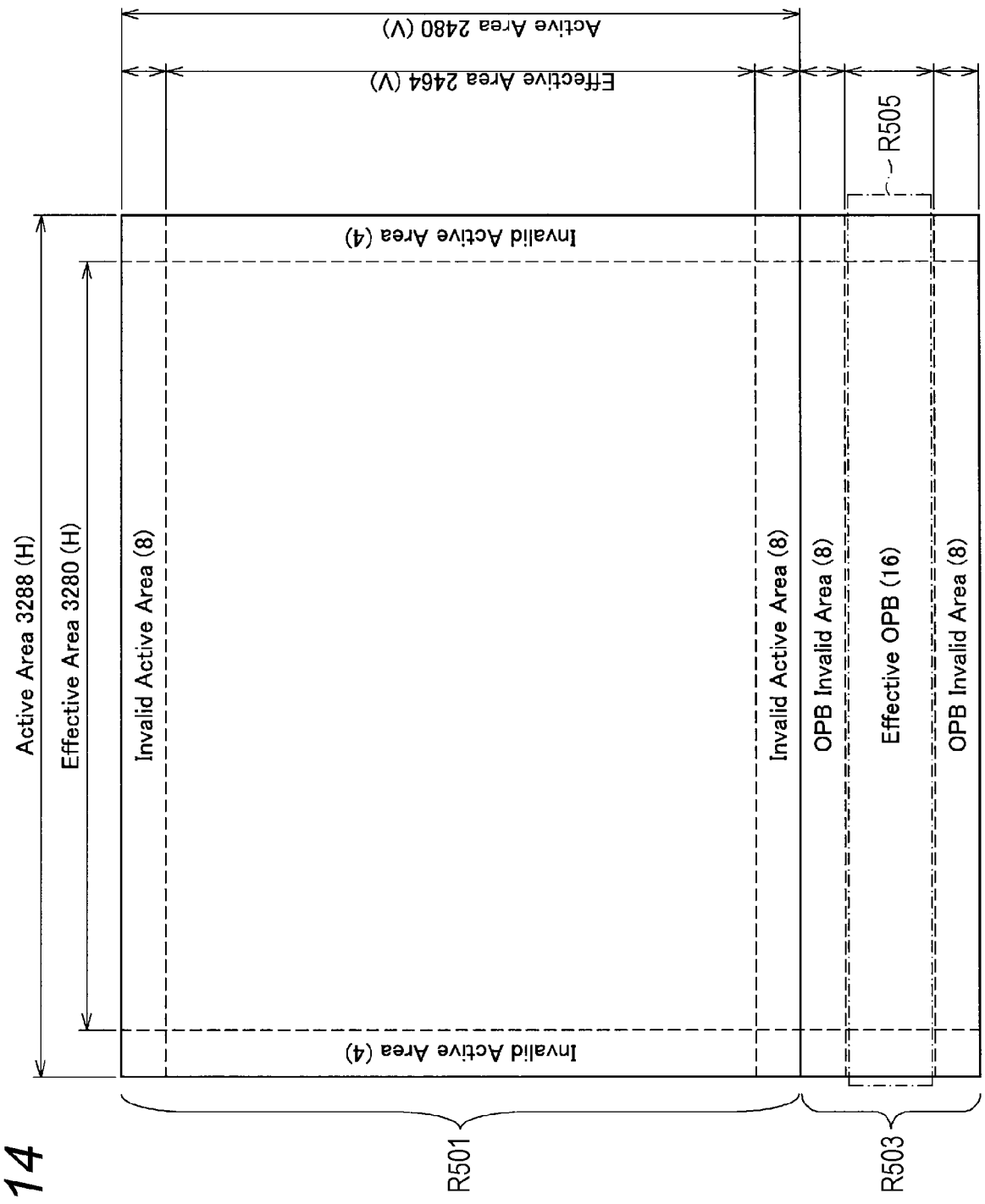
FIG. 14 is an explanatory diagram for describing an example of a technique related to generation of a PUF value according to a second embodiment of the present disclosure.

For example, FIG. 14 is an explanatory diagram for describing an example of the technique related to generation of the PUF value according to the present embodiment, and illustrates an example of a configuration of the pixel region 3 of the solid-state imaging device 1. As illustrated in FIG. 14, the pixel region 3 of the solid-state imaging device 1 according to the present embodiment includes, for example, an effective pixel region R501 and an OPB region R503.

The effective pixel region R501 corresponds to a region where a subject image is formed via an optical system such as a lens within the pixel region 3 of the solid-state imaging device 1. That is, an image signal based on a pixel signal (in other words, a pixel value) read from the pixel 2 included in the effective pixel region R501 within the pixel region 3 of the solid-state imaging device 1 is output as an image capturing result.

The OPB region R503 is a region provided near the effective pixel region R501 and shielded from light by a metal or the like. The pixel 2 included in the OPB region R503 is used, for example, to measure the level of a pixel signal that is a reference for correcting a black level. Specifically, by measuring the level of a pixel signal output from the pixel 2 included in the OPB region R503, it is possible to recognize the level (offset amount) of a signal including influence of a dark current and read noise in a state where no light is incident. Therefore, by subtracting the measured value (that is, the offset amount) of the level of a pixel signal output from the pixel 2 in the OBP region R503 from an image signal read from the pixel 2 in the effective pixel region R501, ideally, the black level can be corrected to 0.

As described above, the pixel 2 included in the OPB region R503 is hardly affected by light incident through an optical system such as a lens due to the characteristic that the pixel is shielded from light by a metal or the like. Due to such a characteristic, it is possible to obtain a relatively stable output as a light reception result from the pixel 2 included in the OPB region R503 as compared with the pixel 2 included in the effective pixel region R501. That is, use of the characteristics of the pixel 2 included in the OPB region R503 is, in comparison with the case of using characteristics of the pixel 2 included in the effective pixel region R501, also effective from the viewpoint of satisfying the requirement of reproducibility of the PUF value.

Furthermore, a pixel signal output from the pixel 2 included in the OPB region R503 is not output as a result of image capturing. Therefore, it is difficult to estimate the characteristics of the pixel 2 included in the OPB region R503 from an analysis result of an image obtained as an imaging result. That is, even if the characteristics of the pixel 2 included in the OPB region R503 are used for generating the PUF value, it is difficult to estimate the PUF value from the analysis result of the image obtained as the imaging result.

Furthermore, since the pixel 2 included in the OPB region R503 does not always need to be operated at all times, it is less likely to deteriorate than the pixels 2 included in the effective pixel region R501. Therefore, it is more effective from the viewpoint of reliability as a characteristic of the device used to generate the PUF value.

Furthermore, the OPB region R503 is a region already provided in the existing solid-state imaging device 1. Therefore, by using the characteristics of the pixel 2 included in the OPB region R503 for generating the PUF value, it is not necessary to provide a dedicated region or a dedicated device for generating the PUF value.

For example, in the example illustrated in FIG. 14, among the pixels 2 included in the OPB region R503, the characteristics of the pixel 2 included in the region indicated by reference sign R505 are used for generating the PUF value.

In the above, the characteristics required for the PUF have been described, and then the basic idea of the technique related to the generation of the PUF value according to the present embodiment has been outlined.

4.2. Method of Generating PUF Value

Next, an outline of a method of generating the PUF value in the solid-state imaging device 1 according to the present embodiment will be described.

Figure 15:
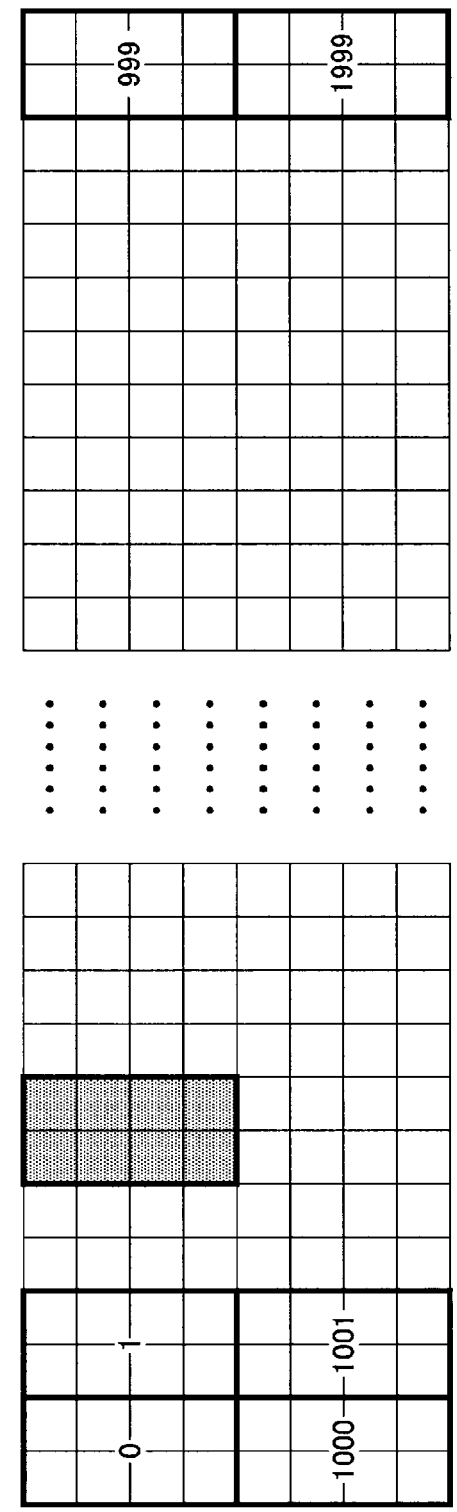
FIG. 15 is an explanatory diagram for describing an example of a technique related to generation of the PUF value according to the same embodiment.

In the solid-state imaging device 1 according to the present embodiment, pixels included in a predetermined region (for example, OPB region) are divided into a plurality of blocks each including one or more pixels. With such a configuration, in the solid-state imaging device 1 according to the present embodiment, one or more blocks specified according to a predetermined condition among the plurality of blocks are used for generating the PUF value. For example, FIG. 15 is an explanatory diagram for describing an example of a technique related to generation of the PUF value according to the present embodiment, and illustrating an example of the above blocks. Specifically, in the example illustrated in FIG. 15, 2000×8 pixels are divided into blocks each including 2×4 pixels, and in this case, the number of blocks is 2000.

Note that in a case where pixels included in a predetermined region are divided into a plurality of blocks, each block is only required to be defined so that a plurality of pixels sharing a predetermined circuit such as what is called an AMP circuit and the like are included in a common block. With such a configuration, the pixels included in each block exhibit the same tendency in variations due to the circuit shared among the pixels among variations in output signals (that is, pixel values) from the pixels.

Furthermore, in the solid-state imaging device 1 according to the present embodiment, a pixel value corresponding to the block is calculated on the basis of a pixel value of each of one or more pixels included in each block. As a specific example, the sum of a pixel value or values of one or more respective pixels included in each block may be set as the pixel value corresponding to the block. For example, in the example illustrated in FIG. 15, in a case where the pixel value of each pixel is indicated by 10 bits, since one block includes 2×4 pixels, the pixel value corresponding to the block calculated for every block can be expressed as a 13-bit value. Note that, hereinafter, the pixel value corresponding to the block calculated for every block is also simply referred to as a "pixel value of every block". Furthermore, the pixel value of each pixel corresponds to a "first pixel value", and the pixel value of every block corresponds to a "second pixel value". Note that in a case where each block is defined to include one pixel, the pixel value of every block corresponds to the pixel value of every pixel.

On the basis of the configuration as above, in the solid-state imaging device 1 according to the present embodiment, among the plurality of blocks defined as described above, a block in which the pixel value of every block is not included in a predetermined range that includes an average of the pixel value among the plurality of blocks is used for generating the PUF value. For example, FIG. 16 is an explanatory diagram for describing an example of a technique related to generation of the PUF value according to the present embodiment, and illustrates an example of a pixel value distribution of every block among a plurality of blocks. Furthermore, in FIG. 16, reference sign D510 indicates an average value of pixel values of every block among the plurality of blocks.

As illustrated in FIG. 16, the pixel value distribution of every block tends to indicate what is called a normal distribution on the basis of the average D510 of the pixel values among a plurality of blocks. With such a configuration, in the solid-state imaging device 1 according to the present embodiment, "1" is set for a block indicating a pixel value larger than the average D510 as a value for generating the PUF value, and "0" is set for a block indicating a pixel value smaller than the average D510.

On the other hand, the pixel value of every block may change every time (for example, for every frame) due to the influence of random noise or the like. Accordingly, for example, for a block in which the pixel value indicates a value close to the average value D510, for every frame, there is a case of indicating a value larger than the average D510 (that is, a case where "1" is set as the value for generating the PUF value), and there is a case of indicating a value smaller than the average D510 (that is, a care where "0" is set as the value for generating the PUF value). In view of such characteristics, in the solid-state imaging device 1 according to the present embodiment, a block in which the pixel value of every block is included in the predetermined range R511 that includes the average value D510 is excluded from the target of use for PUF value generation. In other words, a block in which the pixel value of every block is not included in the range R511, that is, a block in which the pixel value is included in any of the ranges R513 and R515 is specified as a target of use for PUF value generation. That is, as a value for generating the PUF value, "0" is set to the block in which the pixel value is included in the range R513, and "1" is set to the block in which the pixel value is included in the range R515.

Note that the range R511 illustrated in FIG. 16 may be set, for example, according to a standard deviation σ of the pixel value of every block among the plurality of blocks. In this case, a block in which the absolute value of the difference between the pixel value of every block and the average D510 of the pixel values among the blocks (that is, distance between the pixel value of every block and the average D510) is equal to or greater than a predetermined threshold is specified as a target of use for PUF value generation.

Here, in a case where the standard deviation of the pixel value of each pixel in the block is σ', the standard deviation σ' can be, for example, about ½₀ of the standard deviation σ of the pixel value of every block between blocks. At that time, the threshold of the distance between the pixel value of every block and the average D510 may be set to, for example, around 0.3σ. In this case, in the block in which the distance between the pixel value of every block and the average D510 exceeds the threshold, in order for the value set according to the pixel value to change between "0" and "1", it is necessary that variations in the pixel value exceed 6σ'.

From such characteristics, in the solid-state imaging device 1 according to the present embodiment, a block in which the pixel value indicates a value close to the average value D510 is excluded from the target of use for PUF value generation, and a block in which the distance between the pixel value and the average value D510 is equal to or greater than the threshold is the target of use for PUF value generation.

Note that the narrower the range R511 illustrated in FIG. 16 is set, the larger the number of blocks that can be candidates for the target of use for PUF value generation becomes, and meanwhile the higher the probability of an error to occur in the generated PUF value increases tends to become. On the other hand, the wider the range R511 is set, the smaller the number of blocks that can be candidates for the target of use for PUF value generation becomes, and meanwhile the lower the probability of an error to occur in the generated PUF value can be suppressed lower. Therefore, for example, the range R511 to be excluded from the target of use for PUF value generation may be set according to an error rate allowed for the generated PUF value.

Note that the information itself of the block specified as the target of use for PUF value generation is not information to be protected (information having confidentiality) such as what is called secret information and thus, for example, is only required to be stored in a predetermined storage area in the solid-state imaging device 1 (for example, a non-volatile storage area).

Next, with reference to FIGS. 16 to 18, an example of a method of calculating a value unique to the solid-state imaging device 1 (that is, a PUF value) according to a pixel value of every block will be described. For example, FIGS. 17 and 18 are explanatory diagrams for describing an example of a method of generating the PUF value according to the present embodiment.

In FIG. 17, reference sign D511 schematically indicates a plurality of blocks in which pixels included in a predetermined region are divided, as described with reference to FIG. 15. Furthermore, the numerical value presented in each block denoted by reference sign D511 indicates whether or not a pixel value corresponding to the block is included in a predetermined range including an average of pixel values (that is, the range R511 illustrated in FIG. 16).

That is, the solid-state imaging device 1 according to the present embodiment sequentially determines, for each block from a predetermined start position, whether or not the pixel value of every block is included in the predetermined range R511 including the average of the pixel values, and associates a value of "0" or "1" with the block according to a determination result. For example, in the example indicated by reference sign D511 in FIG. 17, "0" is associated with a block whose pixel value is included in the range R511, and "1" is associated with a block whose pixel value is not included in the range R511 (that is, included in the range R513 or R515). As described above, the solid-state imaging device 1 sequentially executes the above determination until the number of blocks in which the pixel value of every block is not included in the range R511 (that is, the number of blocks associated with "1") is specified by a predetermined bit length or more. Then, the solid-state imaging device 1 stores the position of the block associated with "1" in the predetermined storage area. Note that the block associated with "1" is the target of use for PUF value generation.

Next, as illustrated in FIG. 17, the solid-state imaging device 1 compares the pixel value of a block in which the pixel value of every block is not included in the range R511 with the average D510 of pixel values among the blocks, thereby specifying a value (hereinafter, also referred to as a "bit value") for generating the PUF value corresponding to the block. Specifically, the solid-state imaging device 1 sets "0" as a bit value for a block having a pixel value of every block smaller than the average D510 among the target blocks, and sets "1" as a bit value for a block having the pixel value larger than the average D510. For example, in FIG. 17, reference sign D513 schematically indicates the bit value set for each of the blocks to be the target of use for PUF value generation.

As described above, the solid-state imaging device 1 secures bit values by a predetermined bit length or more and concatenates the bit values to generate the PUF value. Note that the solid-state imaging device 1 may use a part of the series of secured bit values when generating the PUF value to calculate an error correction code (ECC) for correcting an error in a separately recalculated PUF value, and store it in the predetermined storage area. In this case, a large number of blocks to be the target of use for PUF value generation may be specified so that the bit value used for calculating the error correction code is secured.

Furthermore, when using the PUF value, the solid-state imaging device 1 recalculates this PUF value on the basis of information stored in the predetermined storage area. That is, the solid-state imaging device 1 specifies a block to be the target of use for PUF value generation on the basis of the information stored in the storage area, and reads out a pixel value corresponding to this block (that is, a pixel value of every block). Then, the solid-state imaging device 1 is only required to compare the pixel value corresponding to the specified block with the average D510 of the pixel values among the blocks to thereby specify a bit value corresponding to this block, and concatenate specified bit values to regenerate the PUF value. Furthermore, at this time, in a case where the error correction code for correcting an error of the PUF value is stored in the predetermined storage area, the solid-state imaging device 1 is only required to execute an error correction of the PUF value generated again on the basis of this error correction code.

The PUF value generated (calculated) as described above can be used as, for example, an identifier for identifying the solid-state imaging device 1 or key information for encrypting predetermined information generated in the solid-state imaging device 1.

Note that as the pixel value of every block used to generate the PUF value, an average of pixel values of every block during a plurality of times of imaging may be used. With such a configuration, it is possible to reduce the influence of variations in pixel value of every block due to random noise and the like (in other words, it is possible to reduce the error rate of the pixel value of every block).

The outline of the method of generating the PUF value in the solid-state imaging device 1 according to the present embodiment has been described above with reference to FIGS. 15 to 18.

4.3. Functional Configuration

Figure 19:
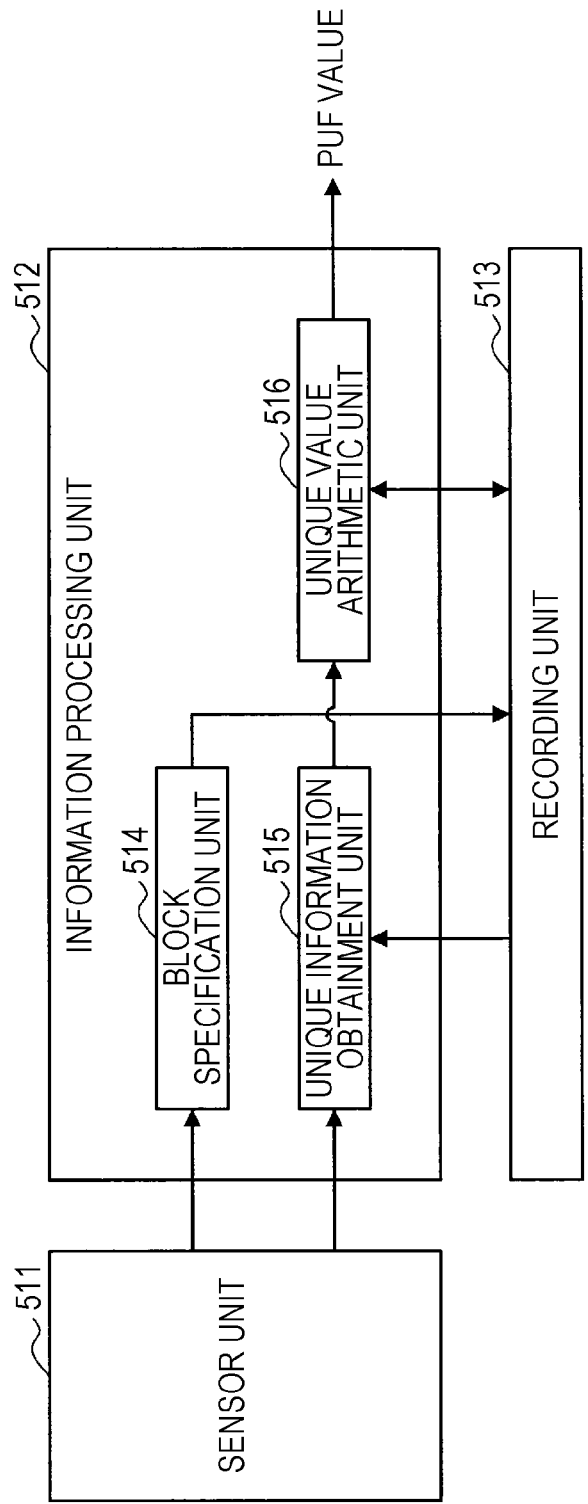
FIG. 19 is a block diagram illustrating an example of a functional configuration of a solid-state imaging device according to the same embodiment.

Next, an example of a functional configuration of the solid-state imaging device 1 according to the present embodiment will be described, particularly focusing on a part related to generation and recalculation of the PUF value unique to the solid-state imaging device 1. For example, FIG. 19 is a block diagram illustrating an example of the functional configuration of the solid-state imaging device 1 according to the present embodiment. Note that, in FIG. 19, in order to make characteristics of the solid-state imaging device 1 according to the present embodiment more understandable, components related to generation of the PUF value unique to the solid-state imaging device 1 are illustrated, and other components are omitted.

As illustrated in FIG. 19, the solid-state imaging device 1 according to the present embodiment includes a sensor unit 511, an information processing unit 512, and a storage unit 513.

The sensor unit 511 corresponds to the pixel array 3 described with reference to FIG. 1, and photoelectrically converts light from a subject into an electrical signal.

The information processing unit 512 executes various processes related to generation of the PUF value unique to the solid-state imaging device 1. As illustrated in FIG. 19, the information processing unit 512 includes, for example, a block specification unit 514, a unique information obtainment unit 515, and a unique value arithmetic unit 516. Note that operation of respective components of the information processing unit 512 will be described separately for a case where the PUF value is generated and a case where the PUF value is recalculated. First, focusing on the case where the PUF value is generated, the operation of the related configuration will be described.

The block specification unit 514 specifies, from a plurality of blocks into which pixels included in at least a part of the region (for example, the OPB region) are divided among the plurality of pixels that form the sensor unit 511, one or more blocks to be the target of use for PUF value generation according to a predetermined condition. As a specific example, the block specification unit 514 may specify the block to be the target of use for PUF value generation according to whether or not the pixel value of every block is included in a predetermined range including the average of the pixel values among a plurality of blocks. Then, the block specification unit 514 stores information regarding the specified block in the storage unit 513 described later. Note that the block specification unit 514 corresponds to an example of a "specification unit".

The unique information obtainment unit 515 obtains the pixel value of every block as unique information from a predetermined number or more of blocks to be the target of use for PUF value generation among the plurality of blocks into which pixels included in the above predetermined region (for example, the OPB region) are divided. Note that at this time, the unique information obtainment unit 515 may specify the block to be the target of use for PUF value generation on the basis of information stored in the storage unit 513. Then, the unique information obtainment unit 515 outputs to the unique value arithmetic unit 516 the unique information (that is, the pixel value of every block) obtained from each of the predetermined number or more of blocks to be the target of use for PUF value generation.

The unique value arithmetic unit 516 obtains, from the unique information obtainment unit 515, the unique information obtained from each of the predetermined number or more of blocks to be the target of use for PUF value generation, and generates the PUF value on the basis of the obtained unique information. As a specific example, the unique value arithmetic unit 516 may specify a bit value corresponding to the block according to whether or not the unique information obtained from every block is larger than a predetermined threshold (for example, an average of pixel values among blocks), and may concatenate the bit values specified in every block, to thereby generate the PUF value. Note that the unique value arithmetic unit 516 corresponds to an example of a "generation unit" that generates (calculates) a value unique to the device.

Furthermore, the unique value arithmetic unit 516 may use a part of the bit values specified in every block when generating the PUF value so as to calculate an error correction code for correcting an error in the PUF value that is separately recalculated, and may store the error correction code in the storage unit 513.

As described above, the unique value arithmetic unit 516 generates the PUF value and outputs the generated PUF value to a predetermined output destination.

The storage unit 513 temporarily or permanently holds various information for each component in the solid-state image sensor 1 to execute various processes. The storage unit 513 can include, for example, a non-volatile recording medium (for example, a memory or the like) capable of holding stored contents without supplying power. The storage unit 513 may store, for example, information regarding blocks to be the target of use for PUF value generation. Furthermore, the storage unit 513 may store an error correction code for correcting an error in the PUF value.

Next, focusing on the case where the PUF value is recalculated, an operation of the related configuration will be described.

The unique information obtainment unit 515 obtains a pixel value of every block as unique information from a predetermined number or more of blocks to be the target of use for PUF value generation, similarly to the case of generating the PUF value. Then, the unique information obtainment unit 515 outputs, to the unique value arithmetic unit 516, the unique information obtained from each of a predetermined number or more of blocks to be used for PUF value generation.

The unique value arithmetic unit 516 recalculates the PUF value on the basis of the unique information of every block obtained from the unique information obtainment unit 515, similarly to when the PUF value is generated. Furthermore, at this time, if the storage unit 513 stores the error correction code for correcting an error in the PUF value, the unique value arithmetic unit 516 may correct the error in the PUF value recalculated on the basis of the error correction code. Then, the unique value arithmetic unit 516 outputs the recalculated PUF value to a predetermined output destination.

As described above, an example of the functional configuration of the solid-state imaging device 1 according to the present embodiment has been described with reference to FIG. 19, particularly focusing on a part related to generation and recalculation of the PUF value unique to the solid-state imaging device 1.

4.4. Processing

Next, as an example of a flow of a series of processes of the solid-state imaging device 1 according to the present embodiment, processes related to generation and recalculation of the PUF value unique to the solid-state imaging device 1 will be described.

Figure 20:
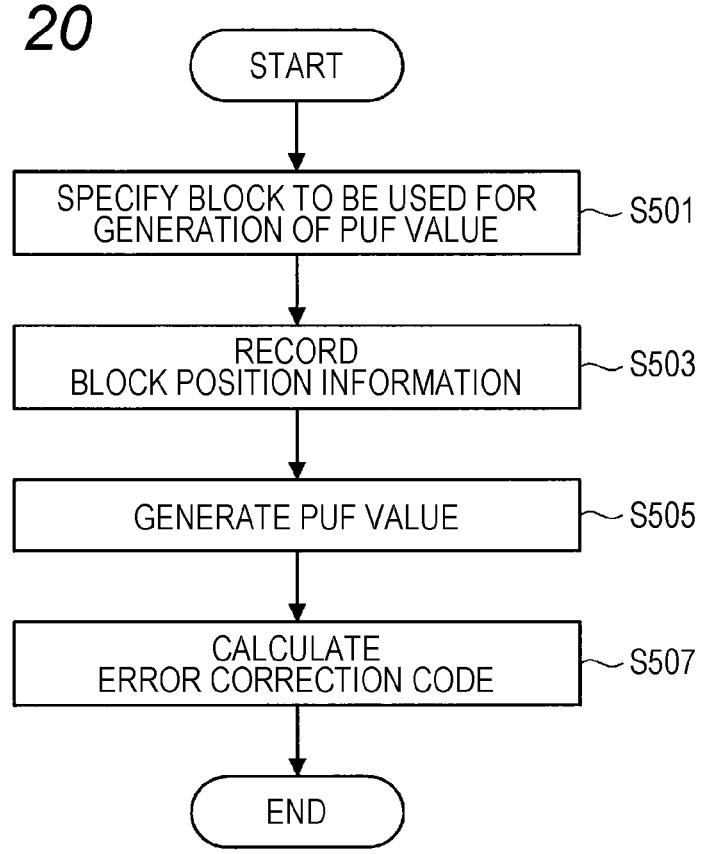
FIG. 20 is a flowchart illustrating an example of a flow of a series of processes of the solid-state imaging device according to the same embodiment.

First, with reference to FIG. 20, an example of processes related to generation of the PUF value will be described. FIG. 20 is a flowchart illustrating an example of a flow of a series of processes of the solid-state imaging device 1 according to the present embodiment, and illustrates a flow of processes related to generation of the PUF value.

As illustrated in FIG. 20, first, the solid-state imaging device 1 (block specification unit 514) specifies, from a plurality of blocks into which pixels included in a predetermined region are divided among the plurality of pixels forming the sensor unit 511, a predetermined number or more (at least 1 or more) of blocks to be used for PUF value generation (S501). Then, the solid-state imaging device 1 stores information regarding the specified blocks (for example, information indicating positions of the blocks) in the predetermined storage area (S503).

Subsequently, the solid-state imaging device 1 (unique information obtainment unit 515) obtains the pixel value of every block as unique information from the blocks specified as the target of use for PUF value generation on the basis of the information stored in the predetermined storage area. Then, the solid-state imaging device 1 (unique value arithmetic unit 516) generates a PUF value on the basis of the unique information obtained from each of the predetermined number or more of blocks to be the target of use. As a specific example, according to whether or not the unique information obtained from every block is larger than a predetermined threshold, the solid-state imaging device 1 may specify a bit value corresponding to the block, and generate a PUF value by concatenating bit values specified for every block (S507).

Furthermore, the solid-state imaging device 1 (unique value arithmetic unit 516) may calculate an error correction code for correcting an error in the PUF value that is separately recalculated by using a part of the bit values specified for every block. In this case, the solid-state imaging device 1 may store the calculated error correction code in the predetermined storage area (S507).

As described above, the PUF value is generated and the generated PUF value is output to a predetermined output destination.

The example of the processes related to generation of the PUF value has been described above with reference to FIG. 20.

Figure 21:
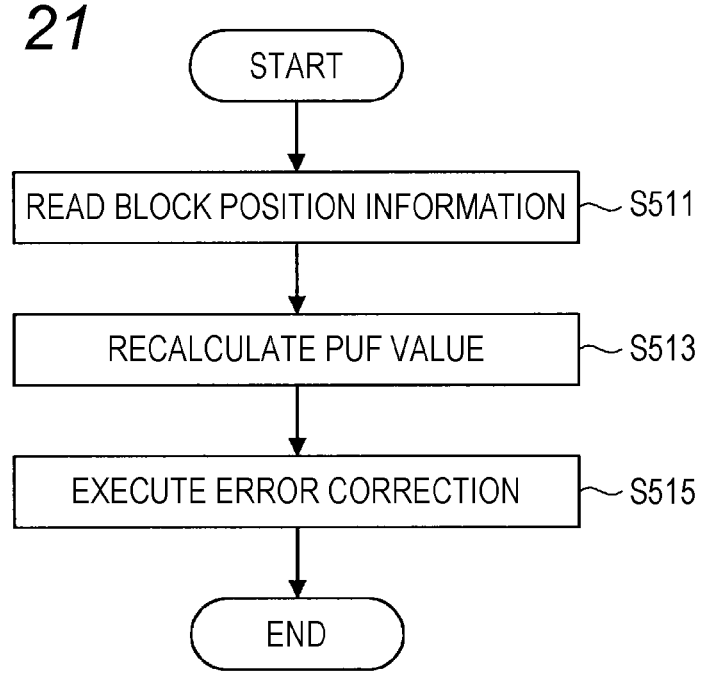
FIG. 21 is a flowchart illustrating an example of a flow of a series of processes of the solid-state imaging device 1 according to the same embodiment.

Next, with reference to FIG. 21, an example of processes related to recalculation of the PUF value will be described. FIG. 21 is a flowchart illustrating an example of a flow of a series of processes of the solid-state imaging device 1 according to the present embodiment, and illustrates a flow of processes related to recalculation of the PUF value.

As illustrated in FIG. 21, first, the solid-state imaging device 1 (unique information obtainment unit 515) specifies the position of a block to be the target of use for PUF value generation on the basis of information stored in the predetermined storage area (S511).

Next, the solid-state imaging device 1 (unique information obtainment unit 515) obtains a pixel value of every block as unique information from the blocks specified as the target of use for PUF value generation. Then, the solid-state imaging device 1 (unique value arithmetic unit 516) recalculates the PUF value on the basis of the unique information obtained from each of a predetermined number or more of blocks to be used, similarly to the case of generating the PUF value (S513).

Furthermore, in a case where the error correction code for correcting an error in the PUF value is stored in the predetermined storage area, the solid-state imaging device 1 (unique information obtainment unit 515) may correct the error in the PUF value recalculated on the basis of the error correction code (S515).

As described above, the PUF value is recalculated, and the recalculated PUF value is output to a predetermined output destination.

The example of the process related to recalculation of the PUF value has been described above with reference to FIG. 21.

4.5. Evaluation

As described above, the solid-state imaging device 1 according to the present embodiment specifies at least one or more blocks as the target for PUF value generation from a plurality of blocks set by dividing pixels included in at least a part of the region (for example, the OPB region) in an imaging surface in which a plurality of pixels is arranged. Note that each block includes at least one pixel. Then, the solid-state imaging device 1 generates a value unique to the solid-state imaging device 1 (that is, a PUF value) on the basis of the pixel values of pixels included in the specified blocks and variations in the pixel values of pixels among the plurality of blocks.

With the above configuration, the value unique to the solid-state imaging device 1 is generated by using physical characteristics (that is, hardware characteristics) of the solid-state imaging device 1 that are difficult to copy. Thus, it is possible to use the unique value as, for example, an identifier for identifying an individual device or key information for encryption processing or the like. Furthermore, by generating the unique value in the solid-state imaging device 1 on the basis of the above-described configuration, in a case where the unique value is used as the identifier or key information, it is possible to sufficiently satisfy the conditions of reproducibility and individual difference required for the identifier or the key information described above.

Note that the above-mentioned example is merely an example, and the physical characteristics are not necessarily limited only to variations in the threshold voltage Vth of the amplification transistor Tr13 as long as the physical characteristics can be detected in every pixel 2 and can satisfy the conditions of reproducibility and individual difference required for the PUF value. For example, among the respective transistors constituting the pixels 2, physical characteristics of transistors other than the amplification transistor Tr13 may be used, and the physical characteristics are not necessarily limited only to variations in the threshold voltage Vth. As a specific example, a detection result of noise generated due to a device, such as what is called random telegraph signal (RTS), may be used to generate the PUF value.

5. THIRD EMBODIMENT

Hereinafter, as a third embodiment of the present disclosure, an example of a technique that allows generating a value unique to the solid-state image sensor (that is, the PUF value) in a more preferable mode by using physical characteristics of the solid-state image sensor will be described focusing particularly on the structure of the solid-state image sensor.

Generally, in order to obtain a good image signal, it is desired that the solid-state image sensor has a small dark signal such as a dark current or a white spot and has small variations. A hole accumulated diode (HAD) structure is an example of a structure for further reducing such a dark signal. Specifically, the HAD structure suppresses generation of the dark signal by not only covering a substrate interface of the photoelectric conversion unit with a P-type impurity layer, but also applying a negative bias to a transfer unit arranged adjacent to the photoelectric conversion unit to accumulate holes for making it P type, and thereby fixing a potential across the photoelectric conversion unit and its adjacent portion On the other hand, as described above in other embodiments, since variations in electrical characteristics of a semiconductor element caused by processing variations during manufacturing of the semiconductor element have randomness, the variations in the electrical characteristics can be used for generation of the PUF value. By using such information of manufacturing variations (hereinafter, simply referred to as "variation information") to generate a value unique to the solid-state image sensor (that is, the PUF value), the unique value can be used for generating ID, a seed value for encryption, an encryption key, and the like.

However, in a case where the manufacturing variations in the semiconductor element are used for generating the PUF value, the greater the dark signal, the more accurately the manufacturing variations can be detected. On the other hand, as described above, in order to obtain a good image signal, it is desirable that the dark signal is small and the variations are small. From such a background, it has been difficult to achieve both obtaining of a good image signal and obtaining of good variation information.

Accordingly, the present embodiment proposes an example of a technique that allows generating a value (PUF value) unique to the device in a more preferable mode by achieving both obtaining of a good image signal and obtaining of good variation information.

5.1. Basic Idea

In the solid-state image sensor according to the present embodiment, a plurality of unit pixels forming the pixel array (for example, the pixels 2 forming the pixel array 3 in FIG. 1) is divided into a unit pixel group used for obtaining an image signal, and a unit pixel group used for obtaining variation information. Specifically, a unit pixel group disposed in the effective pixel region where a subject image is formed through the optical system such as a lens is used for obtaining an image signal, and at least a part of unit pixel groups disposed in a region shielded from light by a metal or the like (hereinafter, referred to as "light-shielded region") is used for obtaining variation information. Furthermore, the light-shielded region may include the above-mentioned OPB region, that is, the region where a pixel used for measuring the level of a pixel signal that is a reference for correcting the black level (hereinafter, also referred to as "OPB pixel") is disposed. Note that in the following description, the unit pixel group used for obtaining an image signal will be also referred to as a "first unit pixel group", and the unit pixel group used for obtaining variation information will be also referred to as a "second unit pixel group". Furthermore, the unit pixel group included in the OPB region (that is, the group of OPB pixels) will be also referred to as a "third unit pixel group".

On the basis of the above configuration, in the solid-state image sensor according to the present embodiment, in the first unit pixel group and the second unit pixel group, a structure of at least a part of components that the respective groups have in common or a structure of a component related in common to the respective groups is different. As a specific example, the first unit pixel group and the second unit pixel group are different in at least one of the structure of the unit pixels included therein, components (for example, a comparator and the like) related to output of a signal from the unit pixels, or the electrical connection relationship among the elements included therein (for example, electrical connection relationship among elements included in the unit pixels, and the like). That is, with respect to the first unit pixel group, respective components related to output of a signal from the unit pixel group are configured so that, for example, the dark signal is small and the variations are small. On the other hand, with respect to the second unit pixel group, respective components related to output of a signal from the unit pixel group are configured so that the dark signal becomes larger (that is, the manufacturing variations become larger).

Furthermore, with respect to the third unit pixel group, the included unit pixels (that is, the OPB pixels) are used for measuring the level of a pixel signal that is a reference for correcting the black level, and thus it is desirable to be configured so that, similarly to the first unit pixel group, the dark signal is small and the variations are small. Therefore, in the solid-state image sensor according to the present embodiment, at least a part of components related to output of a signal in each of the third unit pixel group and the second unit pixel group is also different.

Note that for an example of the components related to output of a signal from the second unit pixel group for allowing obtaining good variation information, details will be described below particularly focusing on a part different from the components related to output of a signal from the first unit pixel group or the third unit pixel group.

5.2. Configuration Example

Hereinafter, an example of a configuration of the solid-state image sensor according to the present embodiment will be described, particularly focusing on a configuration for allowing obtaining good variation information.

First, as an example of the configuration for allowing obtaining good variation information, a description will be given below with respect to an example of the structure of the unit pixels included in the second unit pixel group, while focusing on a part to be made different in structure from the unit pixels included in the first unit pixel group and the third unit pixel group.

Configuration Example of Effective Pixel

As an example of a configuration for allowing obtaining good variation information, there is a method of making the structure of the unit pixels included in each of the second unit pixel group and the first unit pixel group (or the third unit pixel group) different between them. Accordingly, first, in order to make it easier to understand a characteristic configuration of the unit pixels included in the second unit pixel group, an example of a configuration of the unit pixels included in the first unit pixel group (that is, effective pixels used for output of an image signal) will be described as a comparative example.

Figure 22:
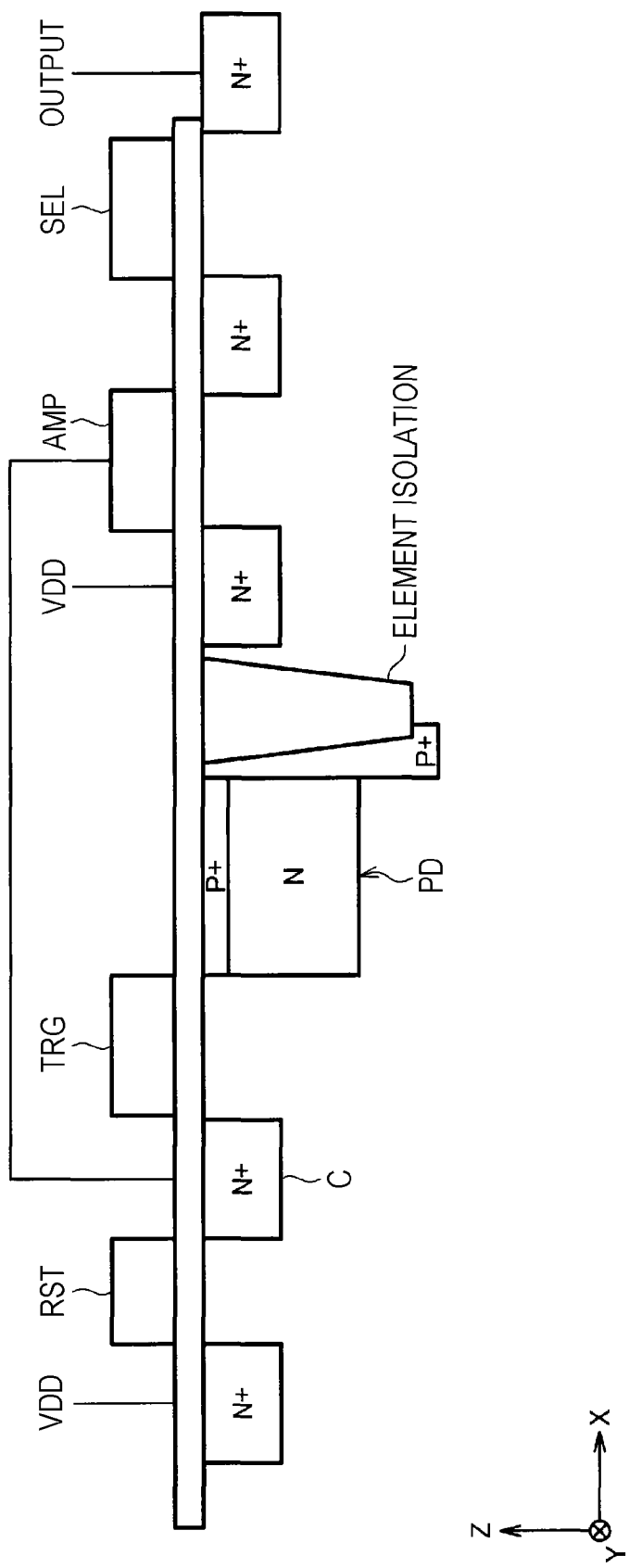
FIG. 22 is an explanatory diagram for describing an example of a configuration of a unit pixel according to a comparative example of a third embodiment of the present disclosure.

For example, FIG. 22 is an explanatory diagram for describing an example of a configuration of a unit pixel according to the comparative example of the present embodiment, and illustrates an example of a schematic configuration of the effective pixels. Note that in the example illustrated in FIG. 22, a normal direction of the substrate on which respective elements constituting the unit pixels are disposed is z direction, and directions in which the substrate extends (that is, directions orthogonal to the z direction) are x direction and y direction.

Specifically, FIG. 22 illustrates an example of a schematic hardware configuration of a unit pixel including four transistors like the pixel 121 described with reference to FIG. 8. The unit pixel illustrated in FIG. 22 includes a photodiode PD to be a photoelectric conversion unit of the pixel, a transfer transistor TRG, a reset transistor RST, an amplification transistor AMP, a selection transistor SEL, and a capacitance part C. The capacitance part C corresponds to, for example, parasitic capacitance of the floating diffusion part FD. Note that in the following description, the transfer transistor TRG, the reset transistor RST, the amplification transistor AMP, and the selection transistor SEL are also referred to as "transfer unit", "initialization unit", "amplification unit", and "selection unit", respectively.

In the example illustrated in FIG. 22, one having a hole accumulated diode (HAD) structure is employed as the photodiode PD to be a photoelectric conversion unit. Therefore, the example illustrated in FIG. 22 illustrates an N-type semiconductor that constitutes the photodiode PD and a P-type impurity layer that covers a substrate interface of the photodiode PD (the N-type semiconductor). Further, on the substrate, an element isolation is formed by a silicon oxide film or the like in a region where the photodiode PD is provided and a region where the amplification transistor AMP is provided, in order to prevent interference. Furthermore, the photodiode PD and the gate terminal of the amplification transistor AMP are electrically connected via the reset transistor RST by a wiring provided so as to bypass a portion where the element isolation is formed.

With such a configuration, the transfer transistor TRG is controlled to be in an on state, and thus a signal charge photoelectrically converted by the photodiode PD (that is, a photoelectric conversion unit) is accumulated in the capacitance part C (in other words, the floating diffusion part FD) via the transfer transistor TRG. Thereafter, the transfer transistor TRG is controlled to be in an off state, and thus the potential according to the signal charge accumulated in the capacitance part C is applied to the gate terminal of the amplification transistor AMP.

Furthermore, the selection transistor SEL is interposed between the amplification transistor AMP and an output line that outputs a pixel signal from the unit pixel (in other words, an output line VSL). That is, by controlling each of the amplification transistor AMP and the selection transistor SEL to be in an on state, a signal of a level corresponding to the voltage applied to a base terminal of the amplification transistor AMP is output to the outside of the unit pixel via the output signal line.

The example of the configuration of the unit pixels included in the first unit pixel group (that is, the effective pixels used for output of an image signal) has been described above as a comparative example with reference to FIG. 22.

Next, an example of a configuration of unit pixels used for obtaining variation information, that is, unit pixels included in the second unit pixel group in the solid-state image sensor according to the present embodiment will be described below. Note that in the following description, with respect to the example of the configuration of the unit pixels included in the second unit pixel group, a difference in the configuration of the unit pixels included in each of the second unit pixel group and the first unit pixel group will be described, but the same applies to the second unit pixel group and the third unit pixel group.

Example of Case where Characteristics of Photoelectric Conversion Unit are Used

First, an example of the configuration of the unit pixels included in the second unit pixel group in a case where characteristics of the photoelectric conversion unit (that is, characteristics of the photodiode PD) are used as variation information will be described.

In a case where characteristics of the photoelectric conversion unit are used as variation information, for example, there is a method of separately making an impurity layer that is formed so as to cover a substrate interface of the photoelectric conversion unit between the first unit pixel group and the second unit pixel group. That is, in this case, the photoelectric conversion units of the unit pixels are formed so that the dark signal becomes smaller in the first unit pixel group, and the photoelectric conversion units of the unit pixels are formed so that the dark signal becomes larger in the second unit pixel group.

For example, FIG. 23A is an explanatory diagram for describing an example of a structure of a unit pixel in the solid-state imaging device according to the present embodiment, and illustrates an example of a configuration of a unit pixel included in the second unit pixel group in a case where characteristics of the photoelectric conversion unit are used as variation information. Specifically, in the example illustrated in FIG. 23A, a photodiode PD having no HAD structure (that is, having no P-type impurity layer) is employed as the photodiode PD corresponding to the photoelectric conversion unit. In the HAD structure, generation of the dark signal is suppressed by covering the substrate interface of the photoelectric conversion unit with a P-type impurity layer. Thus, by employing a photoelectric conversion unit having no HAD structure (that is, a photoelectric conversion unit not provided with a P-type impurity layer) as illustrated in FIG. 23A, it becomes difficult to fix a potential in the photoelectric conversion unit, and the dark signal increases more than in the unit pixel that employs the photoelectric conversion unit having the HAD structure as illustrated in FIG. 22.

Figure 23B:
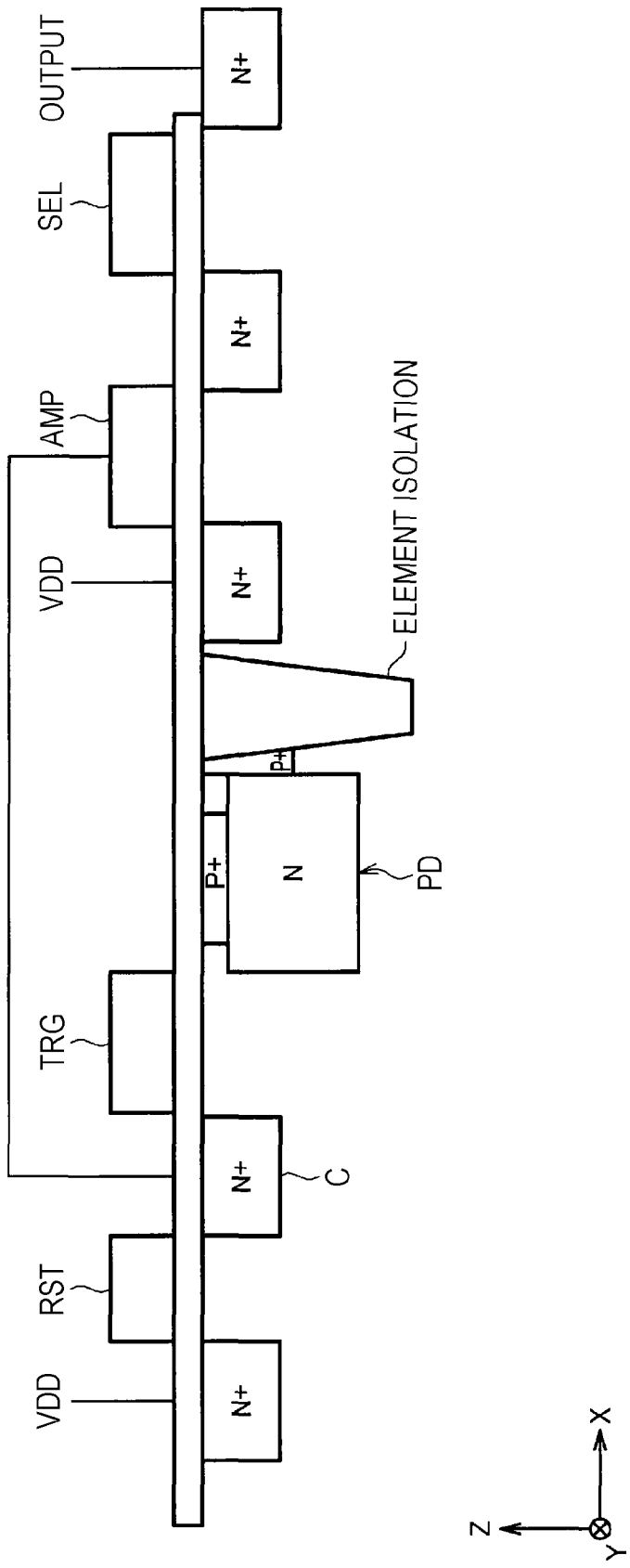
FIG. 23B is an explanatory diagram for describing an example of a structure of a unit pixel in the solid-state imaging device according to the same embodiment.

Furthermore, FIG. 23B is an explanatory diagram for describing an example of a structure of a unit pixel in the solid-state imaging device according to the present embodiment, and illustrates another example of a configuration of a unit pixel included in the second unit pixel group in a case where characteristics of the photoelectric conversion unit are used as variation information. Specifically, in the example illustrated in FIG. 23B, the effect of suppressing the dark signal is reduced by lowering coverage of the substrate interface of the photoelectric conversion unit with the P-type impurity layer. In this case, for example, by changing the shape of the P-type impurity layer with photoresist or the like (including, for example, a line width, a relative position, and the like), the coverage rate of the substrate interface of the photoelectric conversion unit by the P-type impurity layer can be adjusted (that is, made lower).

Furthermore, even in the case of having an HAD structure (that is, in the case of providing a P-type impurity layer) as in the example illustrated in FIG. 22, by reducing impurity concentration at the substrate interface of the photoelectric conversion unit, it becomes difficult to fix a potential in the photoelectric conversion unit, and the dark signal increases. Specifically, for example, by changing ion implantation conditions (for example, dose amount, energy, implantation angle, ion species, number of implantations, and the like) by region with a photoresist, it is possible to separately form the P-type impurity layer. As a more specific example, it is possible to reduce the impurity concentration at the substrate interface of the photoelectric conversion unit by reducing a dose amount for forming the P-type impurity layer or increasing implantation energy.

Figure 23C:
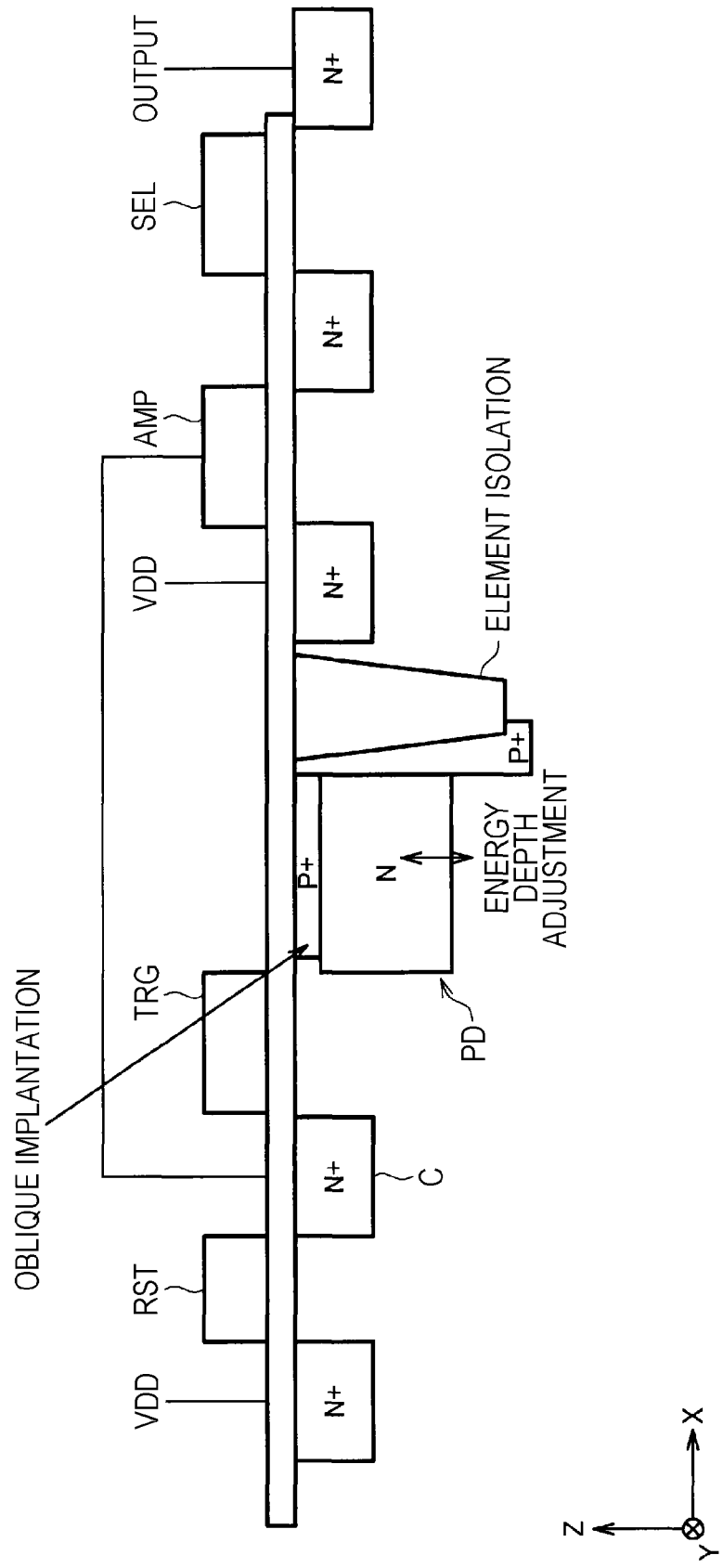
FIG. 23C is an explanatory diagram for describing an example of a structure of a unit pixel in the solid-state imaging device according to the same embodiment.

Furthermore, by changing the implantation angle, the implantation region of ions is narrowed due to the effect of what is called shadowing in which implantation of ions is blocked by another element, and thus the effect of suppressing the dark signal can be reduced. For example, FIG. 23C is an explanatory diagram for describing an example of a structure of a unit pixel in the solid-state imaging device according to the present embodiment, and illustrates another example of a configuration of a unit pixel included in the second unit pixel group in a case where characteristics of the photoelectric conversion unit are used as variation information. Specifically, in the example illustrated in FIG. 23C, the implantation angle of ions is controlled so that the ions are obliquely implanted into a region where the photoelectric conversion unit is provided on the substrate. At this time, in the example illustrated in FIG. 23C, part of implanted ions is shielded by the transfer transistor TRG, and the implantation region of the ions is narrowed. Furthermore, it is also possible to adjust the depth of implanting ions by adjusting implantation energy of ions.

Furthermore, the substrate interface of the photoelectric conversion unit is not limited only to the surface of the photoelectric conversion unit, and an interface with an insulator for element isolation (for example, "local oxidation of silicon (LOCOS)", "shallow trench isolation (STI)" or the like) can be expected to have similar operation and effect by applying the control described above.

Furthermore, as another example, in a case of a back-illuminated image sensor or the like, a structure is known that suppresses generation of the dark signal by forming a film having a negative fixed charge on a silicon interface on the light incident side, instead of covering with a P-type impurity layer. In this case, the film having the negative fixed charge may be separately formed in the first unit pixel group and the second unit pixel group. Note that as a method for separately forming the film having the negative fixed charge described above, for example, there is a method of etching by region with a photoresist.

Furthermore, as another example, a moth-eye technique is known as an example of a technique for processing silicon for suppressing reflectance or changing an optical path. A structure based on the moth-eye technique (what is called a moth-eye structure) is a fine uneven structure (nano-order uneven structure), and it is known that forming this structure on the surface on which light is incident provides an antireflection effect. Even in such a structure, it is possible to separately apply the film having the negative fixed charge described above. That is, in a case where the moth-eye technique is applied, the degree of silicon processing may be separately set between the first unit pixel group and the second unit pixel group.

Furthermore, as another example, a similar effect can be expected by changing the shape of the transfer unit arranged adjacent to the photoelectric conversion unit (for example, including a line width and a relative position), and changing the distance between the P-type impurity layer and the element isolation described above.

Furthermore, the structure of the photoelectric conversion unit may be formed to have the opposite conductivity type.

Figure 23D:
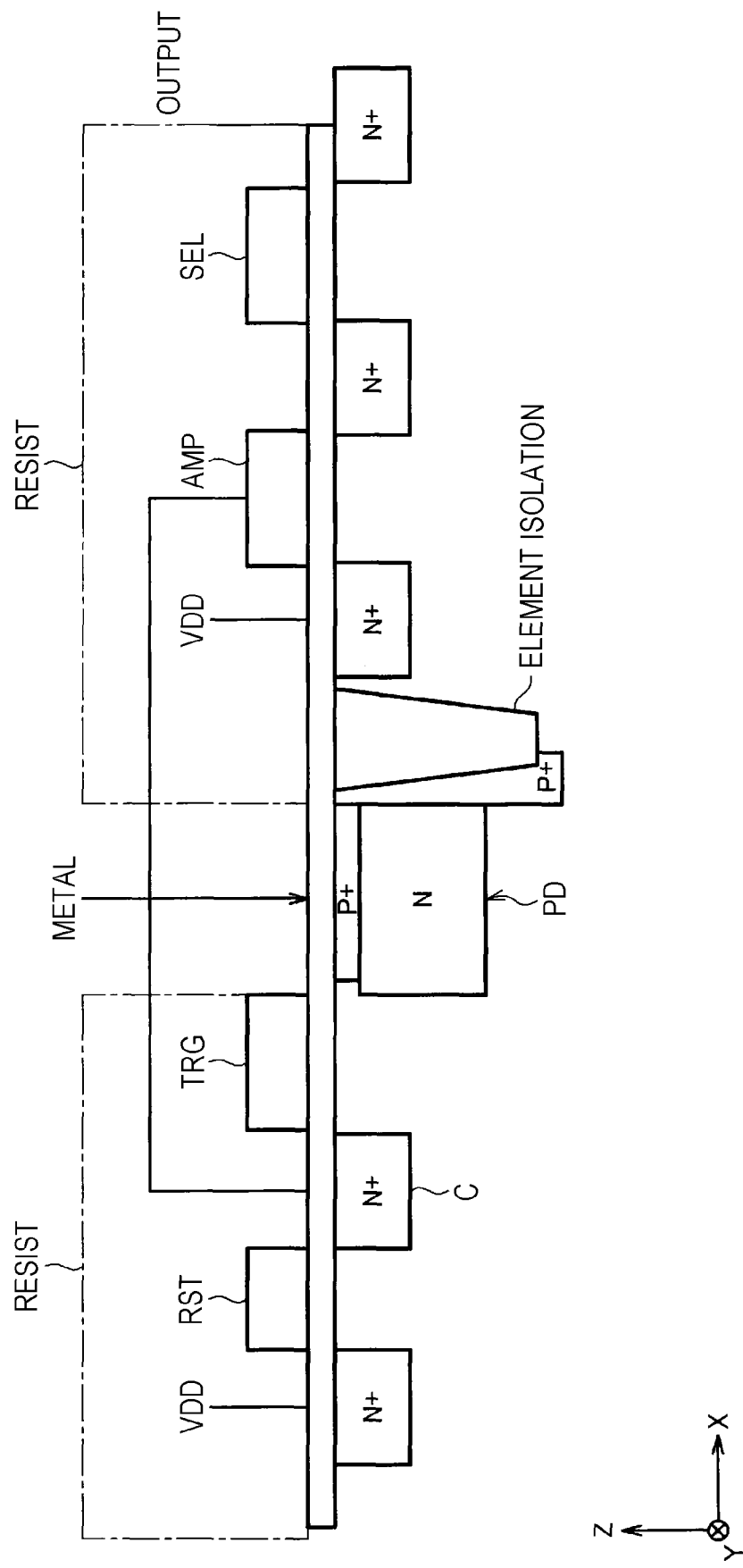
FIG. 23D is an explanatory diagram for describing an example of a structure of a unit pixel in the solid-state imaging device according to the same embodiment.

In particular, in a case where white spots are detected as manufacturing variations in element, the number of white spots can be increased by implanting metal ions (for example, tungsten) or the like into the photoelectric conversion unit of the second unit pixel group. For example, FIG. 23D is an explanatory diagram for describing an example of a structure of a unit pixel in the solid-state imaging device according to the present embodiment, and illustrates another example of a configuration of a unit pixel included in the second unit pixel group in a case where characteristics of the photoelectric conversion unit are used as variation information. That is, in this case, it is only required, as illustrated in FIG. 23D, to form a photoresist on a region other than the region where the photoelectric conversion unit is provided on the substrate surface, and then implant metal ions into the photoelectric conversion unit.

As described above, by differentiating the structure of the photoelectric conversion unit and the electrical characteristics of the photoelectric conversion unit between the first unit element group and the second unit element group, it is possible to achieve both obtaining of a good image signal and obtaining of information of manufacturing variations in element in the photoelectric conversion unit in a more preferable mode.

Note that separate formation of distribution of the impurity can be achieved by, for example, locally performing thermal diffusion. Examples of a method for achieving such local thermal diffusion include laser annealing and the like.

The example of the configuration of the unit pixels included in the second unit pixel group in a case where characteristics of the photoelectric conversion unit (that is, characteristics of the photodiode PD) are used as variation information has been described above.

One Example of Case where Characteristics of Capacitance Part are Used

Next, an example of a configuration of the unit pixels included in the second unit pixel group in a case where characteristics of the capacitance part C are used as variation information will be described.

Generally, the capacitance part C is formed by a PN junction capacitance between a diffusion layer and a well, and is desired to have a small dark signal such as a dark current or a white spot. Thus, in order to further reduce the dark signal, the capacitance part C is formed so that the area of a portion where the PN junction is made is smaller and the electric field formed is weaker.

On the other hand, in a case where the manufacturing variations in element are detected, the larger the dark signal is, the more accurately the manufacturing variations can be detected. That is, in this case, the capacitance parts C of the unit pixels are formed so that the dark signal becomes smaller in the first unit pixel group, and the capacitance parts C of the unit pixels are formed so that the dark signal becomes larger in the second unit pixel group. Specifically, the capacitance part C is separately formed in the first unit pixel group and the second unit pixel group so that the area of the portion where the PN junction is made in the diffusion layer and strength of the formed electric field are different. Specifically, by changing ion implantation conditions (dose amount, energy, implantation angle, ion species, number of implantations, and the like) by region with a photoresist, it is possible to separately form the capacitance part C.

Figure 24A:
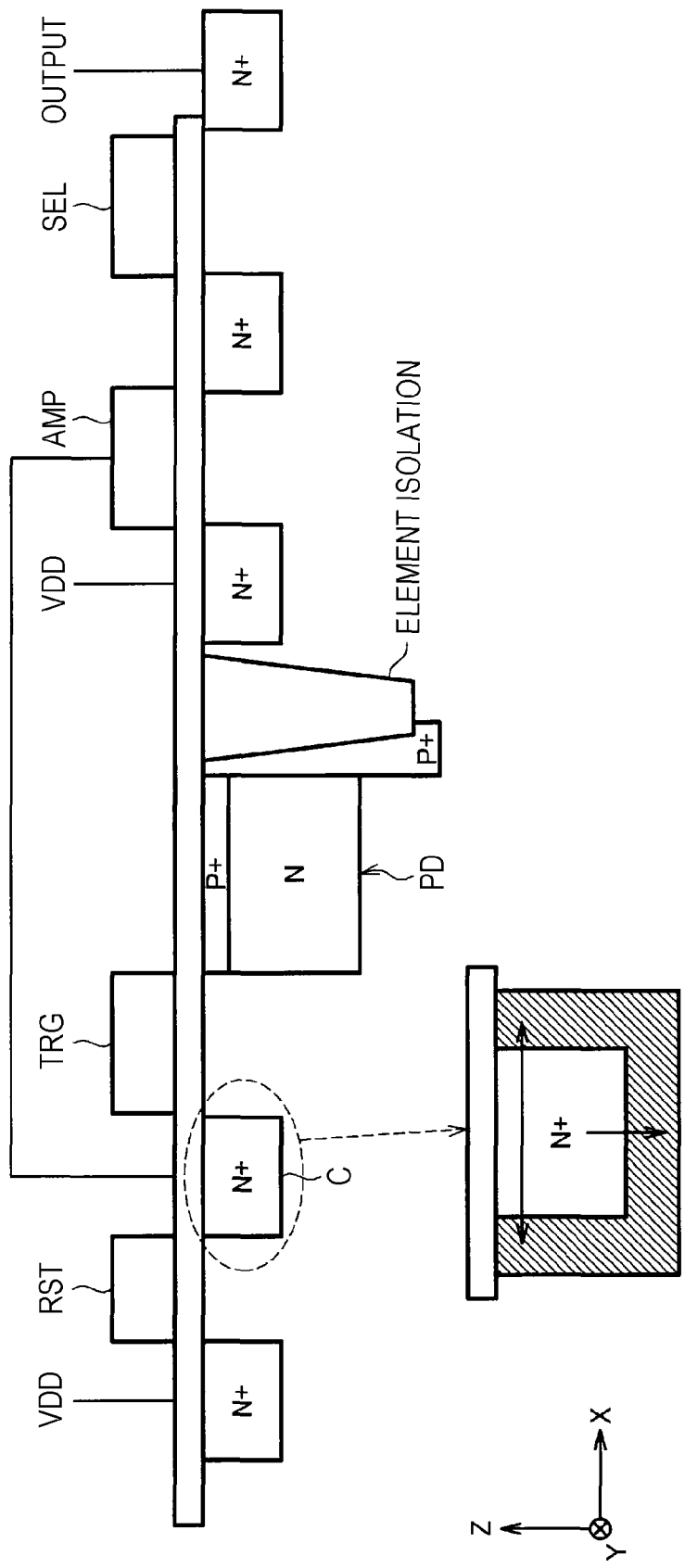
FIG. 24A is an explanatory diagram for describing an example of a structure of a unit pixel in the solid-state imaging device according to the same embodiment.

For example, FIG. 24A is an explanatory diagram for describing an example of a structure of a unit pixel in the solid-state imaging device according to the present embodiment, and illustrates an example of a configuration of a unit pixel included in the second unit pixel group in a case where characteristics of the capacitance part are used as variation information. Note that in a schematic enlarged view of the capacitance part C illustrated in FIG. 24A, a hatched part schematically illustrates a depletion layer. That is, as illustrated in FIG. 24A, by increasing the size of a portion where the capacitance part C is formed (that is, a portion where the diffusion layer and the well are in the PN junction), or increasing a width in a depth direction of the portion, the area of the portion where the PN junction is made further increases, and the electric field formed becomes stronger. Thus, it becomes possible to increase the dark signal.

As a more specific example, by increasing the dose amount for forming the diffusion layer or increasing implantation energy, the electric field formed becomes stronger, and the area of the portion where the PN junction is made further increases. Thus, it becomes possible to increase the dark signal. Furthermore, it is also possible to increase the dark signal by changing the shape of the diffusion layer (including the line width) with a photoresist or the like, and thereby increasing the area of the portion where the PN junction is made.

Furthermore, the structure of the diffusion layer may be formed to have the opposite conductivity type.

In particular, in a case where white spots are detected as manufacturing variations in element, the number of white spots can be increased by implanting metal ions (for example, tungsten) or the like into the photoelectric conversion unit of the second unit pixel group.

As described above, by differentiating the structure of the capacitance part C and electrical characteristics of the capacitance part C between the first unit element group and the second unit element group, it is possible to achieve both obtaining of a good image signal and obtaining of information of manufacturing variations in element in the capacitance part C in a more preferable mode.

Furthermore, in a case where characteristics of the capacitance part C are used, the photoelectric conversion unit does not need to be formed in the unit pixels of the second unit pixel group. For example, FIG. 24B is an explanatory diagram for describing an example of a structure of a unit pixel in the solid-state imaging device according to the present embodiment, and illustrates an example of a configuration of a unit pixel included in the second unit pixel group in a case where characteristics of the capacitance part are used as variation information. As can be seen from comparison with the unit pixel illustrated in FIG. 22, the unit pixel illustrated in FIG. 24B is not provided with the photoelectric conversion unit (that is, the photodiode PD).

Note that in a case where the unit pixels are configured as illustrated in FIG. 24B, for example, in a manufacturing process of the photoelectric conversion unit, for the unit pixels of the second unit pixel group, it is just necessary to perform control so that impurities of one of N-type and P-type are not implanted into the portion corresponding to the photoelectric conversion unit. As a result, it is possible to perform control so that the PN junction is not made and, consequently, photoelectric conversion is not performed in the relevant portion (that is, to perform control so that the photoelectric conversion unit is not formed). Furthermore, as a method for performing control so that one of the P-type impurities and the N-type impurities are not implanted, for example, there is a method of masking with a photoresist or the like so that ion implantation is not performed by region. With such a configuration, a signal does not flow into the capacitance part C from the photoelectric conversion unit. That is, since it is possible to remove influence of electrical characteristics of the photoelectric conversion unit (for example, an optical signal and a dark signal), it becomes easier to detect the manufacturing variations in element in the capacitance part C.

Figure 24C:
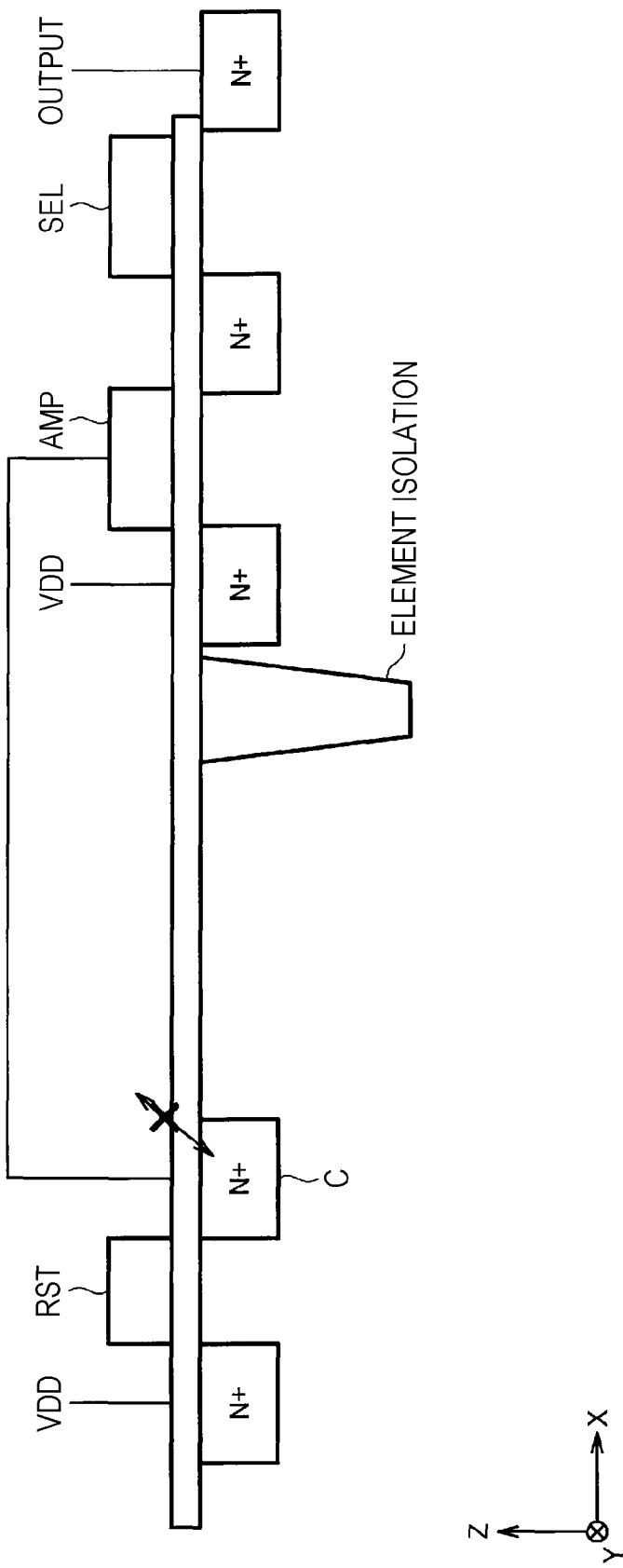
FIG. 24C is an explanatory diagram for describing an example of a structure of a unit pixel in the solid-state imaging device according to the same embodiment.

Furthermore, in a case where characteristics of the capacitance part C are used, the transfer unit does not need to be formed in addition to the above photoelectric conversion unit for the unit pixels of the second unit pixel group. For example, FIG. 24C is an explanatory diagram for describing an example of a structure of a unit pixel in the solid-state imaging device according to the present embodiment, and illustrates an example of a configuration of a unit pixel included in the second unit pixel group in a case where characteristics of the capacitance part are used as variation information. As can be seen from comparison with the unit pixel illustrated in FIG. 22, the unit pixel illustrated in FIG. 24C is not provided with a photoelectric conversion unit (that is, photodiode PD) and a transfer unit (that is, transfer transistor TRG).

Note that in a case where the unit pixel is configured as illustrated in FIG. 24C, for example, in the manufacturing process of forming the transfer unit, control may be performed so that the gate electrode of the transfer unit is removed by etching for the unit pixels of the second unit pixel group. Thus, it is possible to perform control so that the transfer unit is not formed. Furthermore, the method of performing control so that the photoelectric conversion unit is not formed is as described above. As described above, control is performed so that the photoelectric conversion unit and the transfer unit are not formed. Therefore, it is possible to not only remove the influence of electrical characteristics of the photoelectric conversion unit (for example, an optical signal and a dark signal), but also remove the dark signal that depends on the potential of the transfer unit. Thus, it becomes easier to detect the manufacturing variations in element in the capacitance part C.

Furthermore, as illustrated in FIG. 24C, since the photoelectric conversion unit and the transfer unit are not formed, regions corresponding to the photoelectric conversion unit and the transfer unit become empty, and thus it is also possible to configure the unit pixels so that the area of the diffusion layer becomes larger using the regions.

For example, FIGS. 25A to 25E are explanatory diagrams for describing examples of structures of unit pixels in the solid-state imaging device according to the present embodiment, and illustrate examples of structures of the capacitance part in a case where characteristics of the capacitance part are used as variation information. Note that FIGS. 25A to 25E illustrate examples of schematic configurations in a case where a portion of a unit pixel where a capacitance part, a transfer unit, and a photoelectric conversion unit are provided is viewed from a normal direction of the substrate (that is, the z direction in FIGS. 24A and 24C).

Figure 25A:
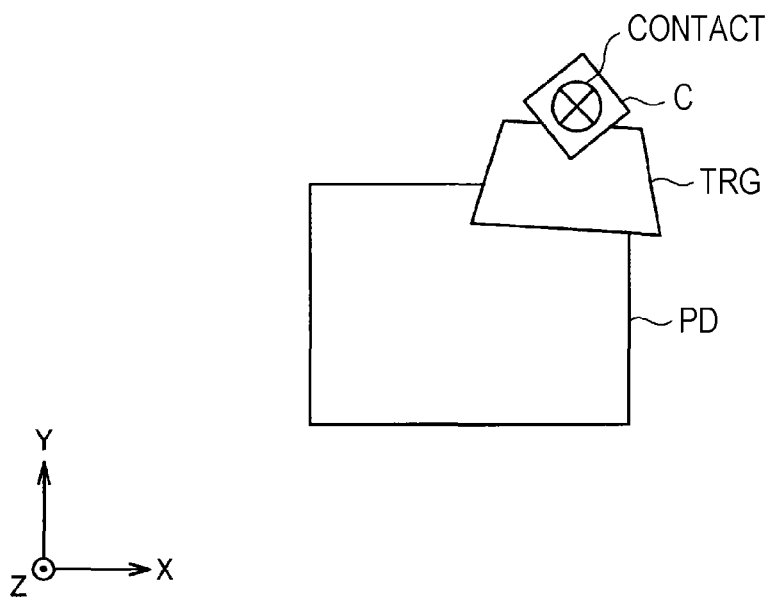
FIG. 25A is an explanatory diagram for describing an example of a structure of a unit pixel in the solid-state imaging device according to the same embodiment.

Specifically, FIG. 25A illustrates an example of a schematic configuration of a portion where a capacitance part, a transfer unit, and a photoelectric conversion unit are provided in a case where the photoelectric conversion unit and the transfer unit are formed as in the examples illustrated in FIGS. 22 and 24A. Furthermore, FIG. 25B to FIG. 25E illustrate examples of schematic configurations of a portion where a capacitance part is provided in a case where the photoelectric conversion unit and the transfer unit are not formed as in the example illustrated in FIG. 24C. Note that in the examples illustrated in FIGS. 24B to 25E, a region corresponding to the portion where the photoelectric conversion unit and the transfer unit are provided in the example illustrated in FIG. 25A is indicated by a broken line.

Figure 25B:
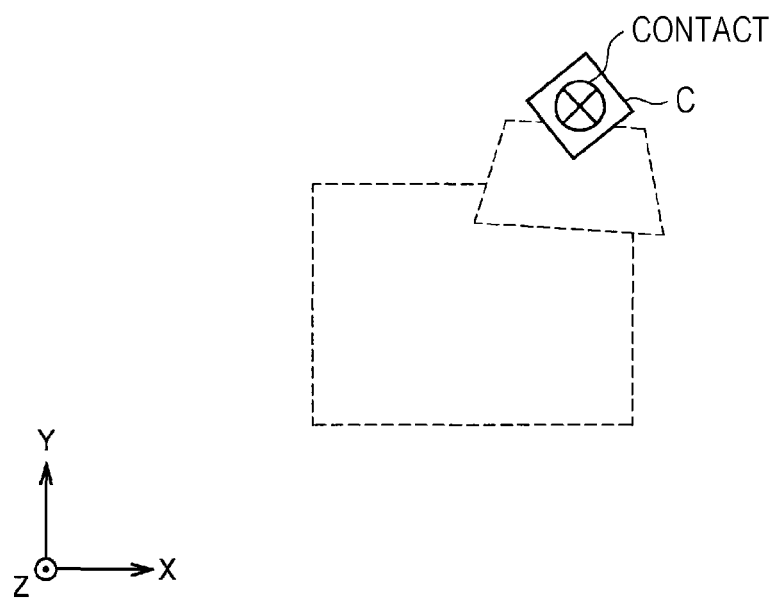
FIG. 25B is an explanatory diagram for describing an example of a structure of a unit pixel in the solid-state imaging device according to the same embodiment.
Figure 25C:
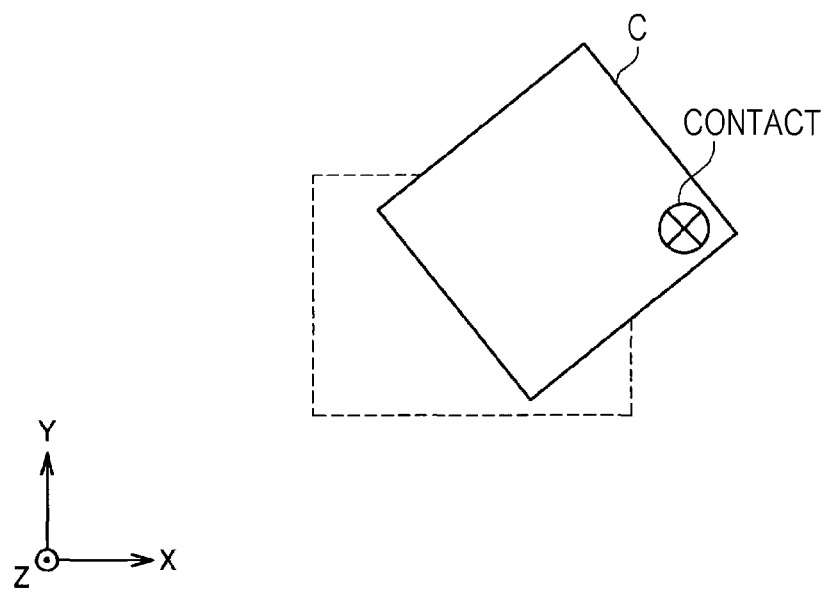
FIG. 25C is an explanatory diagram for describing an example of a structure of a unit pixel in the solid-state imaging device according to the same embodiment.

More specifically, FIG. 25B illustrates an example of a schematic configuration of a portion where a capacitance part is formed in a case where the photoelectric conversion unit and the transfer unit are simply not formed, similarly to the example illustrated in FIG. 24C. On the other hand, FIG. 25C illustrates an example of a case where the region corresponding to the portion where the photoelectric conversion unit and the transfer unit are provided in the example illustrated in FIG. 25A is used for performing control so as to increase the area of a region where the capacitance part is formed (that is, the area of the diffusion layer forming the capacitance part). With such a configuration, the area of the portion where the PN junction is made is further increased. Thus, it is possible to increase the dark signal, and it is possible to more accurately detect the manufacturing variations in element in the capacitance part.

Furthermore, the shape of the capacitance part (that is, the shape of the diffusion layer forming the capacitance part) is not particularly limited. Thus, the shape of the diffusion layer forming the capacitance part can be controlled so that the area of the portion where the PN junction is made further increases, to thereby increase the area of the portion where the PN junction is made.

Figure 25D:
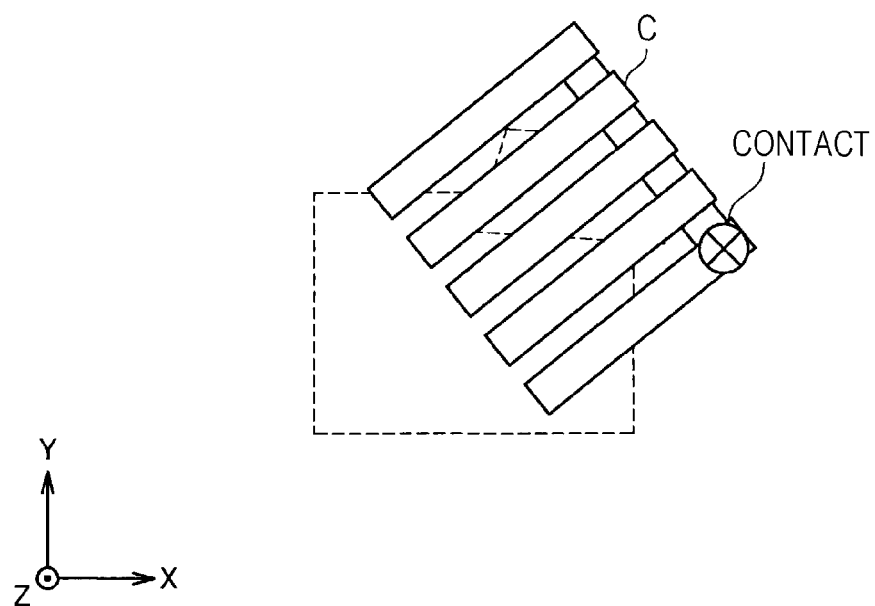
FIG. 25D is an explanatory diagram for describing an example of a structure of a unit pixel in the solid-state imaging device according to the same embodiment.

For example, FIG. 25D is an example of a case where the area of the region where the capacitance part is formed (that is, the area of the diffusion layer forming the capacitance part) as in the example illustrated in FIG. 25C is enlarged, and then the shape of the diffusion layer forming the capacitance part is controlled to be a comb shape. With such a configuration, in the example illustrated in FIG. 25D, the surface area of the diffusion layer becomes larger than that in the example illustrated in FIG. 25C. Thus, it is possible to further increase the area of the portion where the PN junction is made, and furthermore increase the dark signal.

Figure 25E:
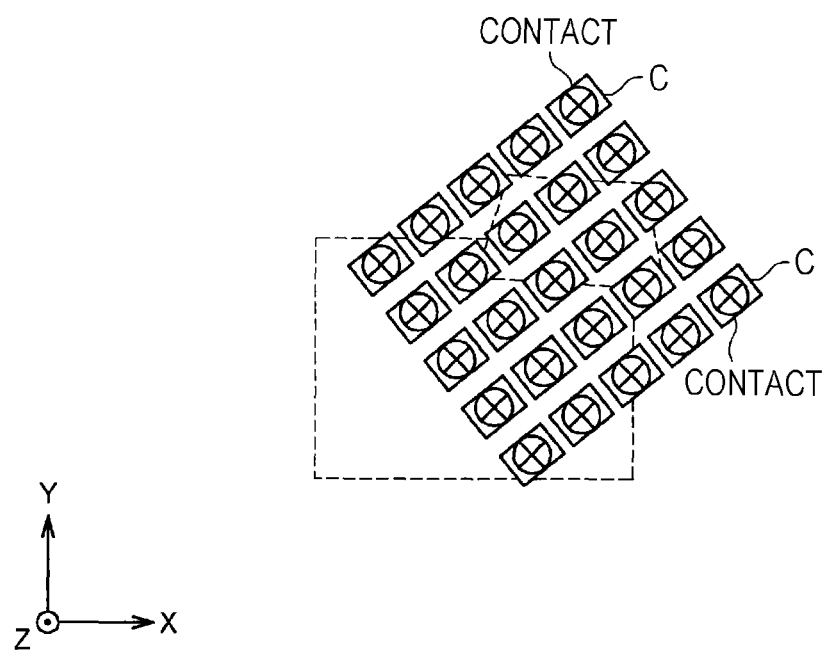
FIG. 25E is an explanatory diagram for describing an example of a structure of a unit pixel in the solid-state imaging device according to the same embodiment.

Furthermore, as another example, FIG. 25E illustrates a case where the area of the region where the capacitance part is formed (that is, the area of the diffusion layer forming the capacitance part) as in the example illustrated in FIG. 25B is enlarged, and then the shape of the diffusion layer forming the capacitance part is controlled to be a dot pattern. With such a configuration, in the example illustrated in FIG. 25E, the surface area of the diffusion layer becomes larger than that in the examples illustrated in FIGS. 25C and 25D, and thus, it is possible to further increase the area of the portion where the PN junction is made, and furthermore increase the dark signal. Note that in this case, since each dot forming the dot pattern becomes a capacitor and the number of capacitance parts is substantially increased, in the example illustrated in FIG. 25E, a contact is provided for each capacitor corresponding to each dot.

As described above, it is possible to increase the dark signal by forming the capacitance part C so that the area of the portion where the PN junction is made is further increased, and it is possible to detect the manufacturing variations in element in the capacitance part C more accurately. That is, it is possible to achieve both obtaining of a good image signal and obtaining of information of the manufacturing variations in element in the capacitance part C in a more preferable mode.

The example of the configuration of the unit pixels included in the second unit pixel group in a case where characteristics of the capacitance part C are used as variation information has been described above.

Example of Case where Characteristics of Initialization Unit are Used

Next, an example of a configuration of the second unit pixel group (for example, a configuration of the unit pixel included in the second unit pixel group) in a case where characteristics of the initialization unit (that is, the reset transistor RST) are used as variation information will be described.

Generally, it is desirable that capacitive coupling (that is, parasitic capacitance between a gate and a source) and charge injection (that is, a distribution of channel charge) that occur accompanying control of the initialization unit (reset transistor RST) and variations in them are smaller in consideration of dynamic range and image quality (in other words, an uncorrected portion) of an image signal.

Figure 26A:
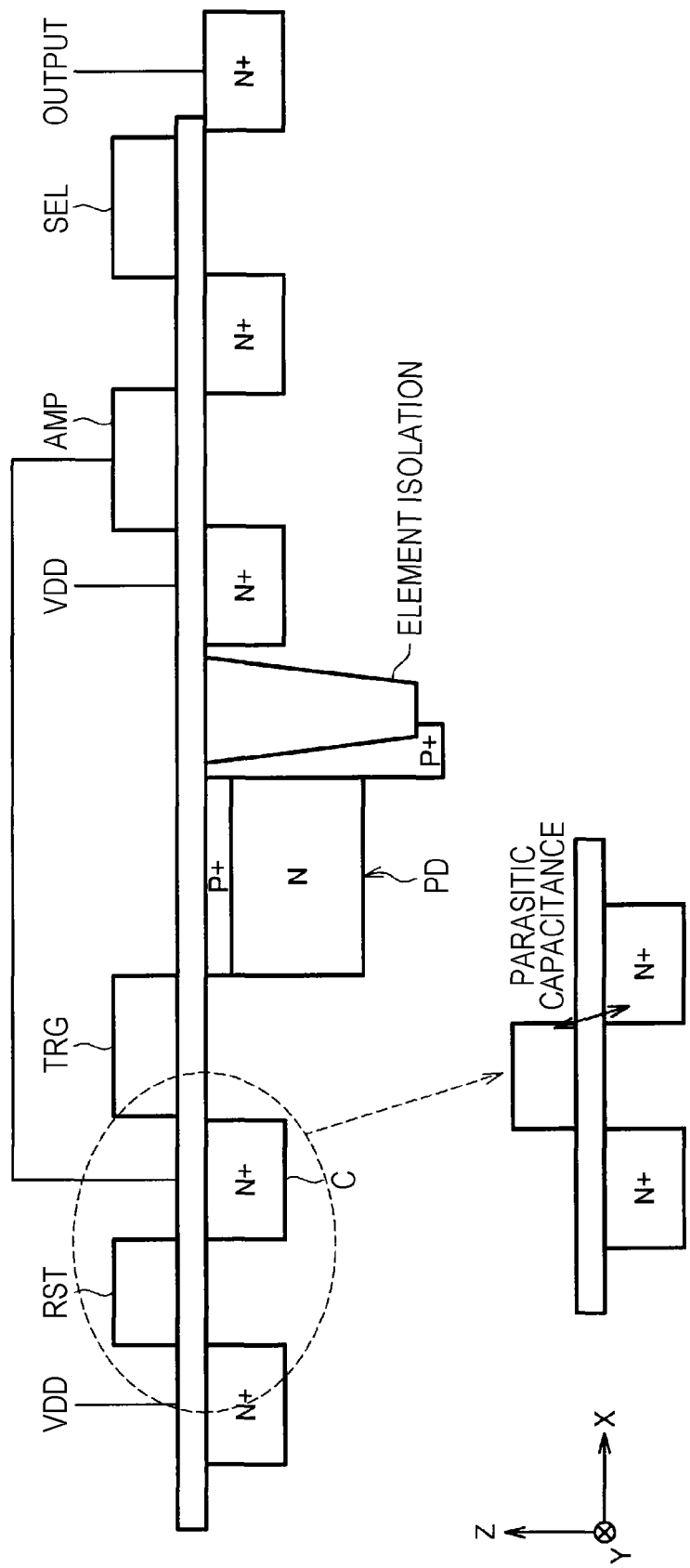
FIG. 26A is an explanatory diagram for describing an example of a structure of a unit pixel in the solid-state imaging device according to the same embodiment.

On the other hand, in a case where manufacturing variations in element is detected, the larger the above capacitive coupling, the above charge injection, and the variations thereof, the more accurately the manufacturing variations can be detected. For example, FIG. 26A is an explanatory diagram for describing an example of a structure of the unit pixels in the solid-state imaging device according to the present embodiment, and illustrates an example of a configuration of the unit pixels included in the second unit pixel group in a case where characteristics of the initialization unit are used as variation information. In a schematic diagram of an extracted portion of the initialization unit and the capacitance part of FIG. 26A, a portion illustrated as "parasitic capacitance" schematically illustrates the above capacitive coupling (that is, the parasitic capacitance between a gate and a source).

Note that kTC noise is known as thermal noise generated when the gate of a transistor is turned to be in an off state, and voltage noise in stray capacitance is represented by $(kT/C)^{1/2}$. That is, in a case where characteristics of the initialization unit are used as variation information, for example, it is only required to separately form the initialization unit and the capacitance part so that influence of the kTC noise is different between the first unit pixel group and the second unit pixel group. As a specific example, for the second unit pixel group, it is only required to form the initialization unit and the capacitance part so that the kTC noise is reduced, and the above coupling capacitance and variations thereof as well as a charge injection amount and variations thereof become larger, by controlling capacitance of the capacitance part C to be smaller.

Examples of a method for separately forming the initialization unit include changing ion implantation conditions (dose amount, energy, implantation angle, ion species, the number of implantations, and the like) by region with a photoresist, changing the shape of a gate (including a line width), and changing the film structure near elements.

Figure 26B:
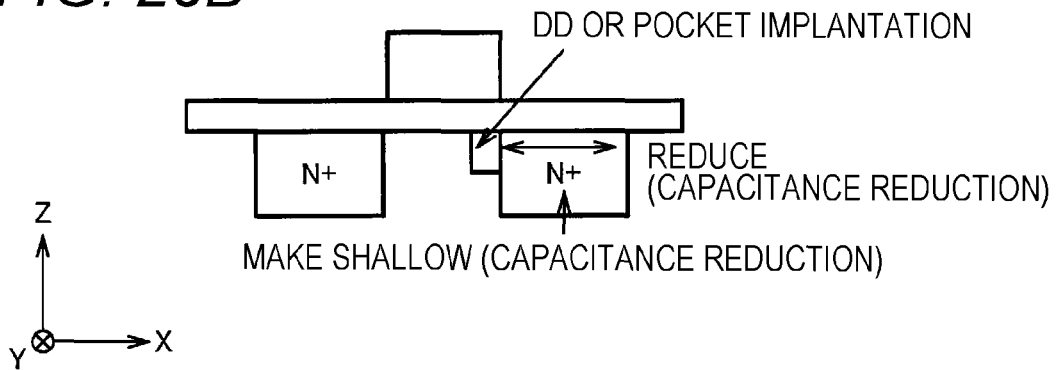
FIG. 26B is an explanatory diagram for describing an example of a structure of a unit pixel in the solid-state imaging device according to the same embodiment.

For example, FIG. 26B is an explanatory diagram for describing an example of a structure of the unit pixels in the solid-state imaging device according to the present embodiment, and illustrates an example of a configuration of the initialization unit and the capacitance part in a case where characteristics of the initialization unit are used as variation information. In a case where the capacitance value of the capacitance part C is reduced, for example, by setting a low dose, a small area, and low energy, a low electric field and a low junction area can be obtained, and the component of the PN junction capacitance can be reduced.

Furthermore, in a case where the capacitive coupling and variations thereof are increased, for example, control may be performed to increase the injection angle larger when forming a lightly-doped drain (LDD) structure. Accordingly, impurities are injected into a gate end and thus overlap capacitance with the gate increases, and since the number of ions of injected impurities depends on roughness of the gate end, it becomes possible to increase the variations in the capacitive coupling.

Furthermore, pocket injection is known as a step for improving an off-leakage characteristic of a transistor. This technique is for suppressing a short channel effect by partially implanting ions of the same type as the impurities of the substrate into the gate end. By adding such a step or increasing the dose amount, it is possible to increase the variations in the capacitive coupling similarly to a case of LDD.

Further, in the case of increasing the charge injection and variations thereof, for example, a unit capacitance increases by making the thickness of a gate insulating film of the initialization unit thinner, and thus the amount of channel charge can be increased. Furthermore, as another example, it is conceivable that the material of the gate insulating film is changed to a material other than an oxide film (for example, a nitride film), a material other than the oxide film is stacked on the gate insulating film, or nitrogen is implanted into the gate insulating film, so that the dielectric constant of the gate insulating film becomes high.

Figure 26C:
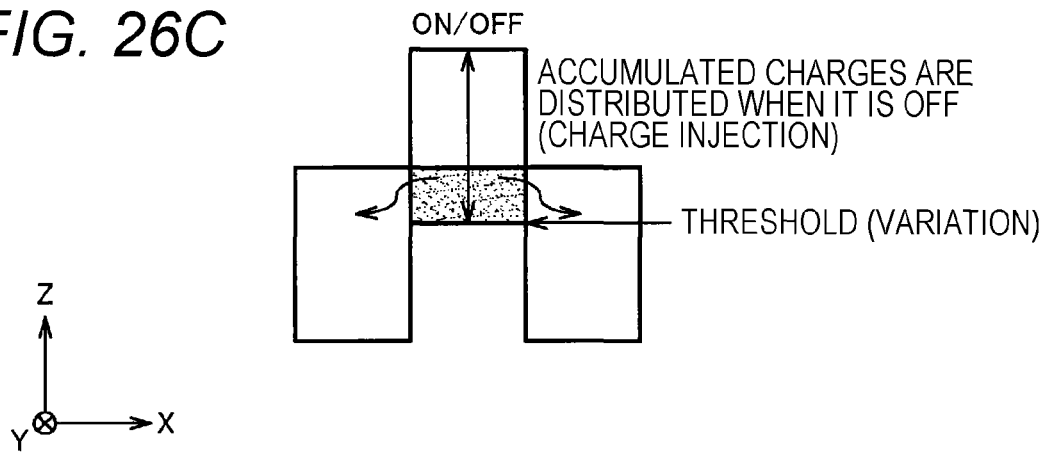
FIG. 26C is an explanatory diagram for describing an outline of a relationship between threshold value variations in an initialization unit and a charge injection and variations thereof.

Furthermore, in a case where the threshold value variations are large, a channel charge can be increased by increasing a gate area. For example, FIG. 26C is an explanatory diagram for describing an outline of a relationship between threshold value variations in the initialization unit and charge injection and variations thereof. As illustrated in FIG. 26C, the amount of charges accumulated in a transistor (for example, the initialization unit) to be distributed when the transistor is off (that is, the amount of charge injection) changes according to the threshold value of the transistor. That is, when variations in the threshold value of the initialization unit are larger, the charge injection and the variations thereof in the initialization unit tend to be larger. Note that the above threshold value corresponds to an example of electrical characteristics of the transistor.

Figure 26D:
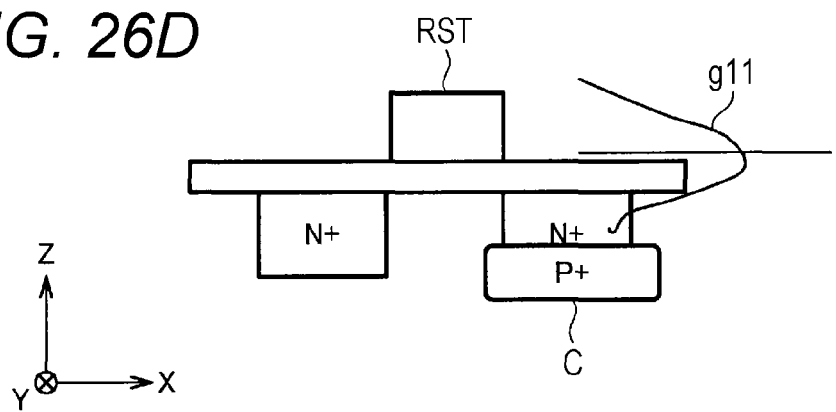
FIG. 26D is an explanatory diagram for describing an example of a method for further increasing the threshold value variations in the initialization unit.

For example, FIG. 26D is an explanatory diagram for describing an example of a method for further increasing threshold value variations in the initialization unit. As a method of increasing the threshold value variations, for example, a method of control for creating a high dose state can be mentioned. As a more specific example, there is a method of increasing a total dose amount by counter implantation of an opposite conductivity type. Furthermore, as another example, electrical characteristics of the semiconductor forming the initialization unit may be changed by using a bottom portion of a distribution of ions in a depth direction during ion implantation. For example, in FIG. 26D, reference sign g11 is a graph schematically illustrating the distribution of ions (that is, impurities) in the depth direction during ion implantation. As illustrated by the graph g11, the distribution of impurities during the ion implantation tends to exhibit a normal distribution in the depth direction. Therefore, for example, by shifting a peak position of the distribution of impurities during the ion implantation in the depth direction and using the bottom portion of the distribution (that is, the distribution illustrated by the graph g11), the control for creating a high dose state is possible.

Furthermore, the structures of the initialization unit and the capacitance part may be formed to have opposite conductivity types.

With the above-described configuration, it is possible to achieve both obtaining of a good image signal and obtaining of information of manufacturing variations in element in the initialization unit in a more preferable mode.

Furthermore, in a case where the characteristics of the initialization unit are used, the photoelectric conversion unit does not need to be formed in the unit pixels of the second unit pixel group, similarly to the example described with reference to FIG. 24B. Note that the method of configuring the unit pixels so that the photoelectric conversion unit is not formed as illustrated in FIG. 24B has already been described above, and thus detailed description thereof will be omitted. By having a configuration in which the photoelectric conversion unit is not formed (that is, a configuration not including the photoelectric conversion unit) similarly to the example illustrated in FIG. 24B, it is possible to remove the influence of the electrical characteristics of the photoelectric conversion unit (an optical signal and a dark signal). That is, the signal from the photoelectric conversion unit does not interfere with the capacitance part, and it is possible to detect the manufacturing variations in element in the initialization unit with higher accuracy.

Furthermore, in a case where characteristics of the initialization unit are used, similarly to the example described with reference to FIG. 24C, the transfer unit does not need to be formed for the unit pixels of the second unit pixel group, in addition to the above photoelectric conversion unit. Note that the method of configuring the unit pixels so that the photoelectric conversion unit and the transfer unit are not formed as illustrated in FIG. 24C has already been described above, and thus detailed description thereof will be omitted. By having a configuration in which the photoelectric conversion unit and the transfer unit are not formed (that is, the configuration not including the photoelectric conversion unit and the transfer unit) similarly to the example illustrated in FIG. 24C, it is possible to not only remove the influence of electrical characteristics of the photoelectric conversion unit (for example, an optical signal and a dark signal), but also remove the dark signal that depends on the potential of the transfer unit. Therefore, it is possible to more stably detect the manufacturing variations in element in the initialization unit.

Furthermore, in a case where the photoelectric conversion unit and the transfer unit are not formed as illustrated in FIG. 24C, regions corresponding to the photoelectric conversion unit and the transfer unit become empty, and thus the degree of freedom with respect to the configuration of the initialization unit is further improved by using the regions.

For example, FIGS. 27A and 27B are explanatory diagrams for describing examples of structures of unit pixels in the solid-state imaging device according to the present embodiment, and illustrate examples of structures of the initialization unit in a case where characteristics of the initialization unit are used as variation information. Note that FIGS. 27A and 27B illustrate examples of schematic configurations in a case where a portion of a unit pixel where an initialization unit, a capacitance part, a transfer unit, and a photoelectric conversion unit are provided is viewed from a normal direction of the substrate (that is, the z direction in FIGS. 24A and 24C).

Specifically, FIG. 27A illustrates an example of a schematic configuration of a portion where an initialization unit, a capacitance part, a transfer unit, and a photoelectric conversion unit are provided in a case where the photoelectric conversion unit and the transfer unit are formed as in the examples illustrated in FIGS. 22 and 24A. On the other hand, FIG. 27B illustrates an example of a schematic configuration of a portion where an initialization unit and a capacitance part are formed in a case where the photoelectric conversion unit and the transfer unit are not formed as in the example illustrated in FIG. 24C. Note that in the example illustrated in FIG. 27B, a region corresponding to a portion where the photoelectric conversion unit and the transfer unit are provided in the example illustrated in FIG. 27A is illustrated by a broken line. Note that in a case where the photoelectric conversion unit and the transfer unit are not formed as in the example illustrated in FIG. 27B, it is possible to configure the unit pixels so that the area of the initialization unit becomes larger by using relevant regions.

Furthermore, by changing the shape of the initialization unit as described above in the first pixel group and the second pixel group, it is also possible to detect the manufacturing variations in element in the initialization unit in a more preferable mode. For example, FIGS. 27C to 27F are explanatory diagrams for describing examples of structures of unit pixels in the solid-state imaging device according to the present embodiment, and illustrate examples of structures of the initialization unit in a case where characteristics of the initialization unit are used as variation information.

Specifically, FIG. 27C is an explanatory diagram for describing an example of a structure of an initialization unit for further increasing the manufacturing variations in element in the initialization unit, and illustrates an example of a case where shape variations in the initialization unit are changed. In FIG. 27C, a structure of a normal initialization unit is illustrated in an upper part as a comparison target. Specifically, as illustrated in a middle part of FIG. 27C, by forming a gate of the initialization unit to be smaller than that in a normal time (that is, W length, L length, or both of them are made shorter), the junction area becomes small, and it is possible to reduce the component of the PN junction capacitance. That is, with such a configuration, threshold value variations and variations in transconductance are further increased, that is, the manufacturing variations in element in the initialization unit appear to be relatively greater. Furthermore, in a case where the gate of the initialization unit is formed to be smaller than that in a normal time, the initialization unit may have a plurality of gates as illustrated in a lower part of FIG. 27C (that is, may have a plurality of transistors connected in series). With such a configuration, it is possible to increase the amount of channel charges according to the number of gates (for example, to multiply the number of times) while suppressing the capacitance of the capacitance part C to be small.

On the other hand, reaction of the initialization unit may become more sensitive to a fluctuation of the power supply voltage due to a short channel effect by making the gate smaller. In such a case, for example, the gate of the initialization unit may be formed so that the W length of the gate of the initialization unit becomes shorter (that is, the W/L ratio becomes smaller).

For example, FIG. 27D is an explanatory diagram for describing an example of a structure of the initialization unit for further increasing the manufacturing variations in element in the initialization unit, and illustrates another example of a case where shape variations in the initialization unit are changed. In FIG. 27D, a structure of a normal initialization unit is illustrated in an upper part as a comparison target. That is, as illustrated in FIG. 27D, by forming the gate of the initialization unit so that the W/L ratio becomes smaller, it becomes possible to suppress manifestation of a short channel effect and suppress capacitance of the capacitance part C to be small.

Furthermore, in a case where the photoelectric conversion unit and the transfer unit are not formed as described with reference to FIG. 27B, regions corresponding to the photoelectric conversion unit and the transfer unit become empty, and thus the degree of freedom with respect to the configuration of the initialization unit is further improved by using the regions. Therefore, as described above, it is also possible to configure the unit pixels so that the area of the initialization unit becomes larger.

For example, FIG. 27E is an explanatory diagram for describing an example of a structure of the initialization unit for further increasing the manufacturing variations in element in the initialization unit, and illustrates another example of a case where shape variations in the initialization unit are changed. The example illustrated in FIG. 27E is an example of a case where the initialization unit is formed so that the W length on a drain side is longer than the other (that is, a source side on which the capacitance part C is formed). With such a configuration, it is possible to increase the amount of channel charges (for example, to multiply the amount) while suppressing the capacitance of the capacitance part C to be small.

Figure 27F:
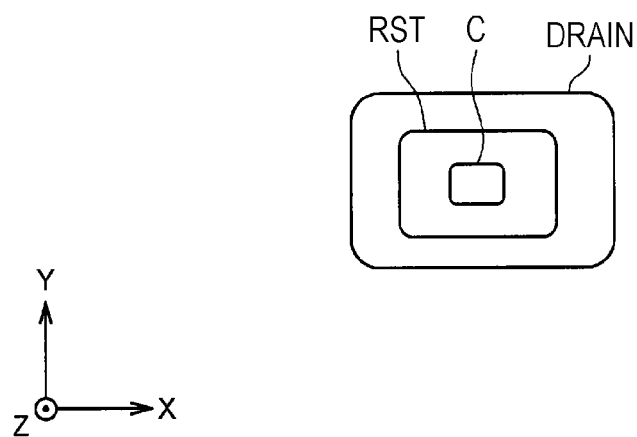
FIG. 27F is an explanatory diagram for describing an example of a structure of a unit pixel in the solid-state imaging device according to the same embodiment.

Furthermore, FIG. 27F is an explanatory diagram for describing an example of a structure of the initialization unit for further increasing the manufacturing variations in element in the initialization unit, and illustrates another example of a case where shape variations in the initialization unit are changed. Specifically, the example illustrated in FIG. 27F is an example of a case where a gate of the initialization unit is formed in a ring shape, the capacitance part C is formed inside the ring, and an outside of the ring is used as a drain. With such a configuration, similarly to the example illustrated in FIG. 27E, the initialization unit is formed so that the W length on the drain side is longer than the other (that is, the source side on which the capacitance part C is formed). Therefore, it is possible to increase the amount of channel charges according to the number of gates (for example, to multiply the amount) while suppressing the capacitance of the capacitance part C to be small.

Furthermore, as a technique for increasing area efficiency of the unit pixels, what is called pixel sharing is known in which one set of a capacitance part, an amplification unit, an initialization unit, and a selection unit is arranged for a plurality of sets of a photoelectric conversion unit and a transfer unit in the unit pixels. In such a configuration, capacitance parts may be divided and arranged without being shared between the transfer unit and the initialization unit, and the capacitance parts that are divided and arranged may be connected by wiring. In such a case, it is possible to reduce the capacitance by separately forming wiring patterns or by separating the capacitance part that is adjacent to the transfer unit.

Figure 28A:
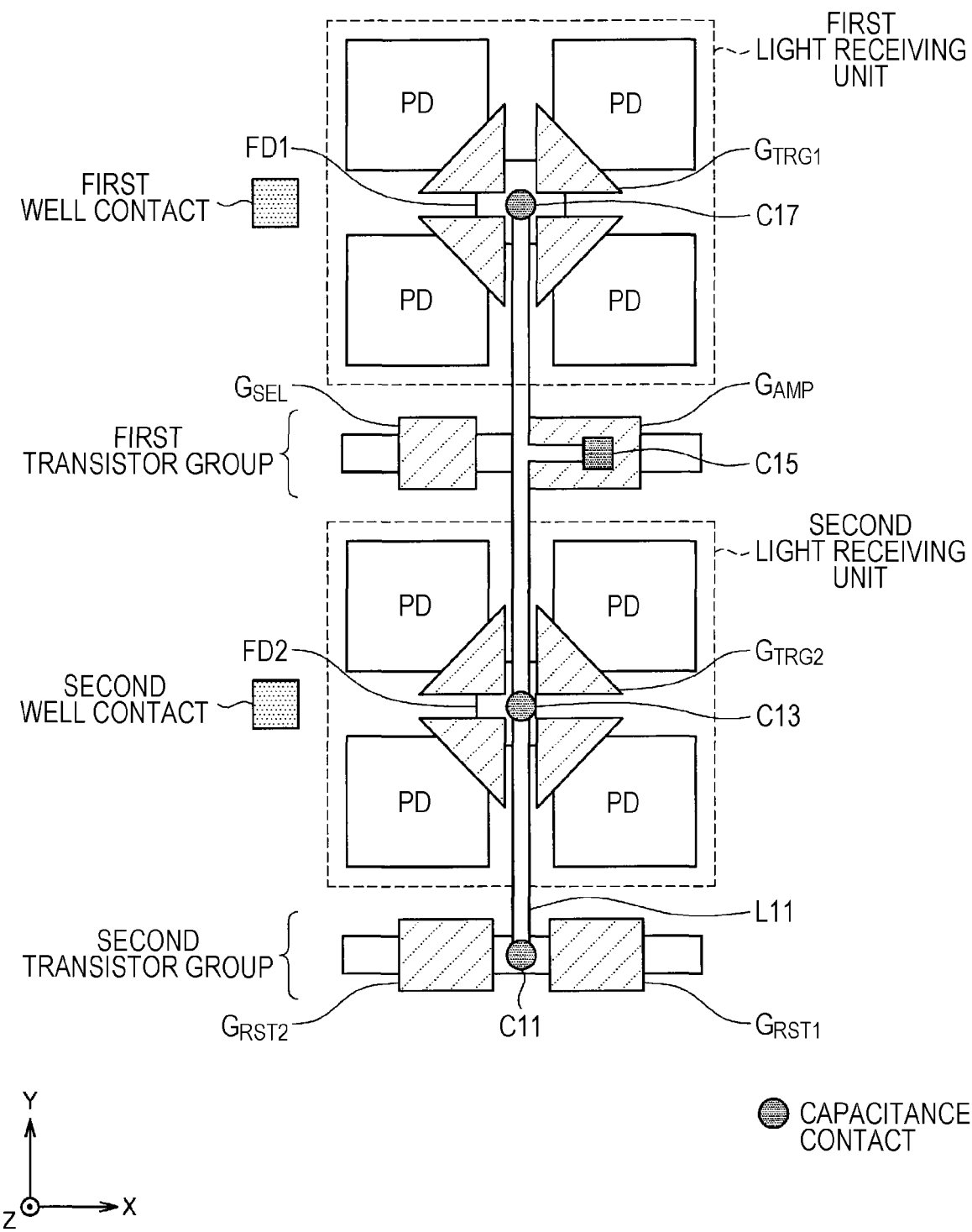
FIG. 28A is an explanatory diagram for describing an example of a structure of a unit pixel in the solid-state imaging device according to the same embodiment.
Figure 28B:
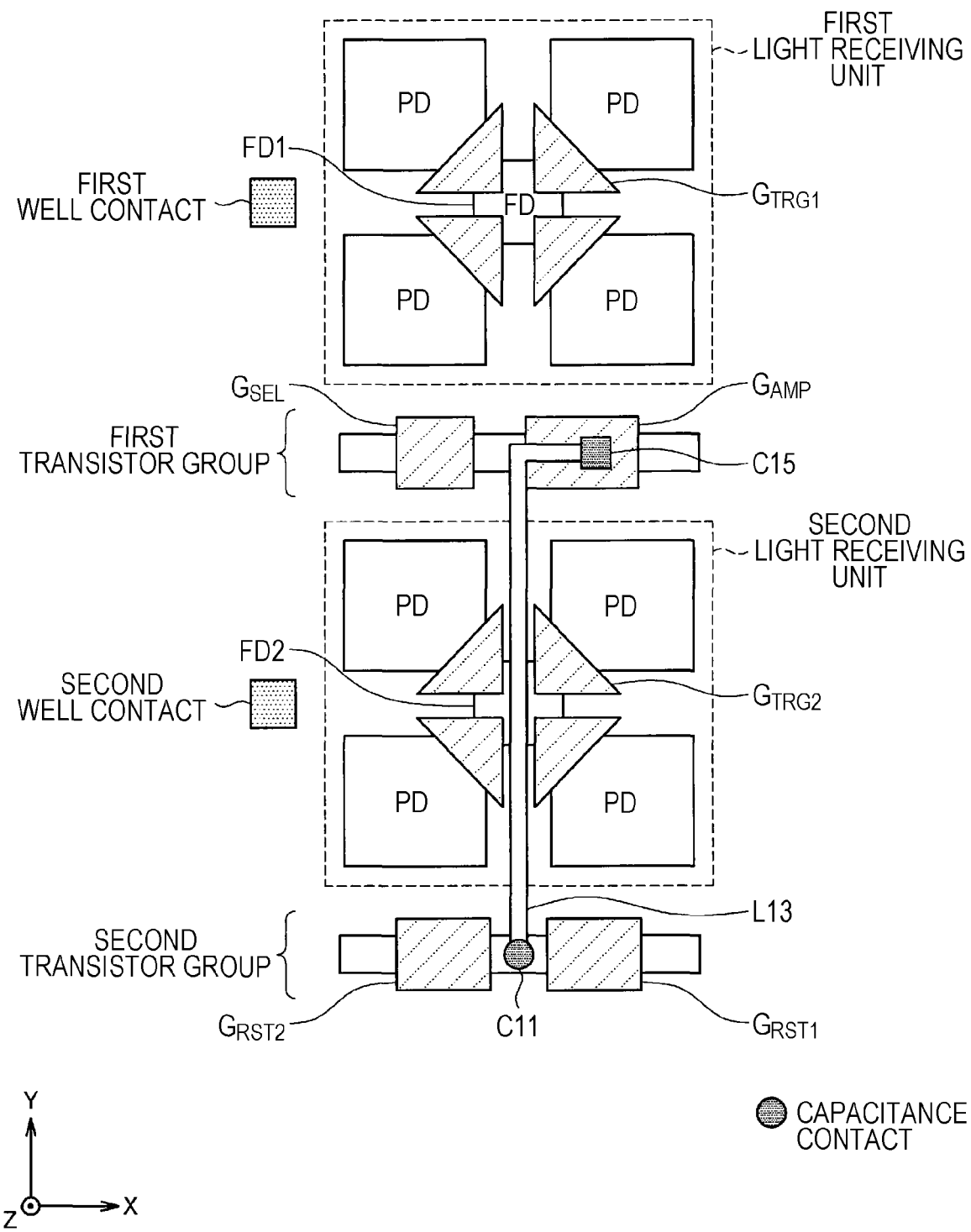
FIG. 28B is an explanatory diagram for describing an example of a structure of a unit pixel in the solid-state imaging device according to the same embodiment.

For example, FIGS. 28A and 28B are explanatory diagrams for describing examples of structures of unit pixels in the solid-state imaging device according to the present embodiment, and illustrate an example of separately forming wiring patterns in a case where characteristics of the initialization unit are used as variation information.

Specifically, FIG. 28A illustrates an example of an electrical connection relationship (that is, a wiring pattern) among elements included in the first unit pixel in this unit pixel group.

In FIG. 28A, reference sign PD indicates a photodiode corresponding to the photoelectric conversion unit. Further, reference signs FD1 and FD2 each indicate a floating diffusion part. Furthermore, a first transistor group includes an amplification unit and a selection unit. That is, reference sign $G_{AMP}$ indicates a gate of the amplification unit, and reference sign $G_{SEL}$ indicates a gate of the selection unit. Furthermore, a second transistor group includes an initialization unit. That is, each of reference signs GRST1 and GRST2 indicates a gate of the initialization unit. Furthermore, reference sign GTRG1 indicates a gate of the transfer unit connected to the photoelectric conversion units PD disposed in a first light receiving unit. That is, signal charges from each of the photoelectric conversion units PD disposed in the first light receiving unit are transferred to the floating diffusion part FD1 via the transfer unit. Similarly, reference sign GTRG2 indicates a gate of the transfer unit connected to the photoelectric conversion units PD disposed in a second light receiving unit. That is, signal charges from each of the photoelectric conversion units PD disposed in the second light receiving unit are transferred to the floating diffusion part FD2 via the transfer unit.

Furthermore, reference signs C11 to C17 each indicate a capacitance contact, and reference sign L11 indicates a wiring that electrically connects the respective elements via each of the capacitance contacts C11 to C17. That is, in the example illustrated in FIG. 28A, the wiring L11 electrically connects the second transistor group, the second light receiving unit, the first transistor group, and the first light receiving unit via each of the capacitance contacts C11 to C17.

On the other hand, FIG. 28B illustrates an example of an electrical connection relationship (that is, a wiring pattern) between elements included in the second unit pixel group in this unit pixel group. In FIG. 28B, components indicated by reference signs common to FIG. 28A are similar to components indicated by these reference signs in FIG. 28A. That is, in the example illustrated in FIG. 28B, the wiring indicated by reference sign L13 electrically connects between the first transistor group and the second transistor group, and is not connected to each of the first light receiving unit and the second light receiving unit. That is, the example illustrated in FIG. 28B has a different wiring pattern from the example illustrated in FIG. 28A. With such a configuration, in the example illustrated in FIG. 28B, it is possible to separate the capacitance part adjacent to the initialization unit (that is, the initialization unit corresponding to each of the gates GRST1 and GRST2) included in the second transistor group from the floating diffusion parts FD1 and FD2, and it is possible to suppress the capacitance of the capacitance part to be small.

The example of the configuration of the second unit pixel group in a case where characteristics of the initialization unit (that is, the reset transistor RST) are used as variation information has been described above.

Example of Case where Characteristics of Amplification Unit are Used

Next, an example of a configuration of the second unit pixel group (for example, a configuration of unit pixels included in the second unit pixel group) in a case where characteristics of the amplification unit (that is, the amplification transistor AMP) are used as variation information will be described.

Generally, in the solid-state image sensor, it is desirable that operating points of the amplification unit are aligned among a plurality of unit pixels in consideration of linearity and dynamic range of an image signal. In other words, it is desirable that threshold value variations in the amplification unit are smaller among the plurality of unit pixels. Furthermore, the larger the transconductance of the amplification unit, the more advantageous it is to responsiveness of output, and the overdrive voltage can be suppressed to a smaller value, which is also advantageous from the viewpoint of dynamic range.

On the other hand, in a case where manufacturing variations in element are detected, the larger the threshold value variations in the amplification unit, the more accurately the manufacturing variations can be detected. That is, in this case, for example, the amplification unit is separately formed in the first unit pixel group and the second unit pixel group so that variations in the threshold value and transconductance of the amplification unit are different.

Examples of a method for separately forming the amplification unit include changing ion implantation conditions (dose amount, energy, implantation angle, ion species, the number of implantations, and the like) by region with a photoresist, changing the shape of a gate (including a line width), and changing the film structure near elements.

As a specific example, in order to increase threshold value variations and variations in transconductance, similarly to the example of the initialization unit described with reference to FIG. 27C, a gate may be formed smaller than in a normal time (that is, W length, L length, or both of them are made shorter), thereby making processing variations appear to be relatively large. On the other hand, similarly to the example of the initialization unit, reaction of the initialization unit may become more sensitive to a fluctuation of the power supply voltage due to a short channel effect by making the gate smaller. In this case, similarly to the example of the initialization unit described with reference to FIG. 27D, the gate of the amplification unit may be formed so that the W length of the gate of the amplification unit becomes shorter (that is, the W/L ratio becomes smaller).

Furthermore, as another example, similarly to the example of the initialization unit described with reference to FIG. 27E, the amplification unit may be formed so that the W length on the drain side is longer than the other (that is, the source side). Furthermore, similarly to the example of the initialization unit described with reference to FIG. 27F, the gate of the amplification unit may be formed in a ring shape, the inside of the ring may be the source, and the outside of the ring may be the drain. Therefore, it is also possible to form the amplification unit so that the W length on the drain side is longer than the other (that is, the source side).

Figure 29A:
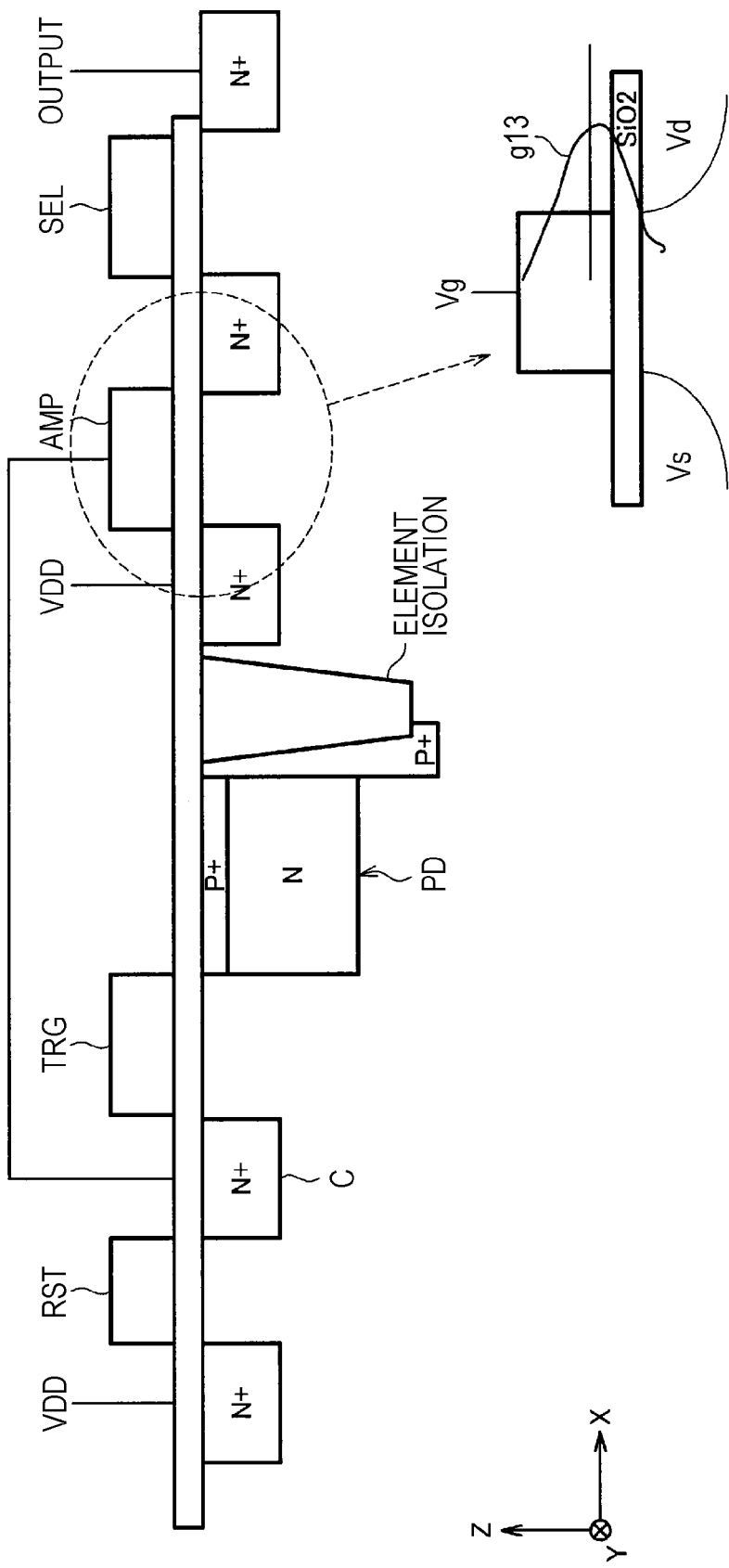
FIG. 29A is an explanatory diagram for describing an example of a method for further increasing threshold value variations in an amplification unit.

Furthermore, electrical characteristics of the semiconductor forming the amplification unit may be changed. For example, when it is controlled to create a high dose state so that impurity concentration (the number of ions) of the channel is high, dispersion of channel implantation increases according to the Poisson distribution. As a more specific example, there is a method of increasing a total dose amount by counter implantation of an opposite conductivity type. Furthermore, as another example, a bottom portion of distribution of ions in a depth direction during ion implantation may be used. For example, FIG. 29A is an explanatory diagram for describing an example of a method for increasing threshold value variations in the amplification unit. In FIG. 29A, reference sign g13 denotes a graph schematically illustrating distribution of ions (that is, impurities) in the depth direction at the time of ion implantation. As illustrated by the graph g13, the distribution of impurities during the ion implantation tends to exhibit a normal distribution in the depth direction. Therefore, for example, by shifting a peak position of the impurity distribution during the ion implantation in the depth direction and using the bottom portion of the distribution (that is, the distribution illustrated by the graph g13), control to create a high dose state is possible. Note that the above-described control can be performed, for example, in the step of implanting impurities for channel adjustment or the step of implanting impurities during well formation.

Furthermore, the gate insulating film may be formed to have a stacked structure (for example, $SiO_2$, SiC, and the like) of a plurality of films having different film qualities. With such a configuration, fixed charges are generated at an interface, and the number of fixed charges is not constant, which may be a factor of variation. Furthermore, the amount of channel charges may be increased by reducing the thickness of the gate insulating film, or the material of the gate insulating film may be changed to a material other than the oxide film (for example, a nitride film) so that the dielectric constant of the gate insulating film is increased.

Furthermore, it is also possible to increase manufacturing variations by separately forming the structure of a gate end of the amplification unit between the first unit pixel group and the second unit pixel group. Specifically, it is possible to increase manufacturing variations (for example, variations in capacitive coupling) by increasing an implantation angle when forming the LDD structure or an implantation angle of pocket implantation, or by increasing the dose amount.

Furthermore, the structure of the amplification unit may be formed to have the opposite conductivity type.

With the configuration as described above, it is possible to achieve both obtaining of a good image signal and obtaining of information of the manufacturing variations in element in the amplification unit in a more preferable mode.

Furthermore, an electric field is generated between terminals of the amplification unit due to different terminal voltages. At this time, if an electric field is applied between gate and drain, between gate and source, and between gate and bulk, reliability of the insulating film may deteriorate (oxide film destruction over time). In such a case, a low electric field can be generated by forming the insulating film thicker, for example. Furthermore, in a case of reducing noise, higher carrier density in the channel is better, and thus the insulating film may be formed thinner or the dielectric constant may be increased. At this time, the first unit pixel group and the second unit pixel group may have the same or different read paths of signals from the unit pixels. Note that in a case where the first unit pixel group and the second unit pixel group have different read paths of signals from the unit pixels, it is possible to individually adjust operating ranges of the first unit pixel group and the second unit pixel group by having a dedicated signal line, a multiplexer, and a common A/D conversion unit that are connected only to the second unit pixel group.

Furthermore, in a case where the characteristics of the amplification unit are used, the photoelectric conversion unit does not need to be formed in the unit pixels of the second unit pixel group, similarly to the example described with reference to FIG. 24B. Note that the method of configuring the unit pixels so that the photoelectric conversion unit is not formed as illustrated in FIG. 24B has already been described above, and thus detailed description thereof will be omitted. By having a configuration in which the photoelectric conversion unit is not formed (that is, a configuration not including the photoelectric conversion unit) similarly to the example illustrated in FIG. 24B, it is possible to remove the influence of the electrical characteristics of the photoelectric conversion unit (an optical signal and a dark signal). That is, the signal from the photoelectric conversion unit does not interfere with the capacitance part, and it is possible to detect the manufacturing variations in element in the amplification unit with higher accuracy.

Furthermore, in a case where characteristics of the amplification unit are used, similarly to the example described with reference to FIG. 24C, the transfer unit does not need to be formed in addition to the above photoelectric conversion unit, for the unit pixels of the second unit pixel group. Note that the method of configuring the unit pixels so that the photoelectric conversion unit and the transfer unit are not formed as illustrated in FIG. 24C has already been described above, and thus detailed description thereof will be omitted. By having a configuration in which the photoelectric conversion unit and the transfer unit are not formed (that is, the configuration not including the photoelectric conversion unit and the transfer unit) similarly to the example illustrated in FIG. 24C, it is possible to not only remove the influence of electrical characteristics of the photoelectric conversion unit (for example, an optical signal and a dark signal), but also remove the dark signal that depends on the potential of the transfer unit. Therefore, it is possible to more stably detect the manufacturing variations in element in the amplification unit.

Furthermore, in a case where characteristics of the amplification unit are used, if the photoelectric conversion unit and the transfer unit are not formed, the connection relationship of wiring to be connected to the gate of the amplification unit may be different between the first unit pixel group and the second unit pixel group.

For example, FIG. 29B is an explanatory diagram for describing an example of a structure of the unit pixels in the solid-state imaging device according to the present embodiment, and illustrates an example of a configuration of unit pixels included in the second unit pixel group in a case where characteristics of the amplification unit are used as variation information. Specifically, in the example illustrated in FIG. 29B, the unit pixel is formed so that gate potential is directly applied to the gate of the amplification unit without passing through the initialization unit or the capacitance part. Note that in a case where the degree of freedom in layout is low, the power supply voltage may be directly applied to the gate of the amplification unit by directly connecting the gate and the power supply. With such a configuration, it is possible to not only remove the influence of electrical characteristics of the photoelectric conversion unit (for example, an optical signal and a dark signal), but also remove the dark signal depending on the potential of the transfer unit and the dark signal of the capacitance part. Moreover, since it is not necessary to connect the initialization unit and the amplification unit, the influence of capacitive coupling and charge injection is further reduced (and furthermore the influence is eliminated). Furthermore, since it is not necessary to connect the initialization unit and the amplification unit, the structure is more simplified as compared with the unit pixels included in the first unit pixel group, and thus an effect of improving the yield can also be expected.

Figure 29C:
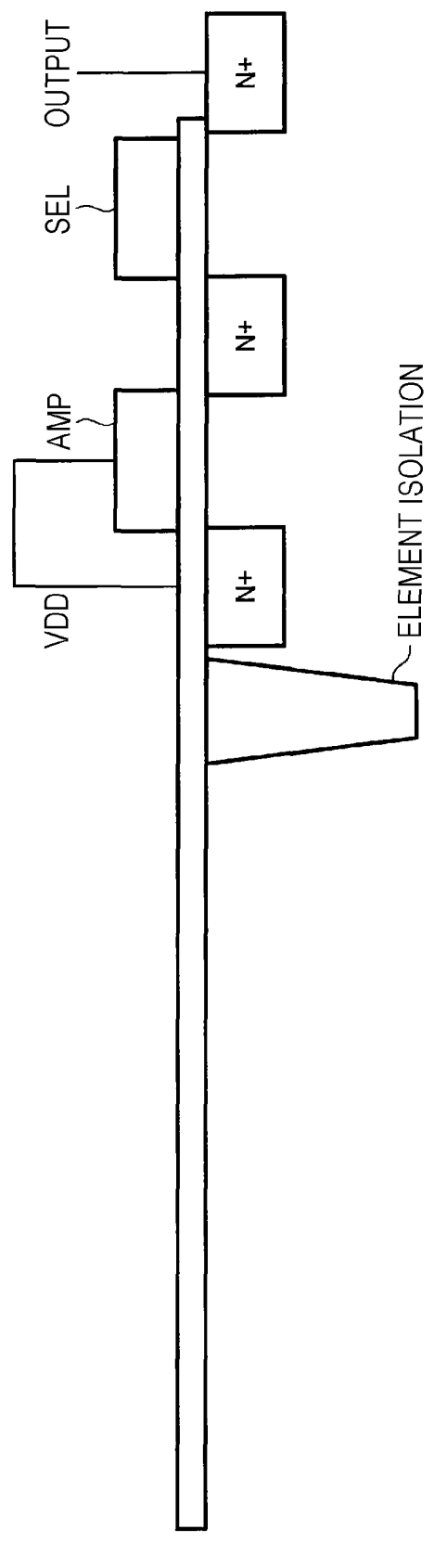
FIG. 29C is an explanatory diagram for describing an example of a structure of a unit pixel in the solid-state imaging device according to the same embodiment.

Furthermore, in a case where the unit pixel is formed so that gate potential is directly applied to the gate of the amplification unit as in the example illustrated in FIG. 29B, a configuration may be employed in which the capacitance part and the initialization unit are not formed. For example, FIG. 29C is an explanatory diagram for describing an example of a structure of the unit pixels in the solid-state imaging device according to the present embodiment, and illustrates an example of a configuration of unit pixels included in the second unit pixel group in a case where characteristics of the amplification unit are used as variation information. As can be seen by comparing FIG. 29C with FIG. 29B, it can be seen that not only the photoelectric conversion unit and the transfer unit but also the capacitance part and the initialization unit are not formed.

Furthermore, the description has been given above focusing on the amplification unit, but an element having an amplifying operation connected to the path leading to the signal conversion unit, that is, an element capable of ensuring an overdrive voltage (for example, a clip circuit, a selection unit with a gate to which an intermediate potential is applied, or the like) may be separately formed in the first unit pixel group and the second unit pixel group, similarly to the above-described amplification unit.

The example of the configuration of the second unit pixel group in a case where characteristics of the amplification unit (that is, the amplification transistor AMP) are used as variation information has been described above.

Example of Case where Characteristics of Comparator are Used

Next, an example of a configuration of comparators in a case where characteristics of the comparators individually connected to the first unit pixel group and the second unit pixel group, respectively, are used as variation information will be described.

Figure 30A:
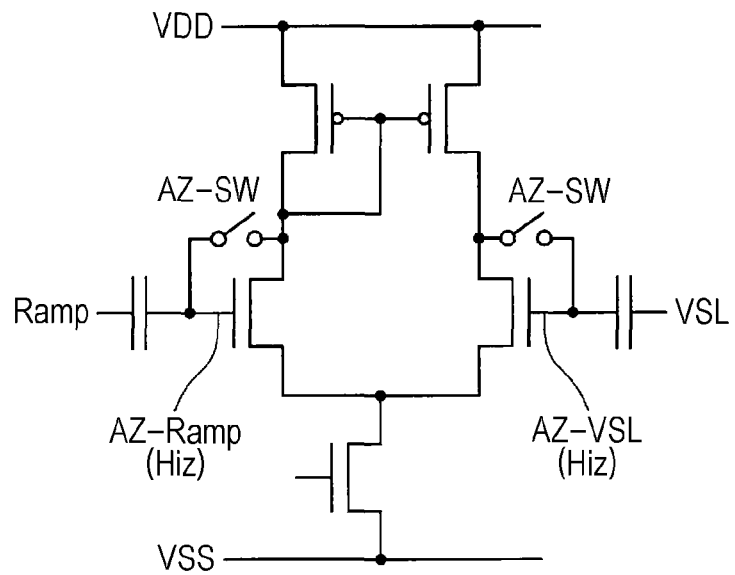
FIG. 30A is a diagram illustrating an example of a schematic circuit configuration of a comparator applied to a solid-state image sensor according to the same embodiment.

Generally, in the solid-state image sensor, it is desirable that operating points of the respective comparators are aligned in consideration of linearity and dynamic range of an image signal. Therefore, for example, in order to enable an operation to short circuit inputs and outputs of a differential pair of comparators to align reference levels, switches are provided between the inputs and outputs of the comparators, and small size transistors are used so that the influence of capacitive coupling and charge injection is small when the switches are turned off. For example, FIG. 30A is a diagram illustrating an example of a schematic circuit configuration of a comparator applied to the solid-state image sensor according to the present embodiment, and illustrates an example of a comparator connected to the first unit pixel group. In FIG. 30A, switches indicated by reference sign AZ-SW correspond to the switches (what is called auto-zero switches) provided for short-circuiting the inputs and outputs of the differential pair of the comparators described above.

On the other hand, in a case where variations in operating points of the comparators are detected as manufacturing variations in element, the greater the variations in the operating points of the comparators, the more accurately the variations can be detected. That is, in this case, for example, respective comparators are separately formed so that the variations in the operating points differs between the comparators connected to the first unit pixel group and the comparators connected to the second unit pixel group.

Figure 30B:
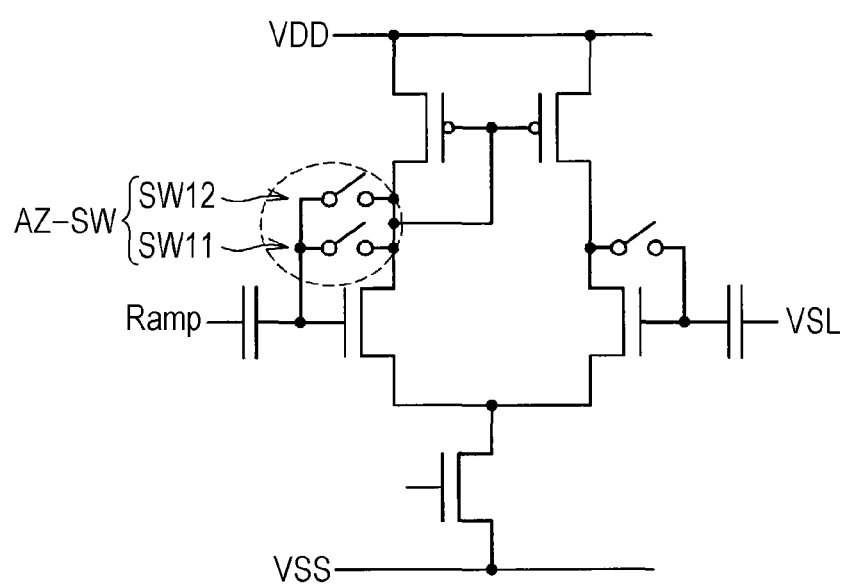
FIG. 30B is a diagram illustrating an example of a schematic circuit configuration of a comparator applied to the solid-state image sensor according to the same embodiment.

For example, FIG. 30B is a diagram illustrating an example of a schematic circuit configuration of a comparator applied to the solid-state image sensor according to the present embodiment, and illustrates an example of a comparator connected to the second unit pixel group. As can be seen from comparison with FIG. 30A, the example illustrated in FIG. 30B is different from the example illustrated in FIG. 30A in configuration of a switch AZ-SW provided on a side where ramp waveform (Ramp) is input, out of two switches AZ-SW connected to the differential pair of comparators. Specifically, the switch indicated by reference sign SW11 in FIG. 30B corresponds to the switch AZ-SW provided on the side where the ramp waveform (Ramp) is input in FIG. 30A. That is, in the example illustrated in FIG. 30B, in addition to the switch SW11, a switch SW12 is additionally provided so as to be connected in parallel to the switch SW11.

As the switch SW11, a switch similar to a normal auto-zero switch (that is, the switch AZ-SW illustrated in FIG. 30A) (for example, a switch with a small variations in operating point) is applied. On the other hand, as the switch SW12, one having larger variations in operating point is applied. Note that the switch SW12 may include, for example, a transistor. In this case, for example, characteristics such as a threshold value can be varied by a method similar to that of the initialization unit and the amplification unit described above. As a specific example, a larger-sized transistor may be applied as the switch SW12.

With such a configuration, in the example illustrated in FIG. 30B, the switch SW11 is driven similarly to a normal auto-zero switch (that is, driven similarly to the switch AZ-SW illustrated in FIG. 30A). On the other hand, it is only required that driving of the switch SW12 is controlled so as to switch to an on state when characteristics of the comparator are varied. That is, it is only required that the switch SW12 is controlled to be in an off state when functioning as a normal auto-zero switch, and that the switch SW12 is controlled to be in an on state when variation information is output.

Note that the switch SW11 and the additional switch SW12 may be connected in series. Also in this case, by applying a switch having larger variations in operating point as the switch SW12, it is possible to further increase variations in operating point of the comparator as compared with the case where only the switch SW11 is provided. Note that in this case, it is just necessary that the additional switch SW12 is always controlled to be in an on state.

Furthermore, in the example illustrated in FIG. 30B, the additional switch SW12 is provided only on the side where the ramp wave (Ramp) is input in the differential pair of comparators, but it is not necessarily limited only to such a configuration. As a specific example, an additional switch SW12 may be provided on the side where the output line (VSL) is connected. Furthermore, additional switches SW12 may be provided on both the side where the ramp wave (Ramp) is input and the side where an output line (VSL) is connected.

With the configuration described above, in the portion provided with the additional switch SW12, it is possible to increase variations due to capacitive coupling and charge injection when the switch is turned off. This makes it possible to accurately detect variations in the operating points of the comparators as manufacturing variations in element.

The examples of the configuration of the comparators in a case where characteristics of the comparators individually connected to the first unit pixel group and the second unit pixel group, respectively, are used as variation information have been described above.

(Supplement)

Note that the above is an example, and the configuration of the solid-state imaging device according to the present embodiment is not particularly limited as long as a structure of at least a part of components that the respective groups have in common or a structure of at least a part of components related in common to the respective groups is different in the first unit pixel group and the second unit pixel group. That is, portions to be made different in structure and a method of making a structure different are not particularly limited as long as the structure of a portion related to an element used as variation information is different according to characteristics of the element in the first unit pixel group and the second unit pixel group. Note that examples of portions as targets to be made different in structure in the first unit pixel group and the second unit pixel group include a metal portion of each element, wiring, or the like, a portion of an insulator such as an oxide film, a portion of a semiconductor that constitutes a transistor and the like, and the like. Furthermore, an example of the method of making the structure of the target portions different in the first unit pixel group and the second unit pixel group is a method for making a difference in circuit configurations (for example, presence or absence of a part of elements, or the like), shapes of elements, electrical characteristics of elements, a connection relationship between elements, and the like. In particular, regarding the semiconductor, as described above, it is possible to control electrical characteristics according to, for example, the concentration and distribution of impurities.

5.3. Evaluation

As described above, the solid-state image sensor according to the present embodiment includes a plurality of unit pixels disposed in a two-dimensional array and a drive control unit. The drive control unit controls a first drive to output signals from the unit pixels included in a first unit pixel group of the plurality of unit pixels as an image signal, and a second drive to detect variations in respective signals from two or more of the unit pixels included in a second unit pixel group of the plurality of unit pixels. Furthermore, the first unit pixel group and the second unit pixel group are different in structures from each other. In other words, in the first unit pixel group and the second unit pixel group, a structure of at least a part of components that the respective groups have in common or a structure of a component related in common to the respective groups is different. As a specific example, in the first unit pixel group and the second unit pixel group, structures of the unit pixels included in the respective groups (for example, the circuit configuration, the electrical characteristics of at least a part of elements) are different.

With the configuration as described above, in the solid-state image sensor according to the present embodiment, it is possible to achieve both obtaining of a good image signal and obtaining of variation information (for example, information used for generating a value unique to the solid-state image sensor) in a more preferable mode.

6. APPLICATION EXAMPLE

Next, application examples of the solid-state imaging device according to the present disclosure will be described.

6.1. Application Example to Biometric Authentication

As an application example of the technology according to the present disclosure, an example of a case where the solid-state imaging device 1 according to one embodiment of the present disclosure is applied to biometric authentication using what is called biometric information will be described. In the present setup, "biometric information" refers to information representing characteristics of human body, such as an iris, fingerprint, vein, face, handprint, voiceprint, pulse wave, and retina, for example.

Configuration Example 1: Example of Configuration for Performing Biometric Authentication in Solid-State Imaging Device First, with reference to FIG. 31, regarding an example of a functional configuration of an imaging device to which the solid-state imaging device according to the present application example is applied, particularly an example of a case where biometric authentication is performed in the solid-state imaging device will be described. FIG. 31 is an explanatory diagram for describing an application example of the technology according to the present disclosure, and is a block diagram illustrating an example of a schematic functional configuration of an imaging device according to the present application example.

As illustrated in FIG. 31, an imaging device 710a according to the present application example includes a solid-state image sensor 711a and a main processor 731a.

The solid-state image sensor 711a corresponds to the solid-state imaging device 1 according to one embodiment of the present disclosure described above. As illustrated in FIG. 31, the solid-state image sensor 711a includes a sensor unit 712, an information processing unit 713, a storage unit 719, and an information output unit 720. Furthermore, although not illustrated in FIG. 31, the solid-state image sensor 711a may include a register interface that transmits and receives set values to and from the outside. Here, the "outside" means a recording medium that stores image information generated by the image sensor, a network for transmitting the image information, and a main processor that processes the image information or an imaging device main body such as a digital camera, a personal computer (PC), a mobile terminal, a game device, a non-contact type IC card such as FeliCa (registered trademark), a USB memory, and the like.

The sensor unit 712 corresponds to the pixel array 3 described with reference to FIG. 1 and photoelectrically converts light from a subject into an electrical signal.

The information processing unit 713a processes the obtained information as needed. As illustrated in FIG. 31, the information processing unit 713a includes, for example, an image information obtainment unit 714, a biometric information obtainment unit 715, a biometric judgment unit 741, a biometric authentication unit 742, a unique information obtainment unit 716, a unique value arithmetic unit 717, and an encryption processing unit 718.

The image information obtainment unit 714 performs, on the basis of light of a subject imaged by the user, analog-digital conversion (A/D conversion) for converting an electrical signal photoelectrically converted by the sensor unit 712 from an analog signal to a digital signal, so as to obtain image information.

The biometric information obtainment unit 715 performs A/D conversion of the electrical signal photoelectrically converted by the sensor unit 712 on the basis of light of a subject imaged for biometric authentication of the user, so as to obtain biometric information.

The unique information obtainment unit 716 obtains information unique to a device that constitutes the solid-state image sensor 711 (hereinafter, also referred to as "unique information"). For example, as described above in the second embodiment, the unique information obtainment unit 716 may obtain, as unique information, a pixel value of one or more pixels included in at least a part of the region (for example, OPB region) among the plurality of pixels forming the sensor unit 712. Furthermore, at this time, the unique information obtainment unit 716 may specify, for example, a pixel or a block including one or more pixels for which unique information is to be obtained on the basis of information stored in advance in a storage unit 719 described later.

The unique value arithmetic unit 717 receives the unique information obtained by the unique information obtainment unit 716 as an input, and generates (or calculates) a value unique to the solid-state image sensor 711 on the basis of a predetermined function (for example, the PUF described above). As a specific example, as described above in the second embodiment, the unique value arithmetic unit 717 may receive a pixel value of a predetermined pixel obtained as the unique information as an input, and generate a PUF value unique to the solid-state image sensor 711.

The biometric judgment unit 751 judges whether or not the biometric information obtained by the biometric information obtainment unit 715 is capable of authenticating the user.

The biometric authentication unit 752 compares the biometric information judged to be capable of authenticating the user with reference information stored in the predetermined storage area (for example, the storage unit 719 described later), and authenticates whether or not the user is eligible for use. Note that the reference information may be encrypted on the basis of, for example, a value (for example, PUF value) unique to the solid-state image sensor 711 generated by the unique value arithmetic unit 717. In this case, the biometric authentication unit 752 may obtain a value unique to the solid-state image sensor 711 from the unique value arithmetic unit 717, and decrypt the reference information on the basis of the obtained value.

The encryption processing unit 718 encrypts biometric authentication information that has been authenticated as that of a person who is eligible to use to generate encryption information, and sends the encryption information to the information output unit 720. Note that key information for the encryption may be encrypted on the basis of a value (for example, PUF value) unique to the solid-state image sensor 711 generated by the unique value arithmetic unit 717, for example. In this case, the encryption processing unit 718 may obtain a value unique to the solid-state image sensor 711 from the unique value arithmetic unit 717, and decrypt the key information on the basis of the obtained value.

The information output unit 720 outputs various information output from the information processing unit 713a to the outside of the solid-state image sensor 711a, and includes, for example, an output switching unit 721 and an image information output unit 722.

The output switching unit 721 switches which information is output to the outside of the solid-state image sensor 711a according to the type of information input from the information processing unit 713a. That is, it has a role of a switch for switching the output destination. By the solid-state image sensor 711a including the output switching unit 721, the user can select whether or not to output image information illustrated below or to output encryption information.

For example, when the output switching unit 721 has selected to output the encryption information, the output switching unit 721 performs control so that the encryption information generated by the encryption processing unit 718 (for example, encrypted biometric authentication information) is transmitted to the main processor 731a via a register interface (not illustrated) or the like.

When the output switching unit 721 has selected to output the image information, the image information output unit 722 receives image information obtained by the image information obtainment unit 714, and outputs the image information to the outside of the solid-state image sensor 711a.

The main processor 731a receives image information or encryption information from the solid-state image sensor 711a, and executes various processes according to the type of the received information. As illustrated in FIG. 31, the main processor 731a includes a main control unit 732, an image information input unit 733, and a development processing unit 734.

The main control unit 732 controls operation of each component of the imaging device 710a. For example, in order to cause the solid-state image sensor 711a to execute each function, the main control unit 732 transmits a control signal corresponding to the function to the solid-state image sensor 711a. Furthermore, in order to implement each function of the main processor 731a, the main control unit 732 transmits a control signal corresponding to the function to each unit in the main processor 731a.

The image information input unit 733 obtains image information output from the solid-state image sensor 711a in response to the control signal from the main control unit 732.

The development processing unit 734 performs development processing of an output image on the basis of the image information obtained by the image information input unit 733 from the solid-state image sensor 711a in response to the control signal from the main control unit 732.

As above, with reference to FIG. 31, the example of the functional configuration of the imaging device to which the solid-state imaging device according to the present application example is applied, particularly the example of the case where biometric authentication is performed in the solid-state imaging device has been described.

Figure 32:
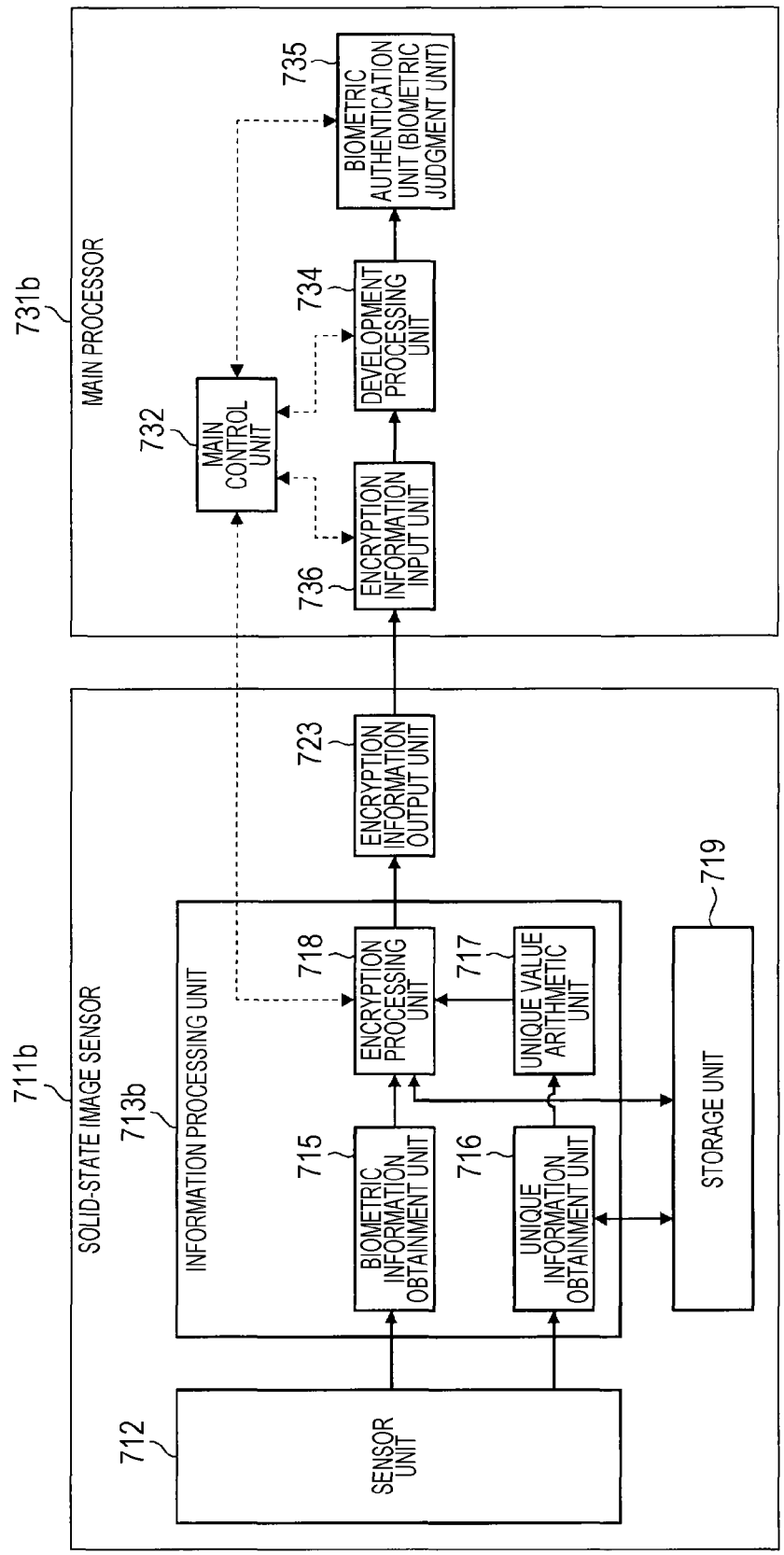
FIG. 32 is a block diagram illustrating another example of a schematic functional configuration of an imaging device in a case of applying to biometric authentication.

Configuration Example 2: Example of Configuration for Encrypting and Outputting Biometric Information Next, with reference to FIG. 32, regarding an example of a functional configuration of an imaging device to which the solid-state imaging device according to the present application example is applied, particularly an example of a case where biometric information obtained by the solid-state imaging device is subjected to encryption processing and then output to the outside will be described. FIG. 32 is an explanatory diagram for describing an application example of the technology according to the present disclosure, and is a block diagram illustrating another example of a schematic functional configuration of an imaging device according to the present application example. Note that in the present description, the functional configuration of the imaging device 710b illustrated in FIG. 32 will be described, particularly focusing on differences from the imaging device 710a described with reference to FIG. 31, and detailed description of parts substantially similar to those of the imaging device 710a will be omitted.

As illustrated in FIG. 32, an imaging device 710b according to the present application example includes a solid-state image sensor 711b and a main processor 731b. Note that the solid-state image sensor 711b and the main processor 731b correspond to the solid-state image sensor 711a and the main processor 731a in the imaging device 710a illustrated in FIG. 31. Note that in the example illustrated in FIG. 32, in order to make the features easier to understand, mainly components related to processing for biometric information are illustrated, and illustration of the components related to the processing for the image information described above is omitted. Therefore, for example, also in the example illustrated in FIG. 32, similarly to the example illustrated in FIG. 31, components such as the image information obtainment unit 714, the output switching unit 721, the image information output unit 722, the image information input unit 733, and the like may be included.

As illustrated in FIG. 32, the solid-state image sensor 711b includes a sensor unit 712, an information processing unit 713b, an encryption information output unit 723, and a storage unit 719. Furthermore, the information processing unit 713b includes, for example, a biometric information obtainment unit 715, a unique information obtainment unit 716, a unique value arithmetic unit 717, and an encryption processing unit 718. Note that the sensor unit 712, the storage unit 719, the biometric information obtainment unit 715, the unique information obtainment unit 716, and the unique value arithmetic unit 717 are substantially similar to the sensor unit 712, the storage unit 719, the biometric information obtainment unit 715, the unique information obtainment unit 716, and the unique value arithmetic unit 717 in the imaging device 710a illustrated in FIG. 31.

The encryption processing unit 718 encrypts biometric information obtained by the biometric information obtainment unit 715 (for example, image information of iris, fingerprint, vein, face, handprint, voiceprint, pulse wave, and retina, or the like) to generate encryption information, and then transmits the encryption information to the encryption information output unit 723. Note that key information for the encryption may be encrypted on the basis of a value (for example, PUF value) unique to the solid-state image sensor 711 generated by the unique value arithmetic unit 717, for example. In this case, the encryption processing unit 718 may obtain a value unique to the solid-state image sensor 711 from the unique value arithmetic unit 717, and decrypt the key information on the basis of the obtained value.

The encryption information output unit 723 receives the encryption information generated by the encryption processing performed on the biometric information by the encryption processing unit 718, and outputs the encryption information to the outside of the solid-state image sensor 711b.

The main processor 731b includes a main control unit 732, an encryption information input unit 736, a development processing unit 734, and a biometric authentication unit 735.

The main control unit 732 controls operation of each component of the imaging device 710b. For example, in order to cause the solid-state image sensor 711b to execute each function, the main control unit 732 transmits a control signal corresponding to the function to the solid-state image sensor 711b. Furthermore, in order to implement each function of the main processor 731b, the main control unit 732 transmits a control signal corresponding to the function to each unit in the main processor 731b.

The encryption information input unit 736 obtains encryption information output from the solid-state image sensor 711b in response to the control signal from the main control unit 732.

The development processing unit 734 decrypts the encryption information obtained by the encryption information input unit 736 from the solid-state image sensor 711b in response to the control signal from the main control unit 732, and performs development processing of an output image used for biometric authentication on the basis of biometric information (image information) obtained as a decryption result. Note that regarding key information for decrypting the encryption information, it is only required that one similar to the key information used for generating the encryption information is obtained in advance and stored in a predetermined storage area. Then, the development processing unit 734 outputs an output image obtained as a result of current processing to the biometric authentication unit 735.

The biometric authentication unit 735 judges whether or not an output image output from the development processing unit 734 can authenticate the user. The biometric authentication unit 735 compares the output image (in other words, biometric information) judged to be capable of authenticating the user with reference information stored in the predetermined storage area, and authenticates whether or not the user is eligible for use.

As above, with reference to FIG. 32, regarding the example of the functional configuration of the imaging device to which the solid-state imaging device according to the present application example is applied, particularly the example of the case where biometric information obtained by the solid-state imaging device is subjected to encryption processing and then output to the outside has been described.

Figure 33:
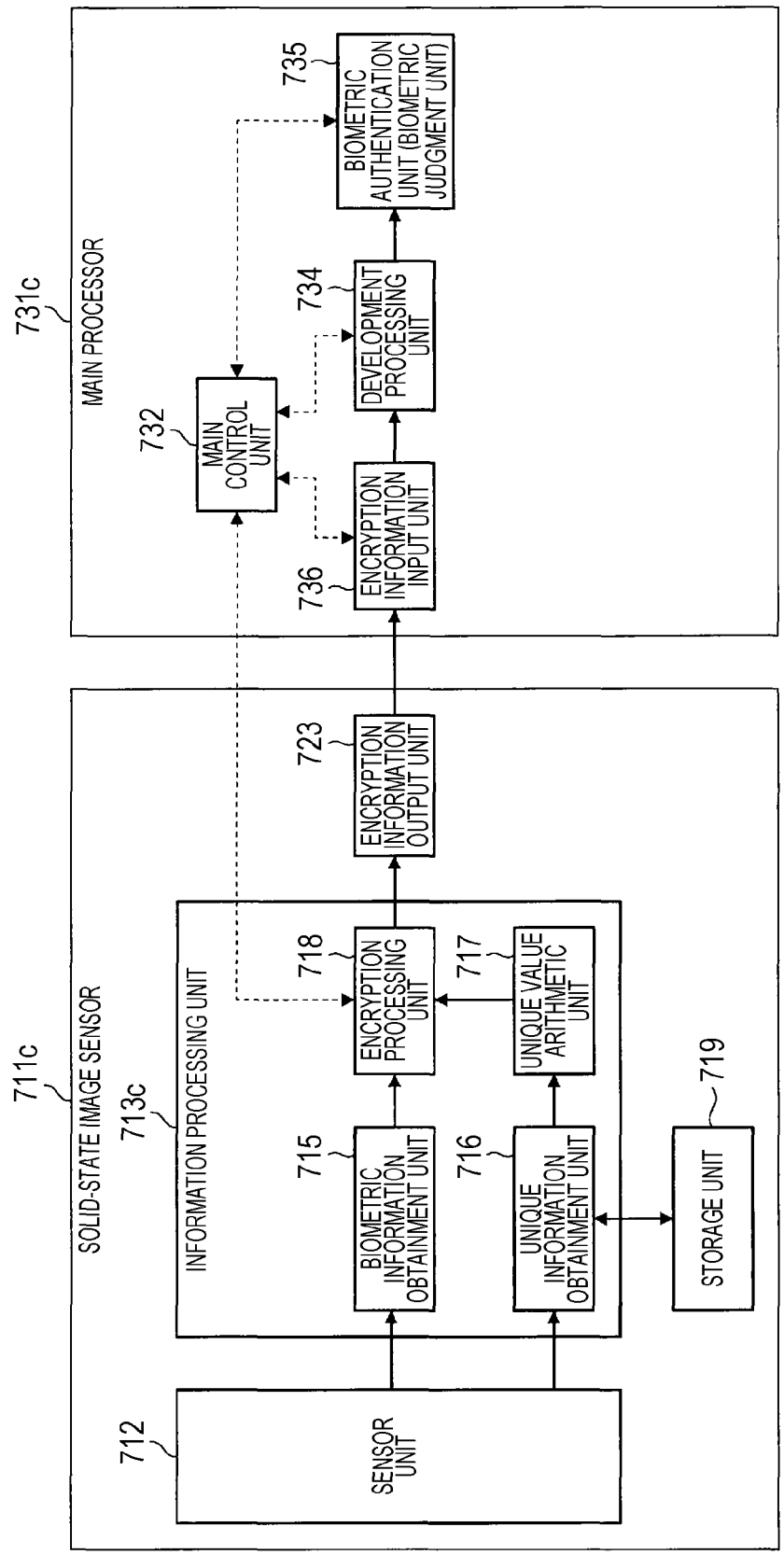
FIG. 33 is a block diagram illustrating another example of a schematic functional configuration of an imaging device in a case of applying to biometrics authentication.

Configuration Example 3: Another Example of Configuration for Encrypting and Outputting Biometric Information Next, with reference to FIG. 33, regarding an example of a functional configuration of an imaging device to which the solid-state imaging device according to the present application example is applied, particularly another example of a case where biometric information obtained by the solid-state imaging device is subjected to encryption processing and then output to the outside will be described. FIG. 33 is an explanatory diagram for describing an application example of the technology according to the present disclosure, and is a block diagram illustrating another example of a schematic functional configuration of an imaging device according to the present application example. Note that, in the present description, the functional configuration of the imaging device 710c illustrated in FIG. 33 will be described, particularly focusing on differences from the imaging device 710b described with reference to FIG. 32, and detailed description of parts substantially similar to those of the imaging device 710b will be omitted.

As illustrated in FIG. 33, an imaging device 710c according to the present application example includes a solid-state image sensor 711c and a main processor 731c. Note that the solid-state image sensor 711c and the main processor 731c correspond to the solid-state image sensor 711b and the main processor 731b in the imaging device 710b illustrated in FIG. 32. Note that, in the example illustrated in FIG. 33, in order to make the features easier to understand, mainly components related to processing for biometric information are illustrated, and illustration of the components related to the processing for the image information described above is omitted. Therefore, for example, also in the example illustrated in FIG. 33, similarly to the example illustrated in FIG. 31, components such as the image information obtainment unit 714, the output switching unit 721, the image information output unit 722, the image information input unit 733, and the like may be included.

As illustrated in FIG. 33, the solid-state image sensor 711c includes a sensor unit 712, an information processing unit 713c, an encryption information output unit 723, and a storage unit 719. Furthermore, the information processing unit 713c includes, for example, a biometric information obtainment unit 715, a unique information obtainment unit 716, a unique value arithmetic unit 717, and an encryption processing unit 718.

Note that in the example illustrated in FIG. 33, as key information for performing encryption processing on the biometric information obtained by the biometric information obtainment unit 715, a value unique to the solid-state image sensor 711c generated by the unique value arithmetic unit 717 (for example, PUF value) is used, which is the difference from the example illustrated in FIG. 33. That is, in the solid-state image sensor 711c illustrated in FIG. 33, the operation of the encryption processing unit 718 is different from that of the solid-state image sensor 711b illustrated in FIG. 32, and other configurations are substantially similar to those of the solid-state image sensor 711b.

That is, the encryption processing unit 718 encrypts biometric information obtained by the biometric information obtainment unit 715 by using a value unique to the solid-state image sensor 711c generated by the unique value arithmetic unit 717 as key information to thereby generate encryption information, and transmits the encryption information to the encryption information output unit 723.

Furthermore, the encryption information output unit 723 receives the encryption information generated by the encryption processing performed on the biometric information by the encryption processing unit 718, and outputs the encryption information to the outside of the solid-state image sensor 711c.

The encryption information input unit 736 obtains the encryption information output from the solid-state image sensor 711c in response to the control signal from the main control unit 732.

The development processing unit 734 decrypts the encryption information obtained by the encryption information input unit 736 from the solid-state image sensor 711c in response to the control signal from the main control unit 732, and performs development processing of an output image used for biometric authentication on the basis of biometric information (image information) obtained as a decryption result. Note that regarding key information for decrypting the encryption information, that is, the value unique to the solid-state image sensor 711c (for example, PUF value), it is only required to be obtained in advance and stored in a predetermined storage area. Then, the development processing unit 734 outputs an output image obtained as a result of current processing to the biometric authentication unit 735.

Note that the subsequent processing is similar to that of the imaging device 710b described with reference to FIG. 32.

As described above, in the solid-state image sensor 711c illustrated in FIG. 33, there is no need to store the key information itself used for encryption of biometric information in the storage area of the solid-state image sensor 711c. Therefore, according to the solid-state image sensor 711c illustrated in FIG. 33, it is possible to further improve security regarding protection of biometric information, as compared with the solid-state image sensor 711b described with reference to FIG. 32.

As above, with reference to FIG. 33, regarding the example of the functional configuration of the imaging device to which the solid-state imaging device according to the present application example is applied, particularly another example of the case where biometric information obtained by the solid-state imaging device is subjected to encryption processing and then output to the outside has been described.

6.2. Application Example to Biometric Authentication System

Next, as an application example of the technology according to the present disclosure, an example of application to what is called biometric authentication system will be described in which biometric information obtained by the solid-state imaging device 1 according to one embodiment of the present disclosure is transferred to a server via a network, and biometric authentication is executed in the server.

(System Configuration)

Figure 34:
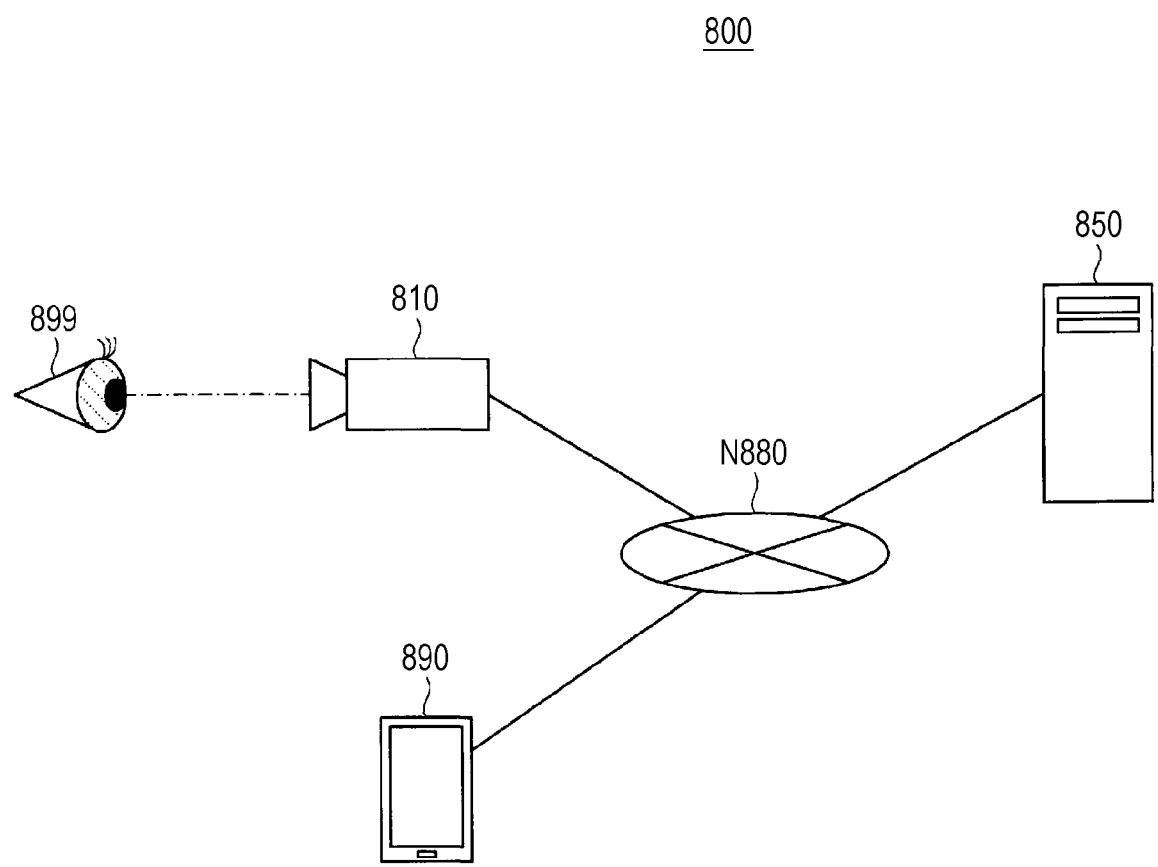
FIG. 34 is a block diagram illustrating an example of a schematic system configuration of a biometric authentication system.

First, with reference to FIG. 34, an example of a schematic system configuration of the biometric authentication system according to the present application example will be described. FIG. 34 is an explanatory diagram for describing an application example of the technology according to the present disclosure, and is a block diagram illustrating an example of a schematic system configuration of the biometric authentication system.

As illustrated in FIG. 34, the biometric authentication system 800 according to the present application example includes an imaging device 810 and a server 850. Furthermore, the biometric authentication system 800 may also include a terminal device 890. The imaging device 810, the server 850, and the terminal device 890 are configured to be capable of transmitting and receiving information to and from each other via a predetermined network N880. Note that the type of the network N880 that connects the imaging device 810, the server 850, and the terminal device 890 is not particularly limited. For example, the network N880 may be configured by the Internet, a dedicated line, a local area network (LAN), a wide area network (WAN), or the like. Further, the network N880 may be configured by a wireless network or may be configured by a wired network. Furthermore, the network N880 may include a plurality of networks, and at least a part of the network N880 may be configured as a wired network. Further, a network connecting the respective devices may be individually set. As a specific example, the network connecting the imaging device 810 and the server 850 and the network connecting the server 850 and the terminal device 890 may be configured as different networks.

On the basis of such a configuration, in the biometric authentication system 800 according to the present application example, for example, biometric information obtained by imaging a subject with the imaging device 810 is transmitted from the imaging device 810 to the server 850, and the server 850 executes biometric authentication based on the biometric information. Then, the server 850, for example, executes various processes according to a result of the biometric authentication, and transmits execution results of the processes to the terminal device 890 (for example, a smartphone or the like) of the user identified on the basis of the result of the biometric authentication. With such a configuration, the user can check the results of various processes executed according to the result of biometric authentication based on an imaging result by the imaging device 810, by the terminal device 890 held by the user.

Next, out of the respective devices included in the biometric authentication system 800 according to the present application example, particularly an example of functional configurations of the imaging device 810 and the server 850 will be described below.

(Functional Configuration of Imaging Device 810)

Figure 35:
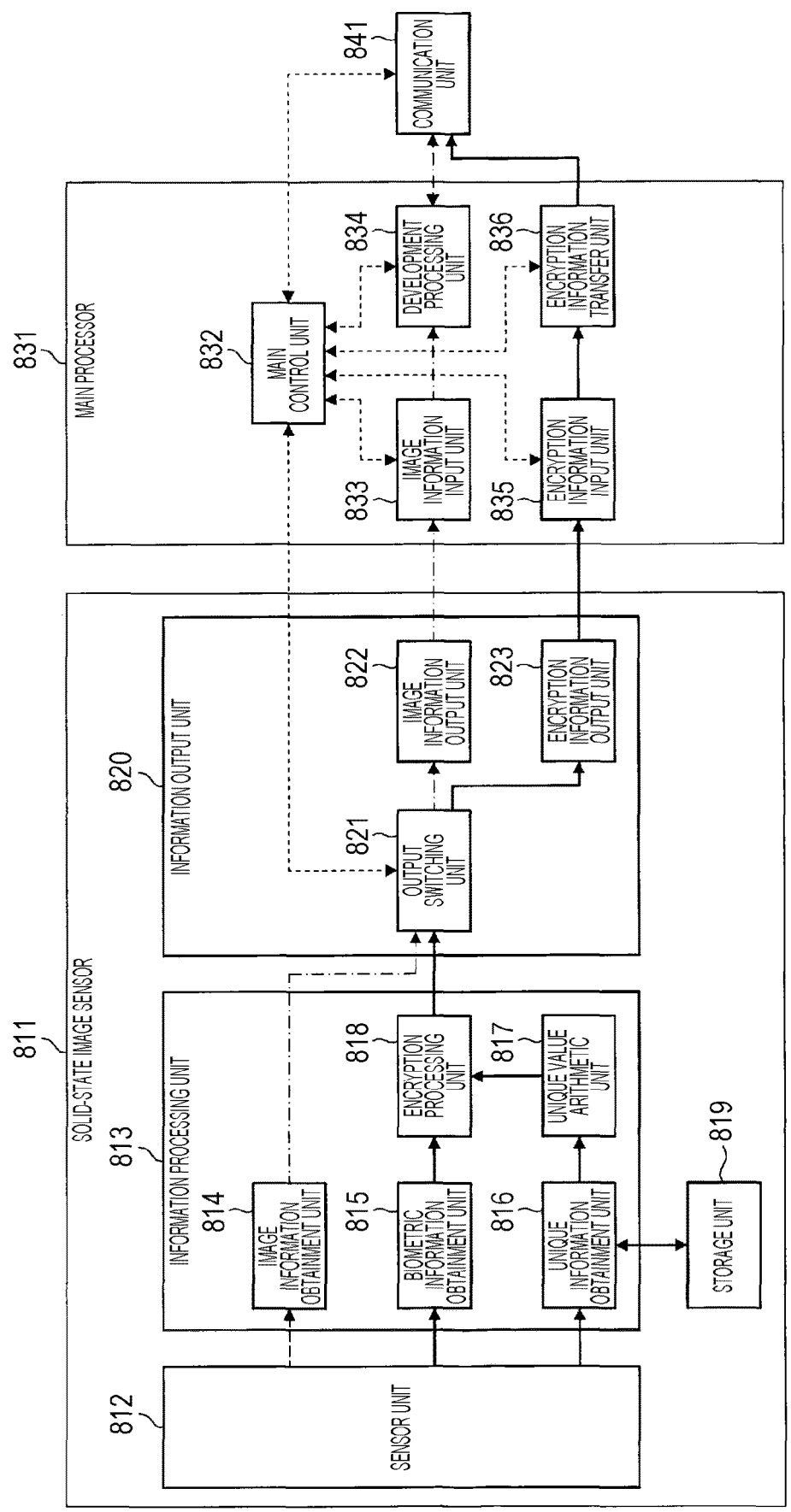
FIG. 35 is a block diagram illustrating an example of a schematic functional configuration of an imaging device constituting the biometric authentication system.

First, with reference to FIG. 35, an example of a functional configuration of the imaging device 810 according to the present application example will be described. FIG. 35 is an explanatory diagram for describing an application example of the technology according to the present disclosure, and is a block diagram illustrating an example of a schematic functional configuration of the imaging device 810 constituting the biometric authentication system.

As illustrated in FIG. 35, an imaging device 810 according to the present application example includes a solid-state image sensor 811, a main processor 831, and a communication unit 841.

The communication unit 841 is a component for the imaging device 810 to transmit and receive various information to and from another device via a predetermined network. The communication unit 841 may include, for example, a communication antenna, a radio frequency (RF) circuit, a baseband processor, and the like when transmitting and receiving various information to and from an external device via a wireless network. Note that in the following description, when each component of the imaging device 810 transmits and receives information to and from another device, unless otherwise specified, the information is transmitted and received via the communication unit 841.

The solid-state image sensor 811 corresponds to the solid-state imaging device 1 according to one embodiment of the present disclosure described above. As illustrated in FIG. 35, the solid-state image sensor 811 includes a sensor unit 812, an information processing unit 813, a storage unit 819, and an information output unit 820. Furthermore, although not illustrated in FIG. 35, the solid-state image sensor 811 may include a register interface for transmitting and receiving set values to and from the outside. Here, the "outside" means a recording medium that stores image information generated by the image sensor, a network for transmitting the image information, and a main processor that processes the image information or an imaging device main body such as a digital camera, a personal computer (PC), a mobile terminal, a game device, a non-contact type IC card such as FeliCa (registered trademark), a USB memory, and the like.

The sensor unit 812 corresponds to the pixel array 3 described with reference to FIG. 1, and photoelectrically converts light from a subject into an electrical signal.

The information processing unit 813 processes obtained information as needed. As illustrated in FIG. 35, the information processing unit 813 includes, for example, an image information obtainment unit 814, a biometric information obtainment unit 815, a unique information obtainment unit 816, a unique value arithmetic unit 817, and an encryption processing unit 818. Note that the image information obtainment unit 814, the biometric information obtainment unit 815, the unique information obtainment unit 816, and the unique value arithmetic unit 817 are substantially similar to the image information obtainment unit 714, the biometric information obtainment unit 715, the unique information obtainment unit 716, and the unique value arithmetic unit 717 illustrated with reference to FIG. 31, and thus detailed description thereof will be omitted.

The encryption processing unit 818 generates encryption information by performing encryption processing based on a predetermined condition on the biometric information of the user obtained by the biometric information obtainment unit 815, and transmits the encryption information to the information output unit 820. At this time, the encryption processing unit 818 may use, for example, a value (for example, a PUF value) unique to the solid-state image sensor 811 generated by the unique value arithmetic unit 817 as a key for encryption. Furthermore, the encryption processing unit 818 may use key information (for example, a common key or the like) used in an existing encryption method as the key for encryption. Note that in a case where the key information used in the existing encryption method is used, the components for generating a value unique to the solid-state image sensor 811 (for example, the unique information obtainment unit 816 and the unique value arithmetic unit 817) do not always need to be provided.

The storage unit 819 includes a non-volatile recording medium (for example, a memory or the like) capable of holding stored contents without supplying power, and temporarily or permanently store various information for the respective components in the solid-state image sensor 811 to execute various processes. For example, the storage unit 819 may previously hold information for the unique information obtainment unit 816 to specify a pixel (or a block including one or more pixels) for which unique information is to be obtained.

The information output unit 820 outputs various information output from the information processing unit 813 to the outside of the solid-state image sensor 811, and includes, for example, an output switching unit 821, an image information output unit 822, and an encryption information output unit 823.

The output switching unit 821 switches which information is output to the outside of the solid-state image sensor 811 according to the type of information input from the information processing unit 813. That is, it has a role of a switch for switching the output destination. By the solid-state image sensor 811 including the output switching unit 821, it is possible to selectively switch which of image information obtained by the image information obtainment unit 814 and encryption information in which biometric information obtained by the biometric information obtainment unit 815 is encrypted is to be output.

When the output switching unit 821 has selected to output the image information, the image information output unit 822 receives image information obtained by the image information obtainment unit 814, and outputs the image information to the outside of the solid-state image sensor 811.

Furthermore, when the output switching unit 821 has selected to output the encryption information, the encryption information output unit 823 receives encryption information generated by performing encryption processing on biometric information by the encryption processing unit 818, and outputs the encryption information to the outside of the solid-state image sensor 811.

The main processor 831 receives image information or encryption information from the solid-state image sensor 811 and executes various processes according to the type of the received information. As illustrated in FIG. 35, the main processor 831 includes a main control unit 832, an image information input unit 833, a development processing unit 834, an encryption information input unit 835, and an encryption information transfer unit 836.

The main control unit 832 controls operation of each component of the imaging device 810. For example, in order to cause the solid-state image sensor 811 to execute each function, the main control unit 832 transmits a control signal corresponding to the function to the solid-state image sensor 811. Furthermore, in order to implement each function of the main processor 831, the main control unit 832 transmits a control signal corresponding to the function to each unit in the main processor 831.

The image information input unit 833 obtains image information output from the solid-state image sensor 811 in response to the control signal from the main control unit 832.

The development processing unit 834 performs development processing of an output image on the basis of the image information obtained by the image information input unit 833 from the solid-state image sensor 811 in response to the control signal from the main control unit 832. Furthermore, the development processing unit 834 may transmit the output image obtained by the development processing to another device (for example, the server 850 or the terminal device 890 illustrated in FIG. 34) connected via a predetermined network.

The encryption information input unit 835 obtains encryption information output from the solid-state image sensor 811 in response to the control signal from the main control unit 832.

The encryption information transfer unit 836, in response to the control signal from the main control unit 832, transfers the encryption information obtained by the encryption information input unit 835 from the solid-state image sensor 811 to a predetermined device connected via a predetermined network (for example, the server 850 and the like).

Note that the configuration illustrated in FIG. 35 is merely an example, and the configuration of the imaging device 810 is not necessarily limited to the example illustrated in FIG. 35 as long as each function of the imaging device 810 described above can be implemented.

For example, in the example illustrated in FIG. 35, the image information output unit 822 and the encryption information output unit 823 are provided separately, but the image information output unit 822 and the encryption information output unit 823 may be integrally configured. That is, if the main processor 831 judges which type of information the information output from the solid-state image sensor 811 is, and if processing can be selectively switched according to the type of the information output, an output unit that outputs each of the image information and the encryption information may be shared. Furthermore, in this case, the image information input unit 833 and the encryption information input unit 835 may be integrally configured.

Furthermore, a part of the respective components of the imaging device 810 illustrated in FIG. 35 may be externally attached to the outside of the imaging device 810.

The example of the functional configuration of the imaging device 810 according to the present application example has been described above with reference to FIG. 35.

Functional Configuration Example of Server 850

Figure 36:
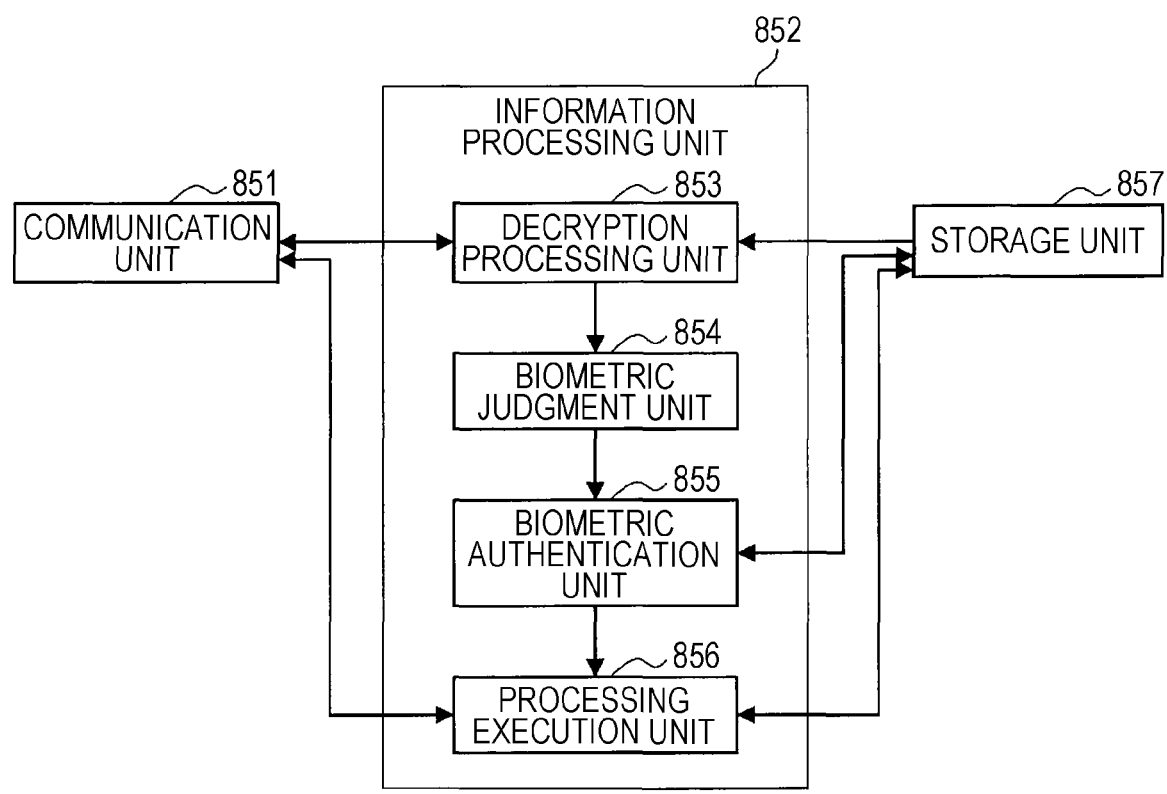
FIG. 36 is a block diagram illustrating an example of a schematic functional configuration of a server constituting the biometric authentication system.

Next, an example of a functional configuration of the server 850 according to the present application example will be described with reference to FIG. 36. FIG. 36 is an explanatory diagram for describing an application example of the technology according to the present disclosure, and is a block diagram illustrating an example of a schematic functional configuration of a server 850 constituting the biometric authentication system.

As illustrated in FIG. 36, the server 850 according to the present application example includes a communication unit 851, an information processing unit 852, and a storage unit 857.

The communication unit 851 is a component for the server 850 to transmit and receive various information to and from another device via a predetermined network. The communication unit 851 may include, for example, a communication antenna, an RF circuit, a baseband processor, and the like when transmitting and receiving various information to and from an external device via a wireless network. Note that in the following description, when each component of the server 850 transmits and receives information to and from another device, unless otherwise specified, the information is transmitted and received via the communication unit 851.

The information processing unit 852 decrypts encryption information transmitted from another device, and executes biometric authentication on the basis of biometric information obtained as a decryption result. Furthermore, the information processing unit 852 may execute various processes according to a result of the biometric authentication. As illustrated in FIG. 36, the information processing unit 852 includes, for example, a decryption processing unit 853, a biometric judgment unit 854, a biometric authentication unit 855, and a process execution unit 856.

The decryption processing unit 853 performs decryption processing on encryption information transmitted from another device (for example, the imaging device 810) on the basis of key information corresponding to the transmission source of the encryption information, thereby decrypting the original information encrypted (for example, the biometric information described above).

Note that as the key information used for decrypting the encryption information, for example, a value unique to every device of transmission source devices similarly to the PUF value described above (for example, the solid-state image sensor 811) may be used. Note that as the value unique to each device, it is just necessary that one that is generated in advance at a time when the device is manufactured, or the like is stored in a region readable by the decryption processing unit 853 (for example, a storage unit 857 described later).

Furthermore, as another example, key information (for example, a common key or the like) used in an existing encryption method may be used as the key information used for decrypting the encryption information.

The biometric judgment unit 854 judges whether or not the biometric information obtained is capable of authenticating the user.

The biometric authentication unit 855 compares the biometric information judged to be capable of authenticating the user with reference information stored in the predetermined storage area (for example, the storage unit 857 described later), and authenticates whether or not the user is eligible for use.

The process execution unit 856 executes various functions (for example, applications) provided by the server 850. For example, the process execution unit 856 may extract a predetermined application from a predetermined storage unit (for example, a storage unit 857 described later) according to a result of biometric authentication by the biometric authentication unit 855, and execute the extracted application. Furthermore, the process execution unit 856 may specify the user according to the result of the biometric authentication, and transmit information according to an execution result of the application to the terminal device 890 corresponding to the specified user.

The storage unit 857 temporarily or permanently holds various information for each component in the server 850 to execute various processes. The storage unit 857 can include, for example, a non-volatile recording medium (for example, a memory or the like) capable of holding stored contents without supplying power. Furthermore, the storage unit 857 may at least partially include a volatile recording medium.

As a specific example, the storage unit 857 may hold information that is a key for decrypting encryption information transmitted from the imaging device 810. An example of the information is information indicating a unique value (for example, PUF value) generated in advance for each of the imaging devices 810 (for example, the solid-state image sensor 811).

Further, as another example, the storage unit 857 may store reference information that is a comparison target of biometric information during biometric authentication. Furthermore, the storage unit 857 may store data (for example, a library) for executing various applications, management data for managing various settings or the like, and the like.

Note that the configuration illustrated in FIG. 36 is merely an example, and the configuration of the server 850 is not necessarily limited to the example illustrated in FIG. 36 as long as the respective functions of the server 850 described above can be implemented. As a specific example, a part of the respective components of the server 850 illustrated in FIG. 36 may be externally attached to the outside of the server 850. Furthermore, as another example, the respective functions of the server 850 described above may be implemented by distributed processing by a plurality of devices.

The example of the functional configuration of the server 850 according to the present application example has been described above with reference to FIG. 36.

(Evaluation)

As described above, in the biometric authentication system 800 according to the present application example, the biometric information obtained by the solid-state image sensor 811 of the imaging device 810 is output to the outside of the solid-state image sensor 811 as encryption information that has been encrypted. Therefore, regarding external components of the solid-state image sensor 811, if not holding the key information for decryption, it is difficult even for a device in the imaging device 810 to decrypt the encryption information output from the solid-state image sensor 811. That is, in the biometric authentication system 800 described above, the biometric information obtained by the solid-state image sensor 811 is propagated as encrypted information on a path from where it is output from the solid-state image sensor 811 until it is received by the server 850.

Furthermore, for encryption of biometric information, it is possible to use as key information a value unique to the individual solid-state image sensor 811 generated (or calculated) using physical characteristics that are difficult to copy, such as a PUF value.

With the configuration as described above, by the biometric authentication system 800 according to the present application example, it is possible to further improve security regarding protection of biometric information of a user obtained as an imaging result by the imaging device 810.

6.3. Application Example to Mobile Object

The technology according to the present disclosure (the present technology) can be applied to various products. For example, the technology according to the present disclosure may be achieved as a device (or a system) mounted on any type of mobile object such as an automobile, an electric vehicle, a hybrid electric vehicle, a motorcycle, a bicycle, a personal mobility, an airplane, a drone, a ship, a robot, and the like.

Figure 37:
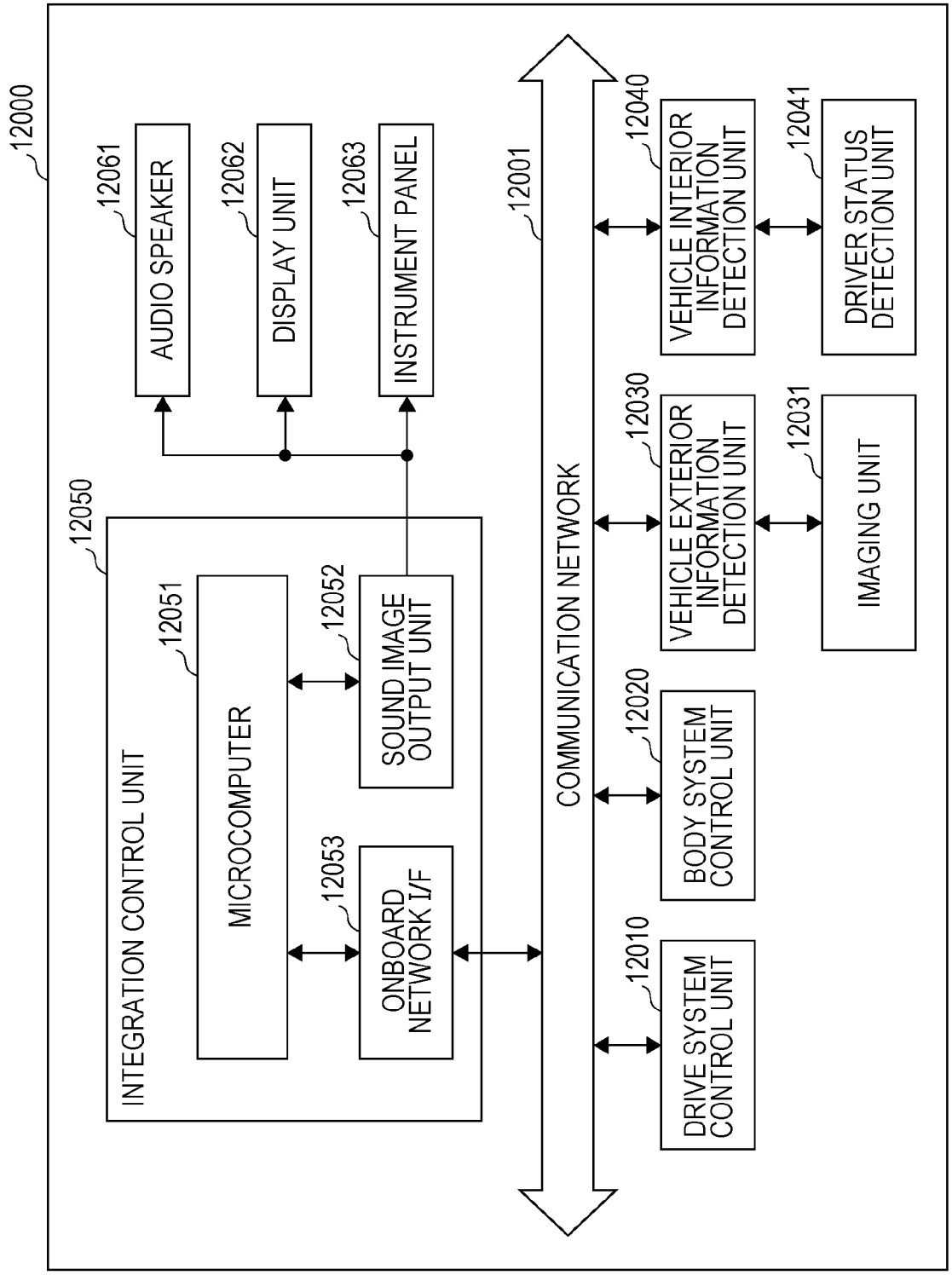
FIG. 37 is a block diagram illustrating an example of a schematic configuration of a vehicle control system.

FIG. 37 is a block diagram illustrating a schematic configuration example of a vehicle control system that is an example of a mobile object control system to which the technology according to the present disclosure can be applied.

A vehicle control system 12000 includes a plurality of electronic control units connected via a communication network 12001. In the example illustrated in FIG. 37, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, a sound image output unit 12052, and an onboard network interface (I/F) 12053 are illustrated.

The drive system control unit 12010 controls operation of devices related to the drive system of the vehicle according to various programs. For example, the drive system control unit 12010 functions as a control device for a driving force generation device for generating driving force of the vehicle such as an internal combustion engine or a driving motor, a driving force transmission mechanism for transmitting driving force to wheels, a steering mechanism for adjusting a steering angle of the vehicle, and a braking device for generating a braking force of the vehicle, and the like.

The body system control unit 12020 controls operation of various devices mounted on the vehicle body according to various programs. For example, the body system control unit 12020 functions as a control device for a keyless entry system, a smart key system, and a power window device, or various lamps such as a head lamp, a back lamp, a brake lamp, a blinker, or a fog lamp, and the like. In this case, radio waves transmitted from a portable device that substitutes for a key or signals from various switches can be input to the body system control unit 12020. The body system control unit 12020 receives input of these radio waves or signals, and controls a door lock device, a power window device, a lamp, and the like of the vehicle.

The vehicle exterior information detection unit 12030 detects information external to the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform an object detection process or a distance detection process of a person, a vehicle, an obstacle, a sign, or a character on a road surface, or the like on the basis of the received image.

The imaging unit 12031 is an optical sensor that receives light and outputs an electrical signal according to the amount of received light. The imaging unit 12031 can output the electrical signal as an image or as distance measurement information. Furthermore, the light received by the imaging unit 12031 may be visible light or non-visible light such as infrared light.

The vehicle interior information detection unit 12040 detects information in the vehicle. The vehicle interior information detection unit 12040 is connected to, for example, a driver status detection unit 12041 that detects the status of the driver. The driver status detection unit 12041 includes, for example, a camera that captures an image of the driver, and the vehicle interior information detection unit 12040 may calculate the degree of fatigue or the degree of concentration of the driver, or judge whether or not the driver has fallen asleep on the basis of detection information input from the driver status detection unit 12041.

The microcomputer 12051 can calculate a control target value of the driving force generation device, the steering mechanism, or the braking device on the basis of information of the inside and outside of the vehicle obtained by the vehicle exterior information detection unit 12030 or the vehicle interior information detection unit 12040, and outputs a control command to the drive system control unit 12010. For example, the microcomputer 12051 can perform cooperative control for the purpose of achieving functions of the advanced driver assistance system (ADAS) including vehicle collision avoidance or impact mitigation, following traveling based on an inter-vehicle distance, vehicle speed maintaining traveling, vehicle collision warning, or vehicle lane departure warning, and the like.

Furthermore, the microcomputer 12051 controls the driving force generation device, the steering mechanism, the braking device, or the like on the basis of information around the vehicle obtained by the vehicle exterior information detection unit 12030 or the vehicle interior information detection unit 12040, to thereby perform cooperative control for the purpose of autonomous driving or the like to travel autonomously without depending on operation by the driver.

Furthermore, the microcomputer 12051 can output a control command to the body system control unit 12020 on the basis of vehicle exterior information obtained by the vehicle exterior information detection unit 12030. For example, the microcomputer 12051 can perform cooperative control for the purpose of anti-glare, such as controlling headlamps according to the position of a preceding vehicle or oncoming vehicle detected by the vehicle exterior information detection unit 12030, and thereby switching a high beam to a low beam.

The sound image output unit 12052 transmits an output signal of at least one of sound or image to an output device capable of visually or audibly notifying a passenger of the vehicle or the outside of the vehicle of information. In the example of FIG. 37, an audio speaker 12061, a display unit 12062, and an instrument panel 12063 are illustrated as output devices. The display unit 12062 may include, for example, at least one of an on-board display or a head-up display.

Figure 38:
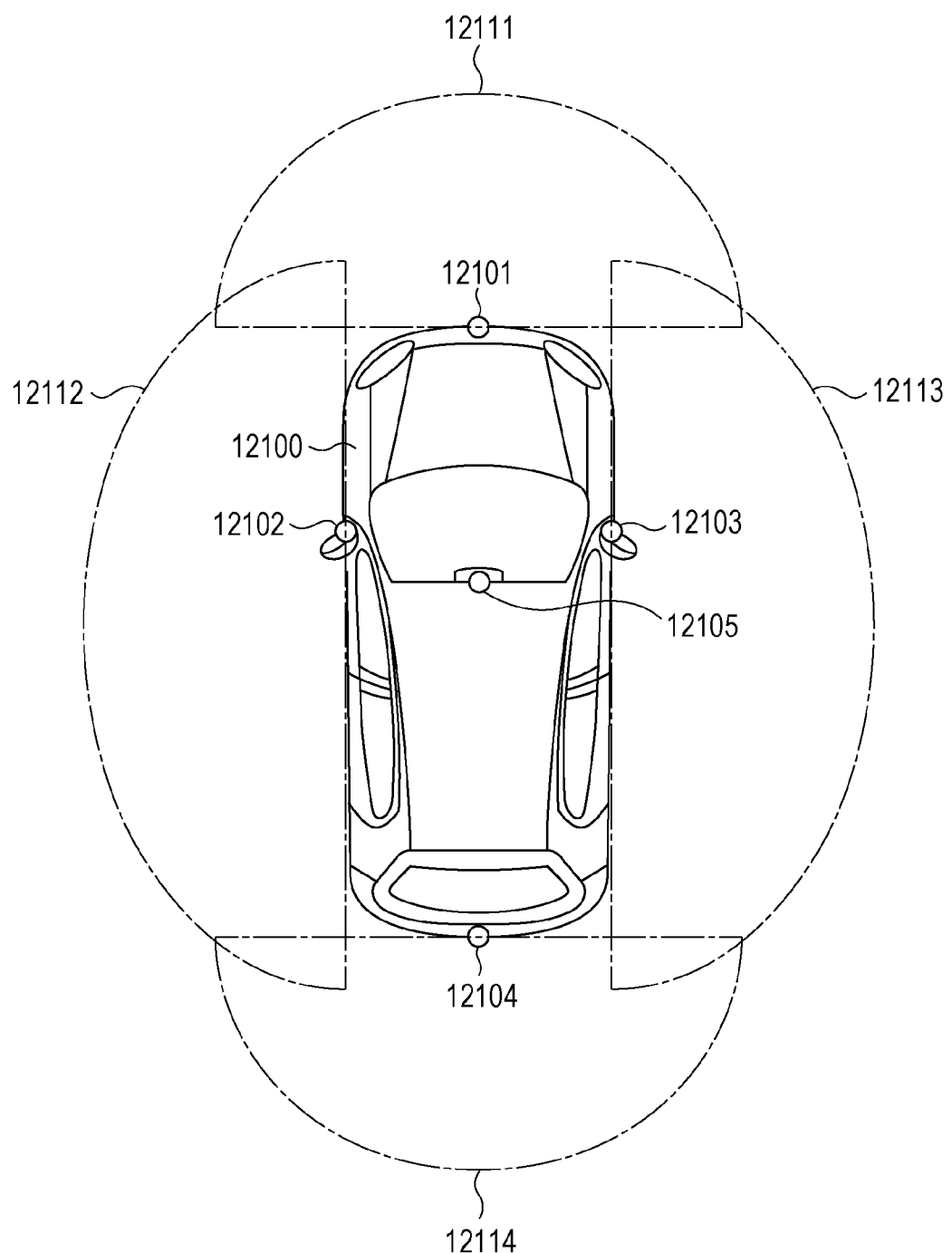
FIG. 38 is an explanatory diagram illustrating an example of installation positions of a vehicle exterior information detection unit and an imaging unit.

FIG. 38 is a diagram illustrating an example of installation positions of the imaging unit 12031.

In FIG. 38, the vehicle 12100 has imaging units 12101, 12102, 12103, 12104, and 12105 as the imaging unit 12031.

The imaging units 12101, 12102, 12103, 12104, and 12105 are provided, for example, at positions such as a front nose, a side mirror, a rear bumper, a back door, and an upper part of a windshield in the cabin of the vehicle 12100. The imaging unit 12101 provided on the front nose and the imaging unit 12105 provided above the windshield in the cabin mainly obtain a forward image of the vehicle 12100. The imaging units 12102 and 12103 provided in the side mirrors mainly obtain images of sides of the vehicle 12100. The imaging unit 12104 provided in a rear bumper or a back door mainly obtains an image behind the vehicle 12100. The forward image obtained by the imaging units 12101 and 12105 are mainly used for detecting a preceding vehicle, a pedestrian, an obstacle, a traffic light, a traffic sign, a lane, and the like.

Note that FIG. 38 illustrates an example of imaging ranges of the imaging units 12101 to 12104. An imaging range 12111 indicates the imaging range of the imaging unit 12101 provided on the front nose, imaging ranges 12112 and 12113 indicate imaging ranges of the imaging units 12102 and 12103 provided on the side mirrors, respectively, and an imaging range 12114 indicates an imaging range of an imaging unit 12104 provided in a rear bumper or a back door. For example, by overlaying image data captured by the imaging units 12101 to 12104, an overhead image of the vehicle 12100 viewed from above can be obtained.

At least one of the imaging units 12101 to 12104 may have a function of obtaining distance information. For example, at least one of the imaging units 12101 to 12104 may be a stereo camera including a plurality of image sensors or an image sensor having pixels for detecting a phase difference.

For example, on the basis of distance information obtained from the imaging units 12101 to 12104, the microcomputer 12051 can obtain a distance to each three-dimensional object in the imaging ranges 12111 to 12114, and a temporal change of this distance (relative speed to the vehicle 12100), to thereby extract as a preceding vehicle a three-dimensional object that is closest particularly on the traveling path of the vehicle 12100 and travels at a predetermined speed (for example, 0 km/h or more) in substantially the same direction as the vehicle 12100. Moreover, the microcomputer 12051 can set in advance an inter-vehicle distance to be secured before a preceding vehicle, and perform automatic brake control (including follow-up stop control), automatic acceleration control (including follow-up start control), and the like. In this way, it is possible to perform cooperative control for automatic driving or the like in which the vehicle travels autonomously without depending on operation of the driver.

For example, the microcomputer 12051 extracts, on the basis of distance information obtained from the imaging units 12101 to 12104, three-dimensional object data related to a three-dimensional object while categorizing into a two-wheeled vehicle, a normal vehicle, a large vehicle, a pedestrian, and other three-dimensional objects such as a telephone pole, and uses the extracted data for automatic avoidance of obstacles. For example, the microcomputer 12051 distinguishes an obstacle around the vehicle 12100 into an obstacle that is visible to the driver of the vehicle 12100 and an obstacle that is difficult to see. Then, the microcomputer 12051 determines a collision risk indicating the risk of collision with each obstacle, and when the collision risk is equal to or higher than a set value and there is a possibility of collision, the microcomputer 12051 can output a warning to the driver via the audio speaker 12061 and the display unit 12062, or perform forced deceleration or avoidance steering via the drive system control unit 12010, to thereby perform assistance for collision avoidance.

At least one of the imaging units 12101 to 12104 may be an infrared camera that detects infrared light. For example, the microcomputer 12051 can recognize a pedestrian by determining whether or not a pedestrian exists in captured images of the imaging units 12101 to 12104. Recognition of such a pedestrian is performed by, for example, a procedure of extracting feature points in an image captured by the imaging units 12101 to 12104 as an infrared camera, and performing a pattern matching process on a series of feature points indicating the outline of an object to judge whether or not the object is a pedestrian. When the microcomputer 12051 determines that a pedestrian is present in the images captured by the imaging units 12101 to 12104 and recognizes the pedestrian, the sound image output unit 12052 controls the display unit 12062 so as to overlay a rectangular contour line for emphasis on the recognized pedestrian. Furthermore, the sound image output unit 12052 may cause the display unit 12062 to display an icon or the like indicating a pedestrian at a desired position.

The example of the vehicle control system to which the technology according to the present disclosure can be applied has been described above. The technology according to the present disclosure can be applied to the imaging unit 12031 among the configurations described above. Specifically, the solid-state imaging device 1 illustrated in FIG. 1 can be applied to the imaging unit 12031. By applying the technology according to the present disclosure to the imaging unit 12031, for example, various information obtained by the imaging unit 12031 (for example, image information obtained as an imaging result, or the like) can be subjected to encryption on the basis of information unique to the device (solid-state imaging device) inside the imaging unit 12031. Therefore, for example, it is possible to further improve security regarding protection of information obtained by the imaging unit 12031.

7. CONCLUSION

The preferred embodiments of the present disclosure have been described above in detail with reference to the accompanying drawings, but the technical scope of the present disclosure is not limited to such examples. It is apparent that a person having ordinary knowledge in the technical field of the present disclosure can devise various change examples or modification examples within the scope of the technical idea described in the claims, and it will be naturally understood that they also belong to the technical scope of the present disclosure.

Furthermore, the effects described in the present description are merely illustrative or exemplary and are not limited. That is, the technology according to the present disclosure can exhibit other effects that are apparent to those skilled in the art from the present description in addition to or instead of the effects described above.

Note that configurations as follows also belong to the technical scope of the present disclosure.

(1)

A solid-state image sensor including:

a plurality of unit pixels disposed in a two-dimensional array; and a drive control unit that controls a first drive to output signals from the unit pixels included in a first unit pixel group of the plurality of unit pixels as an image signal, and a second drive to detect variations in respective signals from two or more of the unit pixels included in a second unit pixel group of the plurality of unit pixels, in which the first unit pixel group and the second unit pixel group have different structures from each other.

(2)

The solid-state image sensor according to above (1), in which the area in which the plurality of unit pixels are disposed includes an effective pixel region that is not shielded from light, and a light-shielded region that is shielded from light, the first unit pixel group is disposed in the effective pixel region, and the second unit pixel group is disposed in the light-shielded region.

(3)

The solid-state image sensor according to above (2), in which in the light-shielded region, the second unit pixel group and a third unit pixel group including optical black (OPB) pixels as the unit pixels are disposed, and the second unit pixel group and the third unit pixel group are different in structures.

(4)

The solid-state image sensor according to any one of above (1) to (3), in which the first unit pixel group and the second unit pixel group are different in circuit configurations of the unit pixels included therein.

(5)

The solid-state image sensor according to above (4), in which the unit pixels included in the first unit pixel group each have:

a photoelectric conversion unit;

a capacitor that converts a charge to a voltage;

an initialization unit that initializes a potential of the capacitor to a predetermined potential;

a transfer unit that is interposed between the photoelectric conversion unit and the capacitor, and transfers charges generated in the photoelectric conversion unit to the capacitor;

an amplification unit that amplifies and reads the potential of the capacitor; and a selection unit that controls transmission of output of the amplification unit, in which the unit pixels included in the second unit pixel group does not have at least one of the photoelectric conversion unit, the transfer unit, the capacitance, or the initialization unit.

(6)

The solid-state image sensor according to above (4), in which the first unit pixel group and the second unit pixel group are different in a structure of at least a part of elements among one or more elements that the unit pixels included therein have in common.

(7)

The solid-state image sensor according to above (6), in which the unit pixels included in each of the first unit pixel group and the second unit pixel group have photoelectric conversion units in common, and the first unit pixel group and the second unit pixel group are different in a structure of an impurity layer that covers the photoelectric conversion units that the unit pixels have.

(8)

The solid-state image sensor according to above (7), in which the first unit pixel group and the second unit pixel group are different in at least either of a shape and a size of the impurity layer.

(9)

The solid-state image sensor according to above (6), in which the unit pixels included in each of the first unit pixel group and the second unit pixel group have transistors in common, and the first unit pixel group and the second unit pixel group are different in structures of the transistors that the unit pixels have.

(10)

The solid-state image sensor according to above (9), in which the first unit pixel group and the second unit pixel group are different in at least one of a shape, a size, or a number of gates of the transistors.

(11)

The solid-state image sensor according to above (6), in which the unit pixels included in each of the first unit pixel group and the second unit pixel group have capacitors in common, and the first unit pixel group and the second unit pixel group are different in structures of the capacitors that the unit pixels have.

(12)

The solid-state image sensor according to above (11), in which the first unit pixel group and the second unit pixel group are different in at least one of a shape, a size, or a number of the capacitors.

(13)

The solid-state image sensor according any one of above (1) to (12), in which the first unit pixel group and the second unit pixel group are different in electrical connection relationships among the respective elements included therein.

(14)

The solid-state image sensor according to above (13), in which the first unit pixel group and the second unit pixel group are different in wiring patterns for applying a voltage to a gate of a transistor included in each of the unit pixels included in the first unit pixel group and the second unit pixel group.

(15)

The solid-state image sensor according to any one of above (1) to (14), in which the first unit pixel group and the second unit pixel group are different in electrical characteristics of at least a part of elements among one or more elements that the unit pixels included therein have in common.

(16)

The solid-state image sensor according to above (15), in which the unit pixels included in each of the first unit pixel group and the second unit pixel group have photoelectric conversion units in common, and the first unit pixel group and the second unit pixel group are different in electrical characteristics of the photoelectric conversion units that the unit pixels have.

(17)

The solid-state image sensor according to above (16), in which the first unit pixel group and the second unit pixel group are different in a structure of a semiconductor forming the photoelectric conversion units that the unit pixels included therein have in common.

(18)

The solid-state image sensor according to above (16), in which the first unit pixel group and the second unit pixel group are different in electrical characteristics of a semiconductor forming the photoelectric conversion units that the unit pixels included therein have in common.

(19)

The solid-state image sensor according to above (18), in which the first unit pixel group and the second unit pixel group are different in implantation energy of impurities into the semiconductor.

(20)

The solid-state image sensor according to above (18), in which the first unit pixel group and the second unit pixel group are different in amounts of impurities implanted into the semiconductor.

(21)

The solid-state image sensor according to above (18), in which the first unit pixel group and the second unit pixel group are different in implantation angles of impurities into the semiconductor.

(22)

The solid-state image sensor according to above (18), in which the first unit pixel group and the second unit pixel group are different in distributions of impurities implanted into the semiconductor.

(23)

The solid-state image sensor according to above (15), in which the unit pixels included in each of the first unit pixel group and the second unit pixel group have photoelectric conversion units in common, and the first unit pixel group and the second unit pixel group are different in electrical characteristics of an impurity layer that covers the photoelectric conversion units that the unit pixels have.

(24)

The solid-state image sensor according to above (23), in which the first unit pixel group and the second unit pixel group are different in concentrations of impurities contained in the impurity layer.

(25)

The solid-state image sensor according to above (15), in which the unit pixels included in each of the first unit pixel group and the second unit pixel group have transistors in common, and the first unit pixel group and the second unit pixel group are different in electrical characteristics of the transistors that the unit pixels have.

(26)

The solid-state image sensor according to above (25), in which the first unit pixel group and the second unit pixel group are different in thicknesses of gate insulating films of the transistors that the unit pixels included therein have in common.

(27)

The solid-state image sensor according to above (25), in which the first unit pixel group and the second unit pixel group are different in materials forming gate insulating films of the transistors that the unit pixels included therein have in common.

(28)

The solid-state image sensor according to above (25), in which the first unit pixel group and the second unit pixel group are different in stacked structures of gate insulating films of the transistors that the unit pixels included therein have in common.

(29)

The solid-state image sensor according to above (25), in which the first unit pixel group and the second unit pixel group are different in electrical characteristics of a semiconductor forming the transistors that the unit pixels included therein have in common.

(30)

The solid-state image sensor according to any one of above (25) to (29), in which the unit pixels included in the first unit pixel group each have:
  a photoelectric conversion unit;
  a capacitor that converts a charge to a voltage;
  an initialization unit that initializes a potential of the capacitor to a predetermined potential;
  a transfer unit that is interposed between the photoelectric conversion unit and the capacitor, and transfers a charge generated in the photoelectric conversion unit to the capacitor;
  an amplification unit that amplifies and reads out the potential of the capacitor; and
  a selection unit that controls transmission of the output of the amplification unit,
  in which the transistor constitutes either the amplification unit or the initialization unit.

(31)

A solid-state image sensor including:
a plurality of unit pixels disposed in a two-dimensional array; and
a drive control unit that controls a first drive to output signals from the unit pixels included in a first unit pixel group of the plurality of unit pixels as an image signal, and a second drive to detect variations in respective signals from two or more of the unit pixels included in a second unit pixel group of the plurality of unit pixels,
in which in the first unit pixel group and the second unit pixel group, a structure of at least a part of components that the respective groups have in common or a structure of a component related in common to the respective groups is different.

(32)

The solid-state image sensor according to above (31), in which the first unit pixel group and the second unit pixel group are different in at least one of a structure of the unit pixels included therein, a structure of a component related to output of signals from the unit pixels, or a connection relationship among the elements included therein.

(33)

The solid-state image sensor according to above (32), in which to each of the first unit pixel group and the second unit pixel group, a comparator is electrically connected as the component related to output of the signals from the unit pixels, and structures of the comparators respectively connected to the first unit pixel group and the second unit pixel group are different.

(34)

The solid-state image sensor according to above (33), in which each of the first unit pixel group and the second unit pixel group is different in a configuration of a switch that short circuits an input and an output of the comparator.

(35)

The solid-state image sensor according to above (34), in which each of the first unit pixel group and the second unit pixel group is different in a number of the switches that short circuit between the input and the output of the comparator.

REFERENCE SIGNS LIST

1 Solid-state imaging device
2 Pixel
3 Pixel array
4 Vertical drive circuit
5 Column signal processing circuit
6 Horizontal drive circuit
7 Output circuit
8 Control circuit
9 Vertical signal line
10 Horizontal signal line
11 Semiconductor substrate
12 Input-output terminal
101 Control unit
111 Pixel array unit
112 Selection unit
114 Constant current circuit unit
121 Pixel
122 Pixel
131 Switch
132 Switch
133 Switch
141 Comparator
143 Counter
151 Comparator
153 Counter
161 MOS transistor
162 MOS transistor

The invention claimed is:

1. A solid-state image sensor comprising:
  a plurality of unit pixels disposed in a two-dimensional array; and
  a drive controller configured to control a first drive to output signals from the unit pixels included in a first unit pixel group of the plurality of unit pixels as an image signal, and a second drive to detect variations in respective signals from two or more of the unit pixels included in a second unit pixel group of the plurality of unit pixels, wherein
  the first unit pixel group and the second unit pixel group have different structures from each other,
  the first unit pixel group and the second unit pixel group are different in electrical characteristics of at least a part of elements among one or more elements that the unit pixels included therein have in common,
  the unit pixels included in each of the first unit pixel group and the second unit pixel group have photoelectric conversion units in common, the first unit pixel group and the second unit pixel group are different in electrical characteristics of the photoelectric conversion units that the unit pixels have, the first unit pixel group and the second unit pixel group are different in electrical characteristics of a semiconductor forming the photoelectric conversion units that the unit pixels included therein have in common, and the first unit pixel group and the second unit pixel group are different in implantation angles of impurities into the semiconductor.

2. The solid-state image sensor according to claim 1, wherein the area in which the plurality of unit pixels are disposed includes an effective pixel region that is not shielded from light, and a light-shielded region that is shielded from light, the first unit pixel group is disposed in the effective pixel region, and the second unit pixel group is disposed in the light-shielded region.

3. The solid-state image sensor according to claim 2, wherein the second unit pixel group and a third unit pixel group including optical black (OPB) pixels as the unit pixels are disposed in the light-shielded region, and the second unit pixel group and the third unit pixel group are different in structures.

4. The solid-state image sensor according to claim 1, wherein the first unit pixel group and the second unit pixel group are different in circuit configurations of the unit pixels included therein.

5. The solid-state image sensor according to claim 4, wherein the unit pixels included in the first unit pixel group each have:
a capacitor that converts a charge to a voltage;
an initialization circuit that initializes a potential of the capacitor to a predetermined potential;
a transfer circuit that is interposed between the photoelectric conversion unit and the capacitor, and transfers charges generated in the photoelectric conversion unit to the capacitor;
an amplification circuit that amplifies and reads the potential of the capacitor; and
a selection circuit that controls transmission of output of the amplification circuit, and the unit pixels included in the second unit pixel group does not have at least one of the transfer circuit, the capacitor, or the initialization circuit.

6. The solid-state image sensor according to claim 4, wherein the first unit pixel group and the second unit pixel group are different in a structure of at least a part of elements among one or more elements that the unit pixels included therein have in common.

7. The solid-state image sensor according to claim 6, wherein the first unit pixel group and the second unit pixel group are different in a structure of an impurity layer that covers the photoelectric conversion units that the unit pixels have.

8. The solid-state image sensor according to claim 7, wherein the first unit pixel group and the second unit pixel group are different in at least either of a shape and a size of the impurity layer.

9. The solid-state image sensor according to claim 6, wherein the unit pixels included in each of the first unit pixel group and the second unit pixel group have transistors in common, and the first unit pixel group and the second unit pixel group are different in structures of the transistors that the unit pixels have.

10. The solid-state image sensor according to claim 9, wherein the first unit pixel group and the second unit pixel group are different in at least one of a shape, a size, or a number of gates of the transistors.

11. The solid-state image sensor according to claim 6, wherein the unit pixels included in each of the first unit pixel group and the second unit pixel group have capacitors in common, and the first unit pixel group and the second unit pixel group are different in structures of the capacitors that the unit pixels have.

12. The solid-state image sensor according to claim 11, wherein the first unit pixel group and the second unit pixel group are different in at least one of a shape, a size, or a number of the capacitors.

13. The solid-state image sensor according to claim 1, wherein the first unit pixel group and the second unit pixel group are different in electrical connection relationships among the respective elements included therein.

14. The solid-state image sensor according to claim 13, wherein the first unit pixel group and the second unit pixel group are different in wiring patterns for applying a voltage to a gate of a transistor included in each of the unit pixels included in the first unit pixel group and the second unit pixel group.

15. The solid-state image sensor according to claim 1, wherein the first unit pixel group and the second unit pixel group are different in a structure of a semiconductor forming the photoelectric conversion units that the unit pixels included therein have in common.

16. The solid-state image sensor according to claim 1, wherein the first unit pixel group and the second unit pixel group are different in implantation energy of impurities into the semiconductor.

17. The solid-state image sensor according to claim 1, wherein the first unit pixel group and the second unit pixel group are different in amounts of impurities implanted into the semiconductor.

18. The solid-state image sensor according to claim 1, wherein the first unit pixel group and the second unit pixel group are different in distributions of impurities implanted into the semiconductor.

19. The solid-state image sensor according to claim 1, wherein the first unit pixel group and the second unit pixel group are different in electrical characteristics of an impurity layer that covers the photoelectric conversion units that the unit pixels have.

20. The solid-state image sensor according to claim 19, wherein the first unit pixel group and the second unit pixel group are different in concentrations of impurities contained in the impurity layer.

21. The solid-state image sensor according to claim 1, wherein
the unit pixels included in each of the first unit pixel group and the second unit pixel group have transistors in common, and
the first unit pixel group and the second unit pixel group are different in electrical characteristics of the transistors that the unit pixels have.

22. A solid-state image sensor comprising:
a plurality of unit pixels disposed in a two-dimensional array; and
a drive controller configured to control a first drive to output signals from the unit pixels included in a first unit pixel group of the plurality of unit pixels as an image signal, and a second drive to detect variations in respective signals from two or more of the unit pixels included in a second unit pixel group of the plurality of unit pixels, wherein
the first unit pixel group and the second unit pixel group have different structures from each other,
the first unit pixel group and the second unit pixel group are different in electrical characteristics of at least a part of elements among one or more elements that the unit pixels included therein have in common,
the unit pixels included in each of the first unit pixel group and the second unit pixel group have transistors in common,
the first unit pixel group and the second unit pixel group are different in electrical characteristics of the transistors that the unit pixels have, and
the first unit pixel group and the second unit pixel group are different in thicknesses of gate insulating films of the transistors that the unit pixels included therein have in common.

23. The solid-state image sensor according to claim 22, wherein
the first unit pixel group and the second unit pixel group are different in electrical characteristics of a semiconductor forming the transistors that the unit pixels included therein have in common.

24. The solid-state image sensor according to claim 22, wherein
the unit pixels included in the first unit pixel group each have:
a photoelectric conversion unit;
a capacitor that converts a charge to a voltage;
an initialization circuit that initializes a potential of the capacitor to a predetermined potential;
a transfer circuit that is interposed between the photoelectric conversion unit and the capacitor, and transfers a charge generated in the photoelectric conversion unit to the capacitor;
an amplification circuit that amplifies and reads out the potential of the capacitor; and
a selection circuit that controls transmission of the output of the amplification circuit, and the transistor constitutes either the amplification circuit or the initialization circuit.

25. A solid-state image sensor comprising:
a plurality of unit pixels disposed in a two-dimensional array; and
a drive controller configured to control a first drive to output signals from the unit pixels included in a first unit pixel group of the plurality of unit pixels as an image signal, and a second drive to detect variations in respective signals from two or more of the unit pixels included in a second unit pixel group of the plurality of unit pixels, wherein
the first unit pixel group and the second unit pixel group have different structures from each other,
the first unit pixel group and the second unit pixel group are different in electrical characteristics of at least a part of elements among one or more elements that the unit pixels included therein have in common,
the unit pixels included in each of the first unit pixel group and the second unit pixel group have transistors in common,
the first unit pixel group and the second unit pixel group are different in electrical characteristics of the transistors that the unit pixels have, and
the first unit pixel group and the second unit pixel group are different in materials forming gate insulating films of the transistors that the unit pixels included therein have in common.

26. The solid-state image sensor according to claim 25, wherein
the first unit pixel group and the second unit pixel group are different in electrical characteristics of a semiconductor forming the transistors that the unit pixels included therein have in common.

27. The solid-state image sensor according to claim 25, wherein
the unit pixels included in the first unit pixel group each have:
a photoelectric conversion unit;
a capacitor that converts a charge to a voltage;
an initialization circuit that initializes a potential of the capacitor to a predetermined potential;
a transfer circuit that is interposed between the photoelectric conversion unit and the capacitor, and transfers a charge generated in the photoelectric conversion unit to the capacitor;
an amplification circuit that amplifies and reads out the potential of the capacitor; and
a selection circuit that controls transmission of the output of the amplification circuit, and the transistor constitutes either the amplification circuit or the initialization circuit.

28. A solid-state image sensor comprising:
a plurality of unit pixels disposed in a two-dimensional array; and
a drive controller configured to control a first drive to output signals from the unit pixels included in a first unit pixel group of the plurality of unit pixels as an image signal, and a second drive to detect variations in respective signals from two or more of the unit pixels included in a second unit pixel group of the plurality of unit pixels, wherein
the first unit pixel group and the second unit pixel group have different structures from each other,
the first unit pixel group and the second unit pixel group are different in electrical characteristics of at least a part of elements among one or more elements that the unit pixels included therein have in common,
the unit pixels included in each of the first unit pixel group and the second unit pixel group have transistors in common,
the first unit pixel group and the second unit pixel group are different in electrical characteristics of the transistors that the unit pixels have, and the first unit pixel group and the second unit pixel group are different in stacked structures of gate insulating films of the transistors that the unit pixels included therein have in common.

29. The solid-state image sensor according to claim 28, wherein the first unit pixel group and the second unit pixel group are different in electrical characteristics of a semiconductor forming the transistors that the unit pixels included therein have in common.

30. The solid-state image sensor according to claim 28, wherein the unit pixels included in the first unit pixel group each have:
a photoelectric conversion unit;
a capacitor that converts a charge to a voltage;
an initialization circuit that initializes a potential of the capacitor to a predetermined potential;
a transfer circuit that is interposed between the photoelectric conversion unit and the capacitor, and transfers a charge generated in the photoelectric conversion unit to the capacitor;
an amplification circuit that amplifies and reads out the potential of the capacitor; and
a selection circuit that controls transmission of the output of the amplification circuit, and the transistor constitutes either the amplification circuit or the initialization circuit.

* * * * *